(12) United States Patent
Roh et al.

(10) Patent No.: US 12,342,651 B2
(45) Date of Patent: *Jun. 24, 2025

(54) IMAGE SENSOR INCLUDING COLOR SEPARATING LENS ARRAY AND ELECTRONIC DEVICE INCLUDING THE IMAGE SENSOR

(71) Applicant: SAMSUNG ELECTRONICS CO., LTD., Suwon-si (KR)

(72) Inventors: Sookyoung Roh, Yongin-si (KR); Seokho Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/590,654

(22) Filed: Feb. 28, 2024

(65) Prior Publication Data

US 2024/0204022 A1 Jun. 20, 2024

Related U.S. Application Data

(63) Continuation of application No. 17/078,888, filed on Oct. 23, 2020, now Pat. No. 11,948,955.

(30) Foreign Application Priority Data

Oct. 23, 2019 (KR) .................. 10-2019-0132385
Oct. 23, 2019 (KR) .................. 10-2019-0132386
(Continued)

(51) Int. Cl.
*H10F 39/00* (2025.01)
*G02B 3/00* (2006.01)

(52) U.S. Cl.
CPC ....... *H10F 39/8063* (2025.01); *G02B 3/0056* (2013.01); *H10F 39/8023* (2025.01);
(Continued)

(58) Field of Classification Search
CPC ........ H01L 27/14627; H01L 27/14605; H01L 27/14607; H01L 27/1463; H01L 27/14621;
(Continued)

(56) References Cited

U.S. PATENT DOCUMENTS 5,737,113 A 4/1998 Kuramochi et al.
6,072,620 A 6/2000 Shiono et al.
(Continued)

FOREIGN PATENT DOCUMENTS

CN 106483594 A 3/2017
CN 107180841 A 9/2017
(Continued)

OTHER PUBLICATIONS

Communication issued Apr. 30, 2024 by the Japanese Patent Office in Japanese Application No. 2020-177408.
(Continued)

*Primary Examiner* — Gevell V Selby
(74) *Attorney, Agent, or Firm* — Sughrue Mion, PLLC

(57) ABSTRACT

Provided is an image sensor including a color separating lens array. The image sensor includes a sensor substrate including a plurality of first photosensitive cells and a plurality of second photosensitive cells configured to sense light, and a color separating lens array including a plurality of first regions respectively corresponding to the plurality of first photosensitive cells and each including a first fine structure, and a plurality of second regions respectively corresponding to the plurality of second photosensitive cells and each including a second fine structure that is different from the first fine structure, wherein, among incident light incident on the color separating lens array, light of a first wavelength and light of a second wavelength are branched
(Continued)

into different directions and focused on the first photosensitive cells and the second photosensitive cells.

20 Claims, 73 Drawing Sheets

(30) Foreign Application Priority Data

| Nov. 14, 2019 | (KR) | ......................... 10-2019-0146210 |
| Nov. 14, 2019 | (KR) | ......................... 10-2019-0146233 |
| Sep. 14, 2020 | (KR) | ......................... 10-2020-0117777 |

(52) U.S. Cl.
CPC ....... H10F 39/8027 (2025.01); H10F 39/807 (2025.01); H10F 39/8053 (2025.01)

(58) Field of Classification Search
CPC ............ H01L 27/14645; G02B 3/0056; G02B 5/1876

See application file for complete search history.

(56) References Cited

U.S. PATENT DOCUMENTS

| 7,202,896 | B2 | 4/2007 | Wako et al. |
| 8,076,745 | B2 | 12/2011 | Nishiwaki |
| 8,289,422 | B2 | 10/2012 | Hiramoto et al. |
| 8,384,818 | B2 | 2/2013 | Hiramoto et al. |
| 9,520,423 | B2 | 12/2016 | Lee et al. |
| 9,673,241 | B2 | 6/2017 | Nishiwaki et al. |
| 9,766,467 | B2 | 9/2017 | Sohn |
| 9,842,876 | B2 | 12/2017 | Park et al. |
| 9,860,491 | B2 | 1/2018 | Park et al. |
| 10,136,109 | B2 | 11/2018 | Yun et al. |
| 10,170,510 | B2 | 1/2019 | Park |
| 11,330,158 | B2 | 5/2022 | Sakamoto |
| 11,641,519 | B2 | 5/2023 | Sambongi et al. |
| 11,948,955 | B2 * | 4/2024 | Roh .................. H01L 27/14605 |
| 2006/0125948 | A1 | 6/2006 | Orita et al. |
| 2006/0284052 | A1 | 12/2006 | Toshikiyo et al. |
| 2007/0152248 | A1 | 7/2007 | Choi et al. |
| 2008/0011937 | A1 | 1/2008 | Toshikiyo |
| 2009/0115011 | A1 | 5/2009 | Ushiro et al. |
| 2009/0160965 | A1 | 6/2009 | Sorek et al. |
| 2009/0250594 | A1 | 10/2009 | Tanaka et al. |
| 2010/0225791 | A1 | 9/2010 | Nakayama |
| 2011/0018042 | A1 | 1/2011 | Lee et al. |
| 2012/0206637 | A1 | 8/2012 | Hiramoto et al. |
| 2012/0212656 | A1 | 8/2012 | Hiramoto et al. |
| 2014/0284746 | A1 | 9/2014 | Suzuki et al. |
| 2015/0323800 | A1 | 11/2015 | Nam et al. |
| 2016/0006995 | A1 | 1/2016 | Yun et al. |
| 2016/0118430 | A1 | 4/2016 | Nam et al. |
| 2016/0260762 | A1 | 9/2016 | Ungnapatanin et al. |
| 2017/0034500 | A1 | 2/2017 | Arbabi et al. |
| 2017/0179178 | A1 | 6/2017 | Park |
| 2017/0261368 | A1 | 9/2017 | Nam et al. |
| 2017/0337664 | A1 | 11/2017 | Grahn et al. |
| 2018/0006071 | A1 | 1/2018 | Kato et al. |
| 2018/0164154 | A1 | 6/2018 | Roh et al. |

| 2019/0162592 | A1 | 5/2019 | Khorasaninejad et al. |
| 2019/0171026 | A1 | 6/2019 | Parsons |
| 2019/0354315 | A1 | 11/2019 | Kim |
| 2020/0021782 | A1 | 1/2020 | Sugizaki |
| 2020/0027912 | A1 | 1/2020 | Kim et al. |
| 2020/0285066 | A1 | 9/2020 | Nam et al. |
| 2021/0082988 | A1 | 3/2021 | Miyata et al. |
| 2021/0120168 | A1 | 4/2021 | Shim et al. |
| 2021/0124179 | A1 | 4/2021 | Yun et al. |
| 2021/0126030 | A1 | 4/2021 | Yun et al. |
| 2021/0126035 | A1 | 4/2021 | Roh et al. |
| 2021/0366964 | A1 | 11/2021 | Ito et al. |

FOREIGN PATENT DOCUMENTS

| CN | 112701133 | A | 4/2021 |
| EP | 2963923 | A1 | 1/2016 |
| JP | 62-123404 | A | 6/1987 |
| JP | 2007-109801 | A | 4/2007 |
| JP | 2007-184560 | A | 7/2007 |
| JP | 2009-252978 | A | 10/2009 |
| JP | 2014-86743 | A | 5/2014 |
| JP | 2015-215616 | A | 12/2015 |
| JP | 2018-11040 | A | 1/2018 |
| JP | 2019-184986 | A | 10/2019 |
| KR | 10-2012-0015257 | A | 2/2012 |
| KR | 10-2016-0004641 | A | 1/2016 |
| KR | 10-2016-0046370 | A | 4/2016 |
| KR | 10-2017-0074572 | A | 6/2017 |
| KR | 10-1772968 | B1 | 8/2017 |
| KR | 10-2018-0131175 | A | 12/2018 |
| KR | 10-2019-0131686 | A | 11/2019 |
| KR | 10-2021-0047738 | A | 4/2021 |
| KR | 10-2021-0048399 | A | 5/2021 |
| KR | 10-2021-0048400 | A | 5/2021 |
| KR | 10-2276434 | B1 | 7/2021 |
| WO | 1997/016756 | A1 | 5/1997 |
| WO | 2009/153937 | A1 | 12/2009 |
| WO | 2014/083836 | A1 | 6/2014 |
| WO | 2019/124562 | A1 | 6/2019 |

OTHER PUBLICATIONS

Communication dated Mar. 25, 2021, from the European Patent Office in European Application No. 20202814.8.
Communication dated Mar. 25, 2021, from the European Patent Office in European Application No. 20202827.0.
Communication dated Mar. 29, 2021, from the European Patent Office in European Application No. 20202807.2.
Nishiwaki, Seiji et al., "Efficient colour splitters for high-pixel-density image sensors", Nature Photonics, Mar. 2013, vol. 7, pp. 240-246, www.nature.com/naturephotonics.
Office Action dated Nov. 5, 2024, issued by Japanese Patent Office in Japanese Patent Application No. 2020-177398.
Office Action dated Jul. 30, 2024, issued by Japanese Patent Office, in Japanese Patent Application No. 2020-177408.
Office Action dated Oct. 1, 2024, issued by Japanese Patent Office, in Japanese Patent Application No. 2020-177397.
Office Action issued on Jan. 25, 2025 by the Chinese Patent Office in corresponding CN Patent Application No. 202011127956.X.
Office Action issued on Mar. 18, 2025 by the Chinese Patent Office in corresponding CN Patent Application No. 202011145510.X.

\* cited by examiner

FIG. 2B

| C | M | C | M | C | M | C | M |
|---|---|---|---|---|---|---|---|
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

FIG. 2C

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

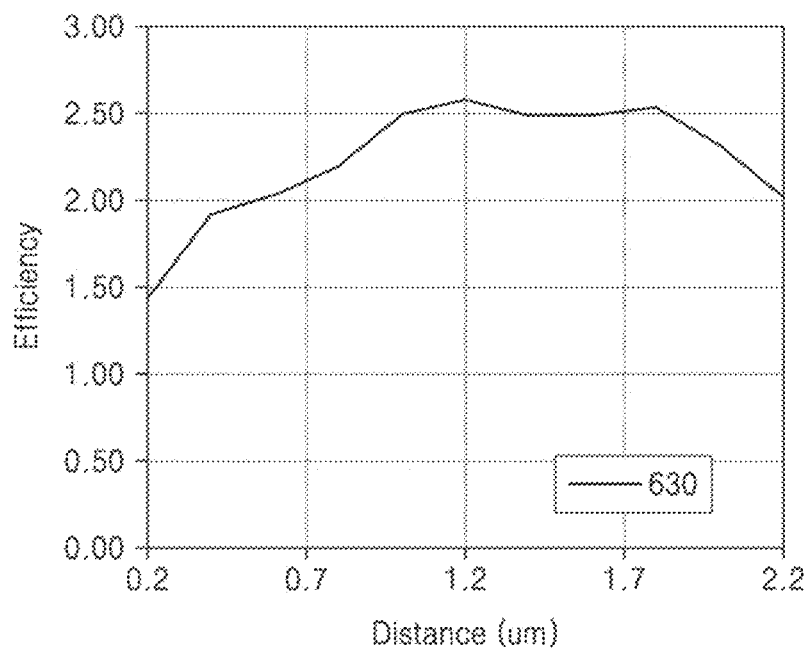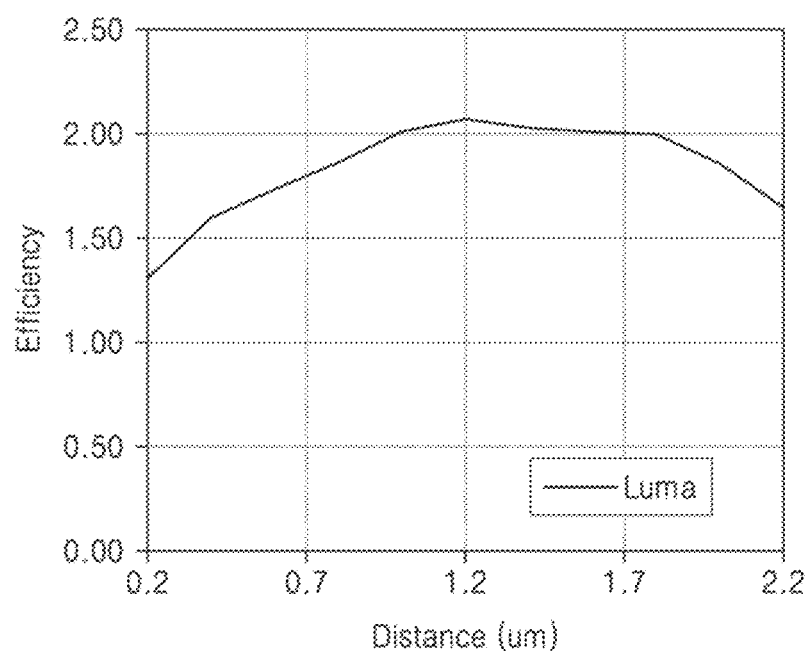

| B | G | B |
|---|---|---|
| G | R | G |
| B | G | B |

IMAGE SENSOR INCLUDING COLOR SEPARATING LENS ARRAY AND ELECTRONIC DEVICE INCLUDING THE IMAGE SENSOR

CROSS-REFERENCE TO RELATED APPLICATIONS

This application is a continuation of U.S. application Ser. No. 17/078,888, filed on Oct. 23, 2020, which claims priority to Korean Patent Application No. 10-2019-0132385, filed on Oct. 23, 2019, Korean Patent Application No. 10-2019-0132386, filed on Oct. 23, 2019, Korean Patent Application No. 10-2019-0146210, filed on Nov. 14, 2019, Korean Patent Application No. 10-2019-0146233, filed on Nov. 14, 2019, and Korean Patent Application No. 10-2020-0117777, filed on Sep. 14, 2020, in the Korean Intellectual Property Office, the disclosures of which are incorporated by reference herein in their entireties.

BACKGROUND

1. Field

Example embodiments of the present disclosure relate to image sensors including a color separating lens array and electronic devices including the image sensors, and more particularly, to an image sensor including a color separating lens array configured to focus incident light separately according to wavelengths of the incident light, and an electronic device including the image sensor.

2. Description of Related Art

Image sensors generally sense the color of incident light by using a color filter. However, a color filter may have low light utilization efficiency because the color filter absorbs light of colors other than the corresponding color of light. For example, when an RGB (red, green, and blue) color filter is used, only ⅓ of the incident light is transmitted and the other, that is, ⅔ of the incident light, is absorbed. Thus, the light utilization efficiency is only about 33%. Thus, in a color display apparatus or a color image sensor, most light loss occurs in the color filter.

SUMMARY

One or more example embodiments provide image sensors having improved light utilization efficiency by using a color separating lens array configured to focus incident light separately according to wavelengths of the incident light.

One or more example embodiments also provide electronic devices including the image sensors.

Additional aspects will be set forth in part in the description which follows and, in part, will be apparent from the description, or may be learned by practice of example embodiments of the disclosure.

According to an aspect of an example embodiment, there is provided an image sensor including a sensor substrate including a plurality of first photosensitive cells configured to sense light and a plurality of second photosensitive cells configured to sense light, and a color separating lens array including a plurality of first regions and a plurality of second regions, wherein the plurality of first regions respectively correspond to the plurality of first photosensitive cells and have a first fine structure, and the plurality of second regions respectively correspond to the plurality of second photosensitive cells and have a second fine structure that is different from the first fine structure, wherein the first fine structure and the second fine structure are configured to form a phase distribution below the plurality of first regions and the plurality of second regions, wherein light of a first wavelength and light of a second wavelength among incident light incident on the color separating lens array are branched into different directions and focused on the first photosensitive cells and the second photosensitive cells, respectively based on the phase distribution, and wherein locations of the plurality of first regions and the plurality of second regions at a center of the color separating lens array coincide with locations of the plurality of first photosensitive cells and the plurality of second photosensitive cells corresponding to the plurality of first regions and the plurality of second regions, and locations of the plurality of first regions and the plurality of second regions on a peripheral portion of the color separating lens array are shifted toward the center of the color separating lens array with respect to the plurality of first photosensitive cells and the plurality of second photosensitive cells corresponding to the plurality of first regions and the plurality of second regions.

Degrees of shifting of the plurality of first regions and the plurality of second regions with respect to the plurality of first photosensitive cells and the plurality of second photosensitive cells corresponding to the plurality of first regions and the plurality of second regions on the peripheral portion of the color separating lens array may increase with an increase in a distance from the center of the color separating lens array.

A distance s of shifting of the plurality of first regions and the plurality of second regions with respect to the plurality of first photosensitive cells and the plurality of second photosensitive cells corresponding respectively to the plurality of first regions and plurality of the second regions may satisfy $s = d \times \tan(CRA')$, where d is a shortest distance between a lower surface of the color separating lens array and an upper surface of the sensor substrate, and $CRA'$ is an incidence angle of the light incident on the sensor substrate.

The first fine structure and the second fine structure may be configured such that the light of the first wavelength at a position immediately after passing through the color separating lens array forms a phase distribution of $2N\pi$ at a position corresponding to a center of the plurality of first photosensitive cells, and forms a phase distribution of $(2N-1)\pi$ at a position corresponding to a center of the plurality of second photosensitive cells, where N is an integer greater than 0.

The first fine structure and the second fine structure may be configured such that the light of the second wavelength at a position immediately after passing through the color separating lens array forms a phase distribution of $(2M-1)\pi$ at a position corresponding to the center of the plurality of first photosensitive cells, and forms a phase distribution of $2M\pi$ at a position corresponding to the center of the plurality of second photosensitive cells, where M is an integer greater than 0.

The image sensor may further include a spacer layer provided between the sensor substrate and the color separating lens array, the spacer layer being configured to form a distance between the sensor substrate and the color separating lens array.

When a theoretical thickness of the spacer layer is $h_t$ and a pitch among the first and second photosensitive cells is p, a thickness h of the spacer layer may satisfy $h_t - p \leq h \leq h_t + p$, and wherein the theoretical thickness of the spacer layer may be a focal distance of the color separating lens array at a center wavelength of a wavelength band of the incident light to be separated by the color separating lens array.

When a refractive index of the spacer layer is n and the center wavelength of a wavelength band of the light separated by the color separating lens array is $\lambda_0$, the theoretical thickness $h_t$ of the spacer layer may satisfy $$h_t = \frac{np^2}{\lambda_0} - \frac{\lambda_0}{4n}.$$

The sensor substrate may further include a plurality of third photosensitive cells and a plurality of fourth photosensitive cells for sensing the light, wherein the color separating lens array may further include a plurality of third regions respectively corresponding to the plurality of third photosensitive cells and having a third fine structure that is different from the first fine structure and the second fine structure, and a plurality of fourth regions respectively corresponding to the plurality of fourth photosensitive cells and having a fourth fine structure that is different from the first fine structure, the second fine structure, and the third fine structure, and the plurality of first regions, the plurality of second regions, the plurality of third regions, and the plurality of fourth regions may be respectively provided along four quadrant surfaces.

At a center of the image sensor, locations of the plurality of first regions, the plurality of second regions, the plurality of third regions, and the plurality of fourth regions of the color separating lens array may coincide with locations of the plurality of first photosensitive cells, the plurality of second photosensitive cells, the plurality of third photosensitive cells, and the plurality of fourth photosensitive cells respectively corresponding to the plurality of first regions, the plurality of second regions, the plurality of third regions, and the plurality of fourth regions, and at a peripheral portion of the image sensor, the plurality of first regions, the plurality of second regions, the plurality of third regions, and the plurality of fourth regions of the color separating lens array may be shifted toward the center of the image sensor with respect to the plurality of first photosensitive cells, the plurality of second photosensitive cells, the plurality of third photosensitive cells, and the plurality of fourth photosensitive cells respectively corresponding to the plurality of first regions, the plurality of second regions, the plurality of third regions, and the plurality of fourth regions.

At the peripheral portion of the image sensor, degrees of shifting of the plurality of first regions, the plurality of second regions, the plurality of third regions, and the plurality of fourth regions of the color separating lens array toward the center of the image sensor with respect to the plurality of first photosensitive cells, the plurality of second photosensitive cells, the plurality of third photosensitive cells, and the plurality of fourth photosensitive cells respectively corresponding to the plurality of first regions, the plurality of second regions, the plurality of third regions, and the plurality of fourth regions may increase with an increase in a distance from the center of the image sensor.

The first fine structure, the second fine structure, the third fine structure, and the fourth fine structure may be configured to form a phase distribution, by which light of a first wavelength, light of a second wavelength, and light of a third wavelength among the incident light incident on the color separating lens array are branched in different directions from one another, and the light of a first wavelength may be condensed on the plurality of first photosensitive cells and the plurality of fourth photosensitive cells, the light of a second wavelength may be condensed on the plurality of second photosensitive cells, and the light of a third wavelength may be condensed on the plurality of third photosensitive cells, at a location after passing through the plurality of first regions, the plurality of second regions, the plurality of third regions, and the plurality of fourth regions.

The light of a first wavelength may be green light, the light of a second wavelength may be blue light, and the light of a third wavelength may be red light.

The first fine structure, the second fine structure, the third fine structure, and the fourth fine structure may be configured such that the light of the first wavelength at a position immediately after passing through the color separating lens array forms a phase distribution of $2N\pi$ at positions corresponding to a center of the plurality of first photosensitive cells and a center of the plurality of fourth photosensitive cells and forms a phase distribution of $(2N-1)\pi$ at positions corresponding to a center of the plurality of second photosensitive cells and a center of the plurality of third photosensitive cells, the light of the second wavelength at a position immediately after passing through the color separating lens array forms a phase distribution of $(2M-1)\pi$ at the positions corresponding to the center of the plurality of first photosensitive cells and the center of the plurality of fourth photosensitive cells, forms a phase distribution of $2M\pi$ at the position corresponding to the center of the plurality of second photosensitive cells, and forms a phase distribution that is greater than $(2M-2)\pi$ and less than $(2M-1)\pi$ at the position corresponding to the center of the plurality of third photosensitive cells, and a phase distribution such that the light of a third wavelength is $(2L-1)\pi$ on the center of the plurality of first photosensitive cells and the center of the plurality of fourth photosensitive cells, is $2L\pi$ on the center of the plurality of third photosensitive cells, and is greater than $(2L-2)\pi$ and less than $(2L-1)\pi$ on the center of the plurality of second photosensitive cells, at a location below the color separating lens array, the light of the third wavelength at a position immediately after passing through the color separating lens array forms a phase distribution of $(2L-1)\pi$ at the positions corresponding to the center of the plurality of first photosensitive cells and the center of the plurality of fourth photosensitive cells, forms a phase distribution of $2L\pi$ at the position corresponding to the center of the plurality of third photosensitive cells, and forms a phase distribution that is greater than $(2L-2)\pi$ and less than $(2L-1)\pi$ at the position corresponding to the center of the plurality of second photosensitive cells, where N, M, and L are integers greater than 0.

The first fine structure, the second fine structure, the third fine structure, and the fourth fine structure in the plurality of first regions, the plurality of second regions, the plurality of third regions, and the plurality of fourth regions may include a plurality of nanoposts, and wherein at least one from shapes, sizes, and an arrangement of the nanoposts in the plurality of first regions, the plurality of second regions, the plurality of third regions, and the plurality of fourth regions may differ from each other.

The image sensor may include a plurality of unit pixels each including a red pixel, a green pixel, and a blue pixel that are repeatedly provided, and nanoposts provided in a region corresponding to the green pixel, among the plurality of first regions, the plurality of second regions, the plurality of third regions, and the plurality of fourth regions may have different distribution rules in a first direction and in a second direction that is perpendicular to the first direction.

Nanoposts provided in a region corresponding to the blue pixel and a region corresponding to the red pixel, from among the plurality of first regions, the plurality of second regions, the plurality of third regions, and the plurality of fourth regions may have symmetrical distribution rules in the first direction and in the second direction.

Each of the plurality of nanoposts may include a first nanopost and a second nanopost that is provided on the first nanopost, a location of the second nanopost may coincide with a location of the first nanopost at a center of the image sensor, and the second nanopost may be shifted toward the center of the image sensor with respect to the first nanopost at a peripheral portion of the image sensor.

A degree of shifting of the second nanopost with respect to the first nanopost at the peripheral portion of the image sensor may increases with an increase in a distance from the center of the image sensor.

Each of the plurality of nanoposts may include a first nanopost, a second nanopost provided on the first nanopost, and a third nanopost provided on the second nanopost, wherein a location of the second nanopost and a location of the third nanopost may coincide with a location of the first nanopost at a center of the image sensor, and wherein at a peripheral portion of the image sensor, the second nanopost may be shifted toward the center of the image sensor with respect to the first nanopost and the third nanopost may be shifted toward the center of the image sensor with respect to the second nanopost.

A line width of each of the nanoposts provided in one of the plurality of first regions, the plurality of second regions, the plurality of third regions, and the plurality of fourth regions at the peripheral portion of the image sensor may be greater than a line width of a nanopost at a same location of a same region at the center of the image sensor.

When a line width of a nanopost is w on the peripheral portion of the image sensor and a line width of a nanopost is $w_0$ on the center of the image sensor, w and $w_0$ may satisfy $w \sim w_0 \cdot (1+\sin CRA/10)$, where CRA is an incidence angle of the light incident on the color separating lens array.

The line width of a nanopost at an outermost edge of the image sensor may be greater than the line width of a nanopost at the center of the image sensor by 2.5% to 6.5%.

The color separating lens array may further include a plurality of first protruding regions and a plurality of second protruding regions that protrude from edges of the sensor substrate and do not face any of the plurality of first photosensitive cells and the plurality of second photosensitive cells in the sensor substrate in a vertical direction.

A total area of the color separating lens array may be less than a total area of the sensor substrate.

The color separating lens array may further include a first color separating lens array and a second color separating lens array that is provided on the first color separating lens array, and a first fine structure and a second fine structure in a first region and a second region of the first color separating lens array may include a plurality of nanoposts, a first fine structure and a second fine structure in a first region and a second region of the second color separating lens array may include a plurality of nanoposts, and an arrangement form of the plurality of nanoposts included in the first color separating lens array may be different from an arrangement form of the plurality of nanoposts included in the second color separating lens array.

According to another aspect of an example embodiment, there is provided an image sensor including a sensor substrate including a plurality of first photosensitive cells configured to sense light and a plurality of second photosensitive cells configure to sense light, and a color separating lens array including a plurality of first regions each including a first dielectric having a first refractive index and forming a first pattern, and a second dielectric having a second refractive index that is less than the first refractive index and filling spaces of the first pattern in the first dielectric, the plurality of first regions respectively corresponding to the plurality of first photosensitive cells, and a plurality of second regions each including the first dielectric having the first refractive index and forming a second pattern that is different from the first pattern and a second dielectric having the second refractive index that is less than the first refractive index and filling spaces of the second pattern in the first dielectric, the plurality of second regions respectively corresponding to the plurality of second photosensitive cells, wherein the plurality of first regions and the plurality of second regions are configured to form a phase distribution at a location after passing through each of the first regions and each of the second regions, wherein light of a first wavelength and light of a second wavelength among incident light incident on the color separating lens array are branched into different directions and condensed on each of the first photosensitive cells and each of the second photosensitive cells, respectively, based on the phase distribution, and wherein a shape of the first pattern in the plurality of first regions and a shape of the second pattern in the plurality of second regions are gradually changed from a center of the color separating lens array toward a peripheral portion of the color separating lens array.

According to another aspect of an example embodiment, there is provided an electronic device including an imaging device configured to focus light reflected from an object to form an optical image, and an image sensor configured to convert the optical image formed by the imaging device into an electrical signal, wherein the image sensor includes a sensor substrate including a plurality of first photosensitive cells and a plurality of second photosensitive cells for sensing light, and a color separating lens array including a plurality of first regions and a plurality of second regions, wherein the plurality of first regions respectively correspond to the plurality of first photosensitive cells and have a first fine structure, and the plurality of second regions respectively correspond to the plurality of second photosensitive cells and have a second fine structure that is different from the first fine structure, wherein the first fine structure and the second fine structure are configured to form a phase distribution below the plurality of first regions and the plurality of second regions, wherein light of a first wavelength and light of a second wavelength among incident light incident on the color separating lens array are branched into different directions and condensed on each of the first photosensitive cells and each of the second photosensitive cells, respectively, based on the phase distribution, and wherein locations of the plurality of first regions and the plurality of second regions on a center of the color separating lens array coincide with locations of the plurality of first photosensitive cells and the plurality of second photosensitive cells corresponding to the plurality of first regions and the plurality of second regions, and locations of the plurality of first regions and the plurality of second regions on a peripheral portion of the color separating lens array are shifted toward the center of the color separating lens array with respect to the plurality of first photosensitive cells and the plurality of second photosensitive cells corresponding to the plurality of first regions and the plurality of second regions.

The electronic device may include a smart phone, a mobile phone, a personal digital assistant (PDA), a laptop computer, or a personal computer (PC).

According to another aspect of an example embodiment, there is provided on image sensor including a sensor substrate including a plurality of first photosensitive cells configured to sense light and a plurality of second photosensitive cells configured to sense light, and a color separating lens array including a plurality of first regions and a plurality of second regions, wherein the plurality of first regions respectively correspond to the plurality of first photosensitive cells and have a first fine structure, and the plurality of second regions respectively correspond to the plurality of second photosensitive cells and have a second fine structure that is different from the first fine structure, wherein the first fine structure and the second fine structure are configured to form a phase distribution below the plurality of first regions and the plurality of second regions, wherein light of a first wavelength and light of a second wavelength among incident light incident on the color separating lens array are branched into different directions and focused on the first photosensitive cells and the second photosensitive cells, respectively based on the phase distribution, wherein the first fine structure and the second fine structure respectively include a plurality of nanoposts, wherein each of the plurality of nanoposts includes a first nanopost and a second nanopost that is provided on the first nanopost, and wherein a location of the second nanopost coincides with a location of the first nanopost at a center of the image sensor, and the second nanopost is shifted toward the center of the image sensor with respect to the first nanopost at a peripheral portion of the image sensor.

BRIEF DESCRIPTION OF THE DRAWINGS

The above and/or other aspects, features, and advantages of example embodiments will be more apparent from the following description taken in conjunction with the accompanying drawings, in which:

FIGS. 2A, 2B, and 2C are diagrams showing examples of various pixel arrangements in a pixel array of an image sensor according to example embodiments;

FIGS. 9A, 9B, 9C, 9D, and 9E are graphs illustrating a change in efficiency of a color separating lens array according to a distance between the color separating lens array and a sensor substrate when a pitch of a photosensitive cell is 0.7 m according to an example embodiment;

DETAILED DESCRIPTION

Figure 1:
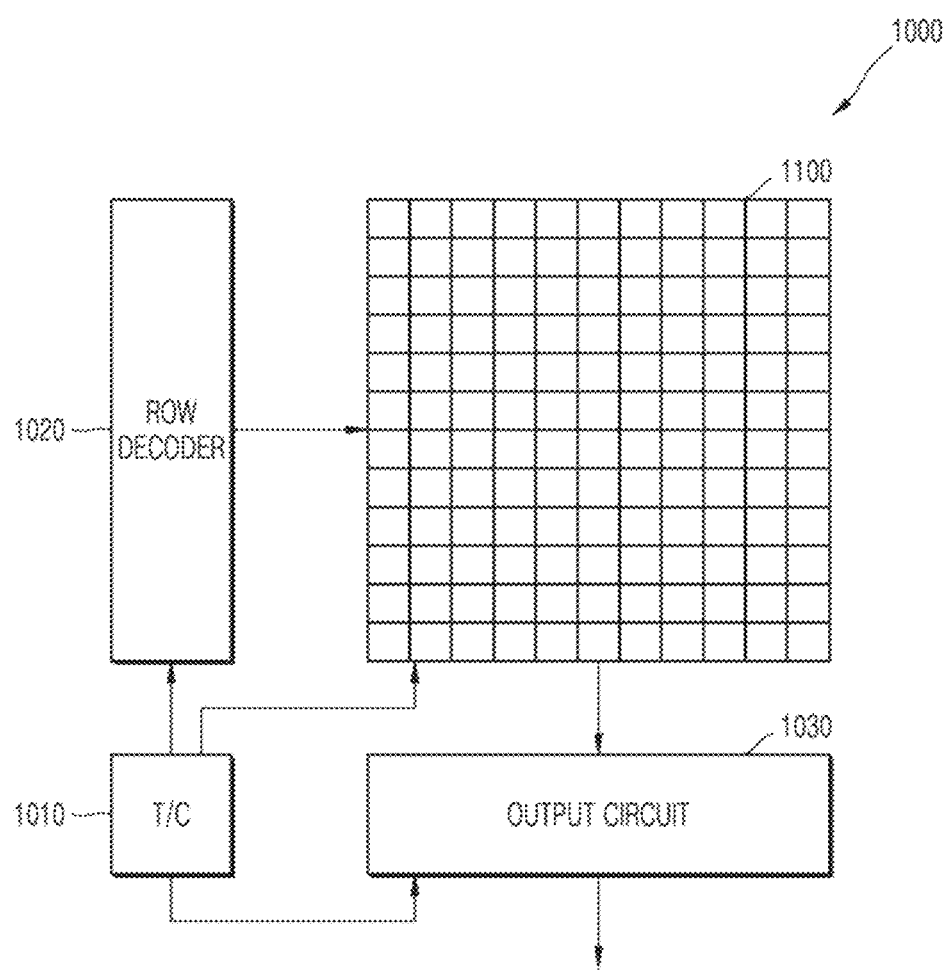
FIG. 1 is a block diagram of an image sensor according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or variations thereof.

Hereinafter, an image sensor including a color separating lens array and an electronic device including the image sensor will be described in detail with reference to accompanying drawings. The example embodiments are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing a function or operation, and may be realized by hardware, software, or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit in detail, and the scope of rights is not limited by these terms unless the context is limited by the claims.

FIG. 1 is a block diagram of an image sensor 1000 according to an example embodiment. Referring to FIG. 1, the image sensor 1000 may include a pixel array 1100, a timing controller 1010, a row decoder 1020, and an output circuit 1030. The image sensor may include a charge coupled device (CCD) image sensor or a complementary metal oxide semiconductor (CMOS) image sensor.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include the column decoder and a plurality of ADCs arranged respectively for the columns in the pixel array 1100 or one ADC arranged at an output end of the column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030.

The pixel array 1100 may include a plurality of pixels that sense light of different wavelengths. The pixels may be arranged in various ways as shown in FIGS. 2A to 2C.

Figure 2A:
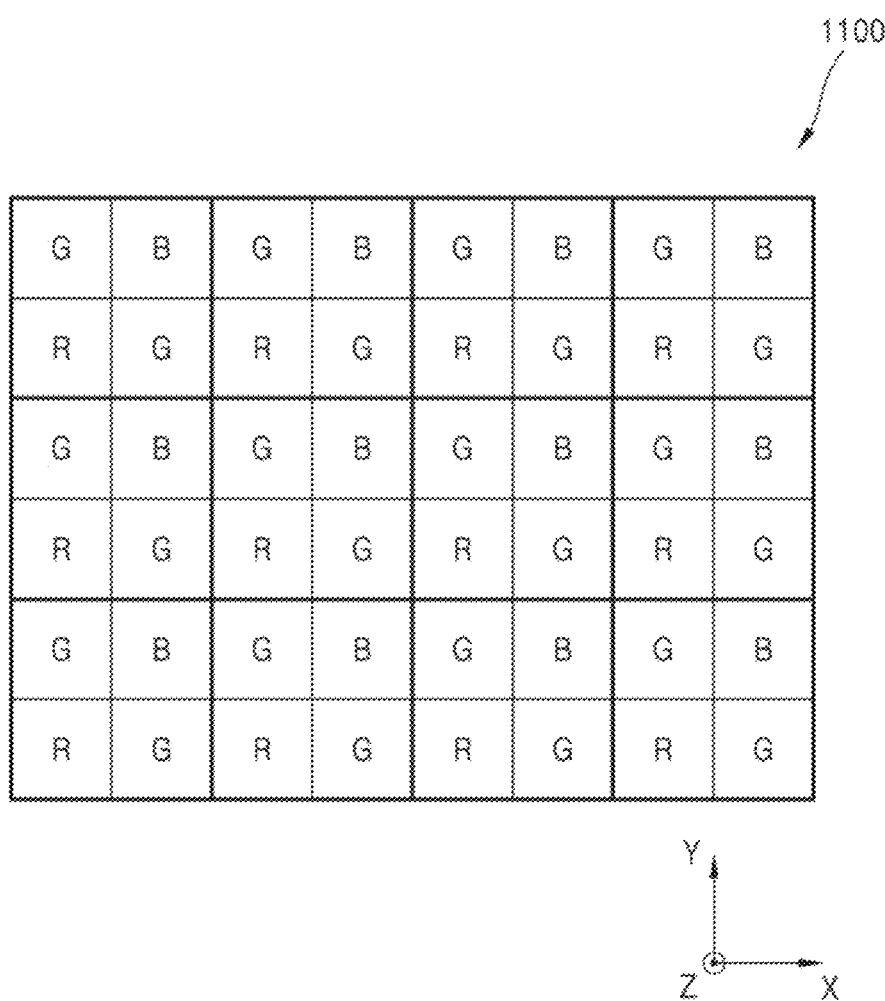

FIG. 2A shows a Bayer pattern that may be adopted in the image sensor 1000. Referring to FIG. 2A, one unit pixel includes four quadrant regions, and the first quadrant region may be the blue pixel B, the second quadrant region may be the green pixel G, the third quadrant region may be the red pixel R, and the fourth quadrant region may be the green pixel G, respectively. The unit pixels may be repeatedly and two-dimensionally arranged in a first direction (X-direction) and a second direction (Y-direction). For example, two green pixels G are arranged in one diagonal direction and one blue pixel B and one red pixel R are arranged in another diagonal direction in a unit pixel of 2×2 array. In the entire arrangement of pixels, a first row in which a plurality of green pixels G and a plurality of blue pixels B are alternately arranged in the first direction and a second row in which a plurality of red pixels R and a plurality of green pixels G are alternately arranged in the first direction are repeatedly arranged.

However, the arrangement of the pixel array 1100 is not limited to the Bayer pattern, but the pixels may be arranged in various types other than the Bayer pattern. For example, referring to FIG. 2B, a CYGM arrangement, in which a magenta pixel M, a cyan pixel C, a yellow pixel Y, and a green pixel G configure one unit pixel, may be used. Also, referring to FIG. 2C, an RGBW arrangement, in which a green pixel G, a red pixel R, a blue pixel, and a white pixel W configure one unit pixel, may be used. The unit pixel may have 3×2 array. In addition to the above examples, the pixels in the pixel array 1100 may be arranged in various ways according to color characteristics of the image sensor 1000. Hereinafter, it will be described that the pixel array 1100 in the image sensor 1000 has the Bayer pattern, but principles of the example embodiments described later will be also applied to other pixel arrangements than the Bayer pattern.

Figure 3:
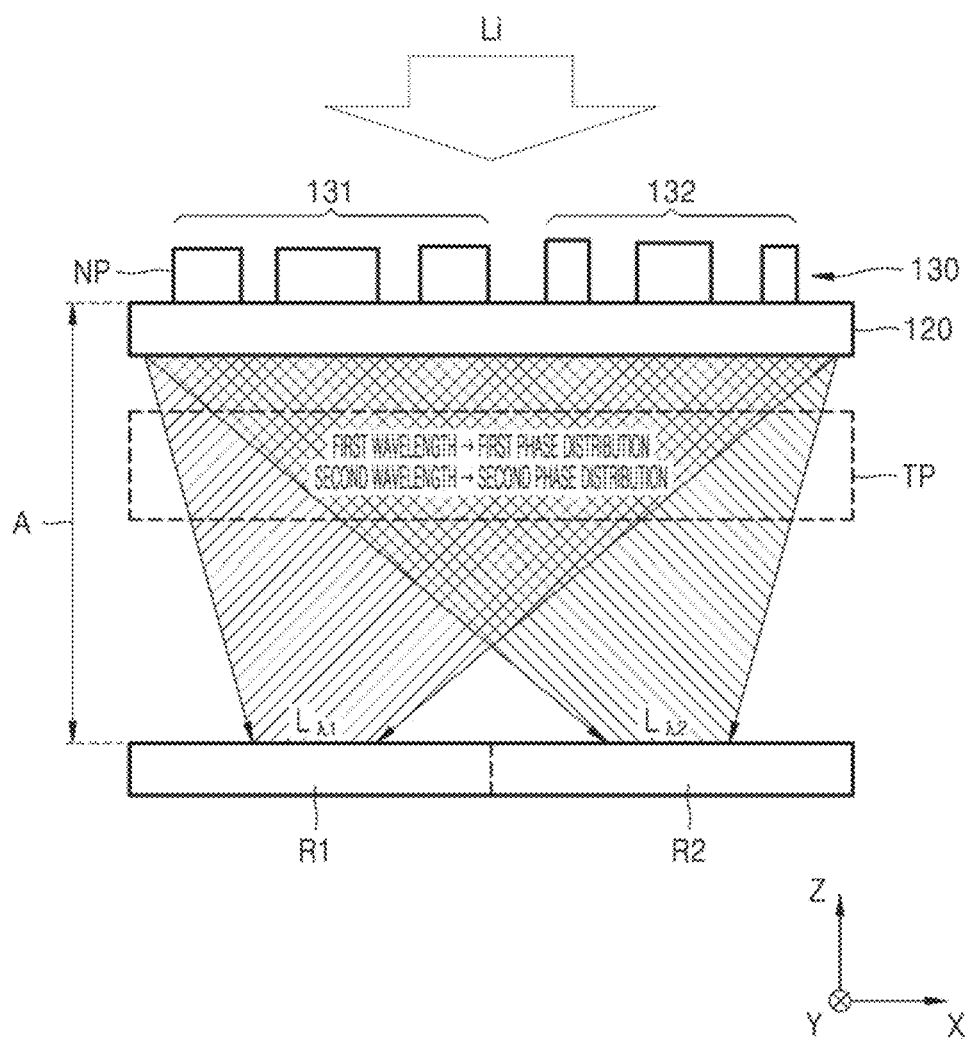
FIG. 3 is a conceptual diagram showing a structure and operations of a color separating lens array according to an example embodiment.

According to an example embodiment, the pixel array 1100 of the image sensor 1000 may include a color separating lens array that is configured to focus light of a color corresponding to each pixel onto the each pixel. FIG. 3 is a conceptual diagram showing a structure and operations of a color separating lens array 130 according to an example embodiment. Referring to FIG. 3, the color separating lens array 130 includes nanoposts NP arranged on a plane according to a predetermined rule. The color separating lens array 130 may be provided on a spacer layer 120.

Here, the rule may be applied to parameters, such as the shape of the nanoposts NP, sizes (width and height), a distance between the nanoposts NP, and the arrangement form of the nanoposts NP. These parameters may be determined according to a target phase distribution TP to be implemented on incident light Li by the color separating lens array 130. The target phase distribution TP may be determined in consideration of the first target region R1 and the second target region R2 in which the wavelength of the incident light Li is separated and light is to be condensed. The target phase distribution TP is indicated between the color separating lens array 130 and the target regions R1 and R2 for convenience of illustration. The actual target phase distribution TP may be a phase distribution at a location immediately after the incident light Li passes through the color separating lens array 130, e.g., on a lower surface of the color separating lens array 130 or an upper surface of the spacer layer 120.

The color separating lens array 130 may include a first region 131 and a second region 132 respectively having a first fine structure and a second fine structure that are different from each other. For example, each of the first region 131 and the second region 132 may include one or a plurality of nanoposts NP. Each of the first region 131 and the second region 132 may face the first target region R1 and the second target region R2 and may be in one-to-one correspondence. Three nanoposts NP may be arranged in each of the first region 131 and the second region 132. However, embodiments are not limited thereto. Also, the nanoposts NP may be entirely located in one of the first region 131 and the second region 132. However, embodiments are not limited thereto, and some of the nanoposts NP may be arranged on a boundary between the first region 131 and the second region 132.

The nanoposts NP of the color separating lens array 130 may form a phase distribution in which light of different wavelengths included in the incident light Li are branched in different directions and condensed. For example, shapes, sizes, arrangement, etc. of the nanoposts NP distributed in the first region 131 and the second region 132 may be determined such that the target phase distribution TP, in which light ($L_{\lambda 1}$) of a first wavelength has a first phase distribution and light ($L_{\lambda 2}$) of a second wavelength has a second phase distribution, where the light LU, and the light $L_2$ are included in the incident light Li. The light $L_{\lambda 1}$ having the first wavelength and the light $L_{\lambda 2}$ having the second wavelength may be condensed in each of the first and second target regions R1 and R2 at a predetermined separation distance A from an array of the nanoposts NP according to the target phase distribution TP.

A rule in which the nanoposts NP are arranged in the first region 131, and a rule in which the nanoposts NP are arranged in the second region 132 may be different from each other. For example, at least one of the shape, size, and arrangement of the nanoposts NP included in the first region 131 may be different from the shape, size, and arrangement of the nanoposts NP included in the second region 132.

The nanoposts NP may have sub-wavelength dimensions that are less than the wavelength band to be branched. The nanoposts NP may have a shape dimension less than a shorter wavelength among the first wavelength and the second wavelength, and when the incident light Li is a visible light, the nanoposts NP may have a dimension less than 400 nm, 300 nm, or 200 nm.

The nanoposts NP may include a material having a higher refractive index than that of a peripheral material. For example, the nanoposts NP may include c-Si, p-Si, a-Si and III-V compound semiconductor (gallium phosphide (GaP), gallium nitride (GaN), gallium arsenide (GaAs) etc.), silicon carbide (SiC), titanium oxide ($TiO_2$), silicon nitride (SiN), and/or a combination thereof. The nanoposts NP having a difference in a refractive index from the refractive index of the peripheral material may change a phase of light that passes therethrough. This is caused by a phase delay that is caused by the sub-wavelength dimensions, and a delayed degree of the phase may be determined by detailed shape dimensions, arrangement types, etc. of the nanoposts NP. The peripheral material may have a dielectric material having a lower refractive index than that of the nanoposts NP, for example, $SiO_2$ or air.

The first wavelength λ1 and the second wavelength λ2 may be in a wavelength band of visible rays. However, embodiments are not limited thereto, and a variety of wavelength bands may be implemented according to the rule of the nanoposts NP. FIG. 3 shows two wavelengths are branched and condensed. However, embodiments are not limited thereto, and the incident light may be branched into three directions or more according to wavelengths and condensed.

Hereinafter, an example in which the color separating lens array 130 described above is applied to the pixel array 1100 of the image sensor 1000.

Figure 4A:
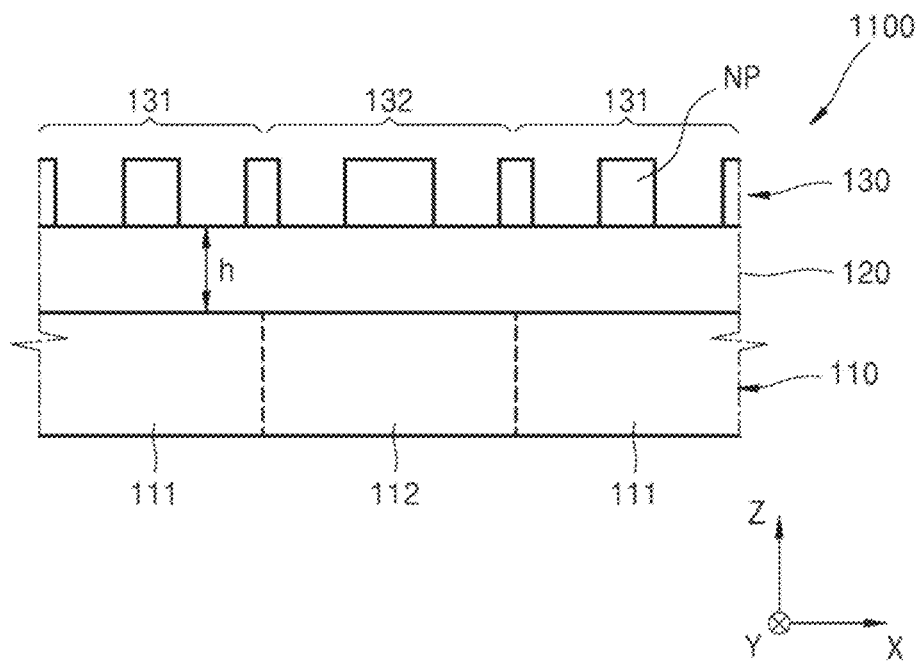
FIGS. 4A and 4B are cross-sectional views of a pixel array in an image sensor according to an example embodiment.
Figure 4B:
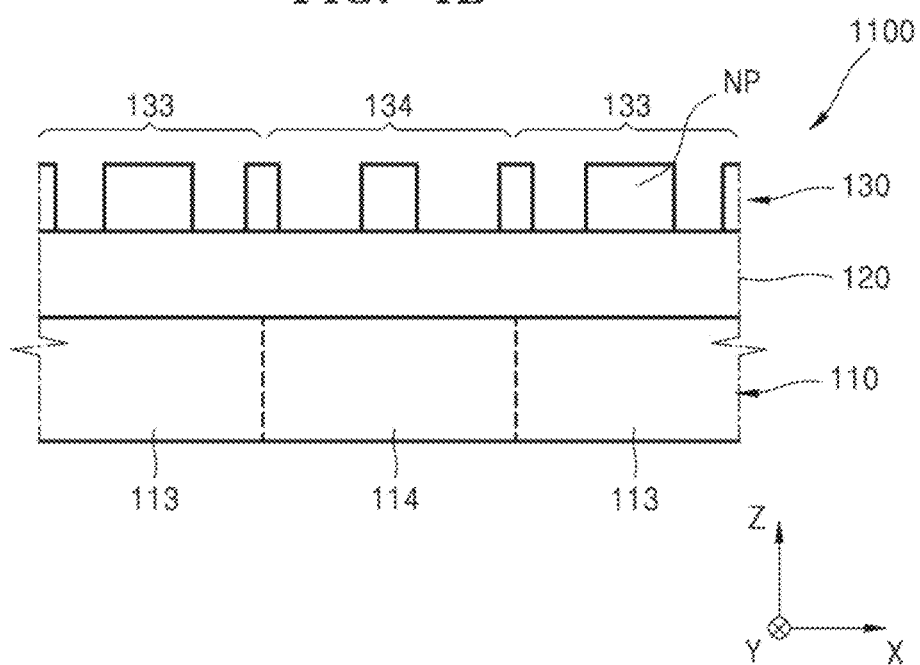
Figure 5A:
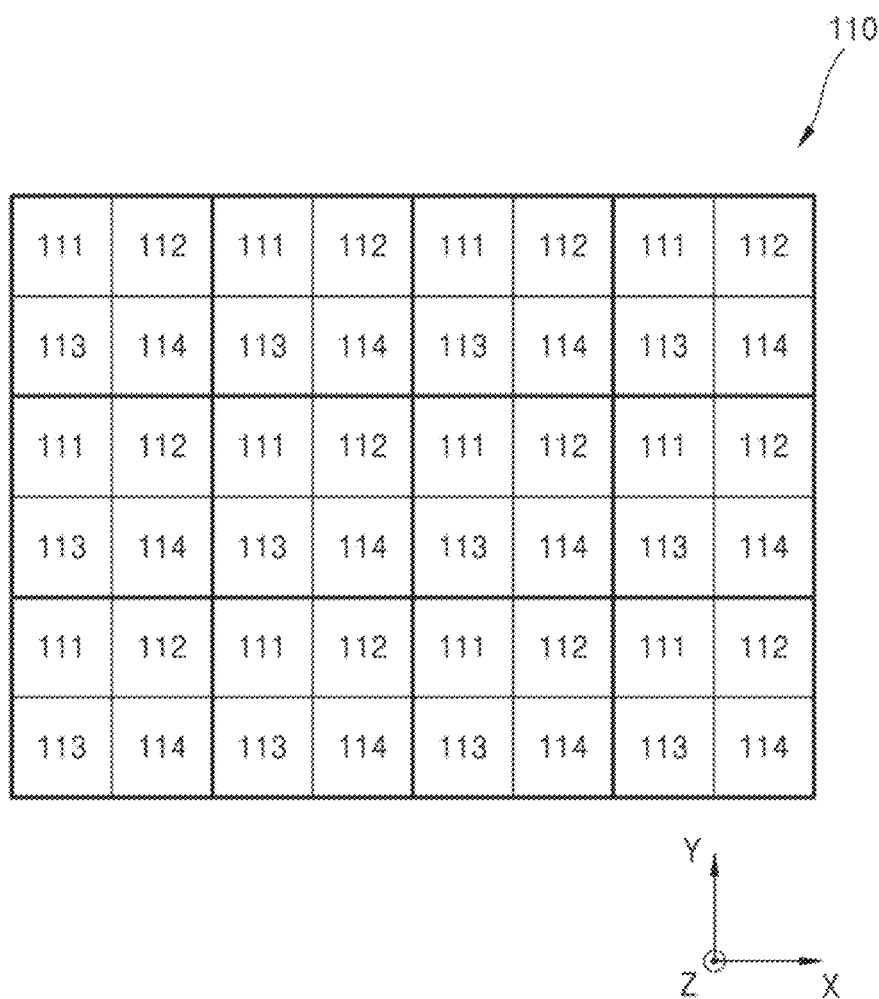
FIG. 5A is a plan view showing an arrangement of photosensitive cells in a pixel array of an image sensor according to an example embodiment.
Figure 5B:
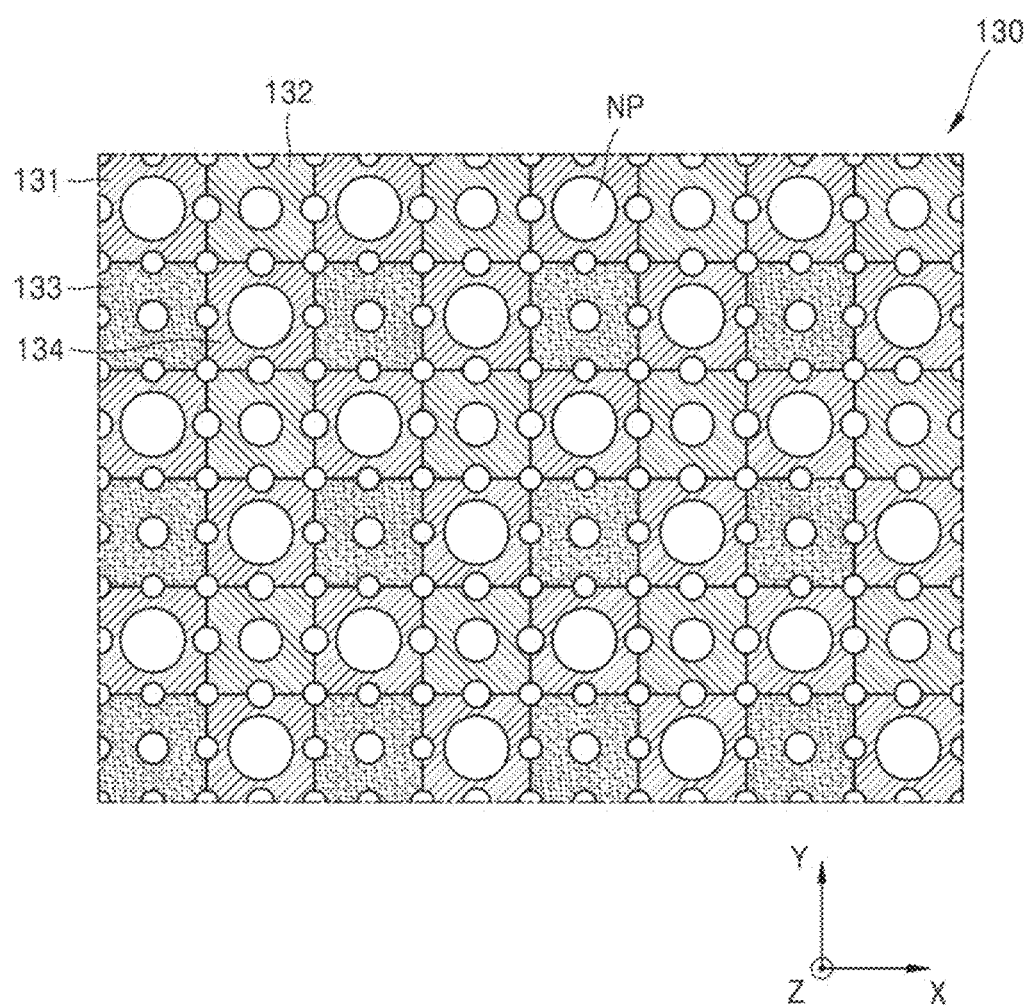
FIG. 5B is a plan view showing an example of an arrangement of nanoposts in a plurality of regions of a color separating lens array, in the pixel array of the image sensor according to an example embodiment.

FIGS. 4A and 4B are cross-sectional views of the pixel array 1100 according to the example embodiment. FIG. 5A is a plan view showing arrangement of photosensitive cells in the pixel array 1100, and FIG. 5B is a plan view showing an example of arranging the nanoposts in the color separating lens array according to an example embodiment.

Referring to FIGS. 4A and 4B, the pixel array 1100 includes a sensor substrate 110 including a plurality of photosensitive cells 111, 112, 113, and 114 configured to sense light, the spacer layer 120 that is transparent and provided on an upper surface of the sensor substrate 110, and the color separating lens array 130 provided on an upper surface of the spacer layer 120 above the sensor substrate.

The sensor substrate 110 may include a first photosensitive cell 111, a second photosensitive cell 112, a third photosensitive cell 113, and a fourth photosensitive cell 114 that convert light into electrical signals. As shown in FIG. 4A, the first photosensitive cell 111 and the second photosensitive cell 112 may be alternately arranged in the first direction (X-direction), and in a cross-section in which y-direction location is different from FIG. 4A, the third photosensitive cell 113 and the fourth photosensitive cell 114 may be alternately arranged, as shown in FIG. 4B. This region division is configured to sense incident light by pixel unit. For example, the first photosensitive cell 111 and the fourth photosensitive cell 114 may sense light having the first wavelength that corresponds to a first pixel, and the second photosensitive cell 112 may sense light having the second wavelength that corresponds to a second pixel, and the third photosensitive cell 113 may sense light having the third wavelength that corresponds to a third pixel. Hereinafter, light having the first wavelength, light having the second wavelength, and light having the third wavelength will be respectively illustrated as green light, blue light, and red light, and the first pixel, the second pixel, and the third pixel will be respectively described as the green pixel G, the blue pixel B, and the red pixel R as an example. A separator for separating cells may be further formed between the photosensitive cells.

The spacer layer 120 maintain a gap between the sensor substrate 110 and the color separating lens array 130 to be constant while supporting the color separating lens array 130, and may have a transparent material with respect to the visible ray. For example, the spacer layer 120 may include a dielectric material having a lower refractive index than a refractive index of the nanoposts NP in the color separating lens array 130 and low absorbent ratio in the visible ray band, e.g., $SiO_2$, siloxane-based spin on glass (SOG), etc.

The color separating lens array 130 include the nanoposts NP arranged according to a predetermined rule. The color separating lens array 130 may further include a protective layer for protecting the nanoposts NP. The protective layer may include a dielectric material having a lower refractive index than a refractive index of a material for forming the nanoposts NP.

The color separating lens array 130 is partitioned as a plurality of regions including a first region 131, a second region 132, a third region 133, and a fourth region 134 facing the plurality of photosensitive cells 111, 112, 113, and 114 in one-to-one correspondence. One or more nanoposts NP may be arranged in each of the plurality of regions 131, 132, 133, and 134, and at least one of the shape, size and arrangement of the nanoposts NP may be different from each other according to regions.

The color separating lens array 130 is partitioned such that the light of the first wavelength is branched into and focused on the first and fourth photosensitive cells 111 and 114 and condensed, the light of the second wavelength is branched and focused on the second photosensitive cell 112 and condensed, and the light of the third wavelength is branched and focused on the third photosensitive cell 113 and condensed. In addition, for each region, a size, a shape, and arrangement of the nanoposts NP are determined.

When the pixel array 1100 has the arrangement of Bayer pattern as shown in FIG. 2A, the first and fourth photosensitive cells 111 and 114 of FIG. 5A correspond to the green pixel G, the second photosensitive cell 112 corresponds to the blue pixel B, and the third photosensitive cell 113 corresponds to the red pixel R.

Referring to FIG. 5B, the first and fourth regions 131 and 134 of the color separating lens array 130 correspond to the green pixel G, the second photosensitive cell 112 and the second region 132 correspond to the blue pixel B, and the third photosensitive cell 113 and the third region 133 correspond to the red pixel R. Therefore, the color separating lens array 130 includes a plurality of unit pattern arrays arranged two-dimensionally, and each of the unit pattern arrays includes the first region 131, the second region 132, the third region 133, and the fourth region 134 that are arranged in 2×2.

As shown in FIG. 5B, the first and fourth regions 131 and 134 corresponding to the green pixel G, the second region 132 corresponding to the blue pixel B, and the third region 133 corresponding to the red pixel R may include nanoposts NP, each of which has a cylindrical shape of a circular cross-section. The nanoposts NP having different cross-sectional areas from one another are arranged on the centers of the first, second, third, and fourth regions 131, 132, 133, and 134 to branch incident light based on different wavelengths of light, and the nanoposts NP may be also arranged on the center of a boundary between pixels and a crossing point of the pixel boundaries. The cross-sectional area of the nanoposts NP arranged at the boundary between pixels may be less than those of the nanoposts NP arranged at the center of the pixel.

Figure 5C:
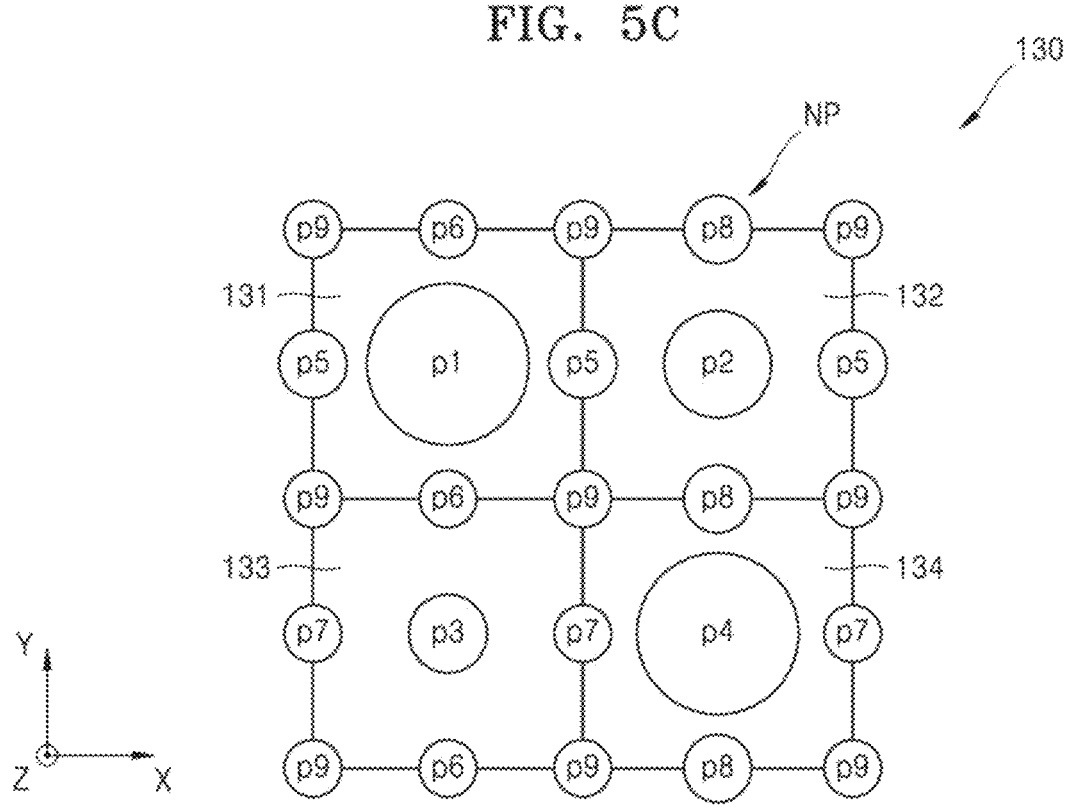
FIG. 5C is an enlarged plan view of a portion of FIG. 5B.

FIG. 5C shows the arrangement of the nanoposts NP in some regions of FIG. 5B, that is, the first to fourth regions 131, 132, 133, and 134 constituting the unit pattern array. In FIG. 5C, the nanoposts NP are indicated as p1 to p9 according to detailed locations thereof in the unit pattern array. Referring to FIG. 5C, from among the nanoposts NP, a nanopost p1 on the center of the first region 131 and a nanopost p4 on the center of the fourth region 134 have greater cross-sectional areas than those of a nanopost p2 on the center of the second region 132 or a nanopost p3 on the center of the third region 133, and the nanopost p2 on the center of the second region 132 has a greater cross-sectional area than that of the nanopost p3 on the center of the third region 133. However, embodiments are not limited to the above example, and if necessary, the nanoposts NP having various shapes, sizes, and arrangement may be applied.

The nanoposts NP included in the first and fourth regions 131 and 134 corresponding to the green pixel G may have different distribution rules in the first direction (X-direction) and the second direction (Y-direction). For example, the nanoposts NP arranged in the first and fourth regions 131 and 134 may have different size arrangement in the first direction (X-direction) and the second direction (Y-direction). As shown in FIG. 5C, from among the nanoposts NP, a cross-sectional area of a nanopost p5 located at a boundary between the first region 131 and the second region 132 that is adjacent to the first region 131 in the first direction (X-direction) is different from that of a nanopost p6 located at a boundary between the first region 131 and the third region 133 that is adjacent to the first region 131 in the second direction (Y-direction). Likewise, a cross-sectional area of a nanopost p7 at the boundary between the fourth region 134 and the third region 133 that is adjacent to the fourth region 134 in the first direction (X-direction) is different from that of a nanopost p8 located at the boundary between the fourth region 134 and the second region 132 that is adjacent to the fourth region 134 in the second direction (Y-direction).

Meanwhile, the nanoposts NP arranged in the second region 132 corresponding to the blue pixel B and the third region 133 corresponding to the red pixel R may have symmetrical distribution rules in the first and second directions (X-direction and Y-direction). As shown in FIG. 5C, from among the nanoposts NP, the cross-sectional area of the nanoposts p5 at a boundary between adjacent pixels that are adjacent to the second region 132 in the first direction (X-direction) and the cross-sectional areas of the nanoposts p8 at a boundary between pixels adjacent to the second region 132 in the second direction (Y-direction) are the same as each other, and in the third region 133, the cross-sectional areas of the nanoposts p7 at a boundary between adjacent pixels in the first direction (X-direction) and the cross-sectional areas of the nanoposts p6 at a boundary between the adjacent pixels in the second direction (Y-direction) are the same as each other.

In addition, the nanoposts p9 at four corners in each of the first to fourth regions 131, 132, 133, and 134, that is, points where the four regions cross one another, have the same cross-sectional areas from one another. The above distribution is caused by the pixel arrangement in the Bayer pattern. Adjacent pixels to the blue pixel B and the red pixel R in the first direction (X-direction) and the second direction (Y-direction) are the green pixels G, whereas the adjacent pixel to the green pixel G corresponding to the first region 131 in the first direction (X-direction) is the blue pixel B and adjacent pixel to the green pixel G in the second direction (Y-direction) is the red pixel R. In addition, the adjacent pixel to the green pixel G corresponding to the fourth region 134 in the first direction (X-direction) is the red pixel R and adjacent pixel to the green pixel G in the second direction (Y-direction) is the blue pixel B. In addition, the green pixels G corresponding to the first and fourth regions 131 and 134 are adjacent to the same pixels, e.g., the green pixels G in four diagonal directions, the blue pixel B corresponding to the second region 132 is adjacent to the same pixels, e.g., the red pixels R in four diagonal directions, and the red pixel R corresponding to the third region 133 is adjacent to the same pixels, e.g., the blue pixels B in four diagonal directions. Therefore, in the second and third regions 132 and 133 respectively corresponding to the blue pixel B and the red pixel R, the nanoposts NP may be arranged in the form of 4-fold symmetry, and in the first and fourth regions 131 and 134 corresponding to the green pixels G, the nanoposts NP may be arranged in the form of 2-fold symmetry. In particular, the first region 131 and the fourth region 134 are rotated by 90° angle with respect to each other.

It is illustrated that the plurality of nanoposts NP have symmetrical circular cross-sectional shapes. However, embodiments are not limited thereto, and some nanoposts having asymmetrical cross-sectional shapes may be included. For example, the first and fourth regions 131 and 134 corresponding to the green pixel G employ the nanoposts having an asymmetrical cross-sectional shape that has different widths in the first direction (X-direction) and the second direction (Y-direction), and the second and third regions 132 and 133 corresponding to the blue pixel B and the red pixel R may employ the nanoposts having a symmetrical cross-sectional shape having the identical widths in the first direction (X-direction) and the second direction (Y-direction).

The arrangement rule of the color separating lens array 130 is an example for implementing the target phase distribution in which a light having a first wavelength is branched and focused onto the first and fourth photosensitive cells 111 and 114, a light having a second wavelength is branched and focused onto the second photosensitive cell 112, and a light having a third wavelength is branched and focused onto the third photosensitive cell 113, and this arrangement rule is not limited to the illustrated patterns.

The shape, size and arrangement of the nanoposts NP in each region of the color separating lens array 130 may be determined such that a phase making the light of the first wavelength, that is condensed into the first and fourth photosensitive cells 111 and 113 and does not proceed to the second and third photosensitive cells 112 and 113, may be formed at a location below the color separating lens array 130 after light of the first wavelength passes through the color separating lens array 130.

Likewise, the shape, size and arrangement of the nanoposts NP in each region of the color separating lens array 130 may be determined such that a phase making the light of the second wavelength, that is condensed into the second photosensitive cell 112 and does not proceed to the first, third, and fourth photosensitive cells 111, 113, and 114, may be formed at a location below the color separating lens array 130 after light of the second wavelength passes through the color separating lens array 130.

Likewise, the shape, size and arrangement of the nanoposts NP in each region of the color separating lens array 130 may be determined such that a phase making the light of the third wavelength, that is condensed into the third photosensitive cell 113 and does not proceed to the first, second, and fourth photosensitive cells 111, 112, and 114, may be formed at a location below the color separating lens array 130 after light of the third wavelength passes through the color separating lens array 130.

The shape, size, and/or arrangement of the nanoposts NP satisfying the above conditions may be determined, and the color separating lens array 130 may allow the light that has passed through the color separating lens array 130 to have following target phase distribution. At a location right after passing through the color separating lens array 130, that is, on a lower surface of the color separating lens array 130 or an upper surface of the spacer layer 120, a phase of the light having the first wavelength may be $2n\pi$ in the center of the first region 131 corresponding to the first photosensitive cell 111 and the center of the fourth region 134 corresponding to the fourth photosensitive cell 114, and $(2n+1)\pi$ in the center of the second region 132 corresponding to the second photosensitive cell 112 and the center of the third region 132 corresponding to the third photosensitive cell 113. Here, N is an integer greater than 0. For example, at a location right after passing through the color separating lens array 130, the phase of the light of first wavelength is the largest at the center of the first region 131 and the center of the fourth region 134, and is reduced gradually as a concentric circle away from the center of the first region 131 and the center of the fourth region 134 to be the smallest at the center of the second region 132 and the center of the third region 133. For example, when N is 1, the phase of green light may be $2\pi$ at the center of the first region 131 and the center of the fourth region 134 and may be $\pi$ at the center of the second region 132 and the center of the third region 133 on the location right after passing through the color separating lens array 130. Here, the phase may denote a relative phase value with respect to a phase right before the light passes through the nanoposts NP.

Also, at a location right after passing through the color separating lens array 130, a phase of the light of second wavelength may have a distribution, in which the phase is $2M\pi$ at the center of the second region 132 corresponding to the second photosensitive cell 112, $(2M-1)\pi$ at the center of the first region 131 corresponding to the first photosensitive cell 111 and the center of the fourth region 134 corresponding to the fourth photosensitive cell 114, and may be greater than $(2M-2)\pi$ and less than $(2M-1)\pi$ at the center of the third region 133 corresponding to the third photosensitive cell 113. Here, M is an integer greater than 0. For example, at the location right after passing through the color separating lens array 130, the phase of the light of second wavelength is the largest on the center of the second region 132, and then, may be gradually reduced as a concentric circle away from the center of the second region 132 to be the smallest locally on the center of the third region 133. For example, when M is 1, the phase of the light of second wavelength may be $2\pi$ at the center of the second region 132, $\pi$ at the center of the first region 131 and the center of the fourth region 134, and about $0.2\pi$ to about $0.7\pi$ at the center of the third region 133, at the location after passing through the color separating lens array 130.

Likewise, at a location right after passing through the color separating lens array 130, a phase of the light of third wavelength may be $2L\pi$ at the center of the third region 133 corresponding to the third photosensitive cell 113, $(2L-1)\pi$ on the center of the first region 131 corresponding to the first photosensitive cell 111 and the center of the fourth region 134 corresponding to the fourth photosensitive cell 114, and may be greater than $(2L-2)\pi$ and less than $(2L-1)\pi$ on the center of the second region 132 corresponding to the second photosensitive cell 112. Here, L is an integer greater than 0. For example, at the location right after passing through the color separating lens array 130, the phase of the light of third wavelength is the largest on the center of the third region 133, and then, may be gradually reduced as a concentric circle away from the center of the third region 133 to be the smallest locally on the center of the second region 132. For example, when L is 1, the phase of the light of third wavelength may be $2\pi$ on the center of the third region 133, $\pi$ on the center of the first region 131 and the center of the fourth region 134, and about $0.2\pi$ to about $0.7\pi$ at the center of the second region 132, at the location after passing through the color separating lens array 130.

As described above, the target phase distribution denotes the distribution of phase of light at the location right after passing through the color separating lens array 130. When the light after passing through the color separating lens array 130 has the above phase distribution, the light of first to third wavelengths is respectively condensed into the corresponding first to fourth photosensitive cells 111 to 114. For example, an effect that the light that has passed through the color separating lens array 130 branches according to the wavelengths and then proceeds to different directions to be focused may be obtained.

Predetermined propagation distance requirements may be determined in order for the light of corresponding wavelength to be focused on the corresponding photosensitive cell, and accordingly, a thickness h of the spacer layer 120 may be determined. The thickness h of the spacer layer 120 may vary depending on a wavelength λ of light to be branched, a pixel size, and an arrangement pitch p of the photosensitive cells. The thickness h of the spacer layer 120 may be greater than the center wavelength λ of the visible ray wavelength band that is to be branched, and as compared with the arrangement pitch p of the center wavelengths which is a distance between centers of adjacent photosensitive cells, may range from about 1p to about 3p. Specifically, the thickness h of the spacer layer 120 may be about 500 nm to about 5 μm. A more detailed description of setting the thickness h of the spacer layer 120 will be provided below with reference to FIGS. 9A through 9E, FIGS. 10A through 10E, and FIGS. 11A through 11E.

Figure 6A:
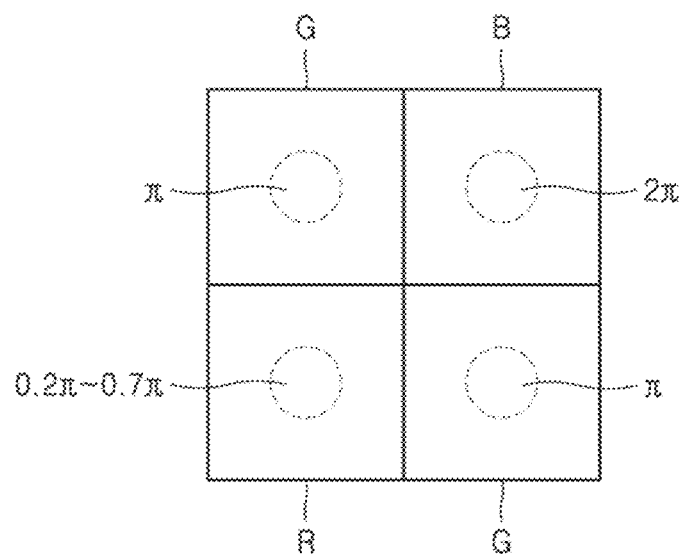
FIGS. 6A and 6B are views illustrating a phase distribution of blue light that has passed through a color separating lens array and a computer simulation of a focusing distribution of the blue light in a facing photosensitive cell according to an example embodiment.
Figure 6B:
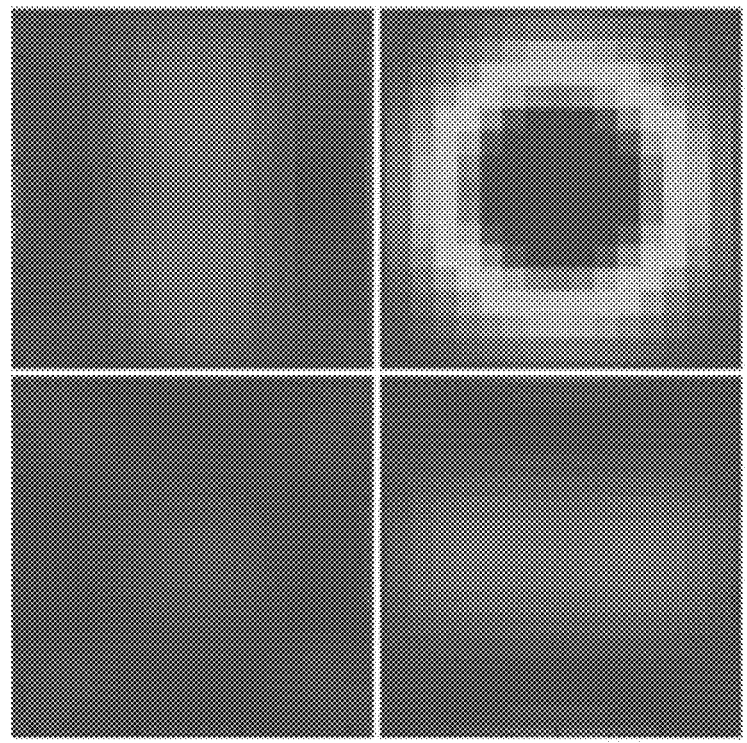
Figures 6C, 6D:
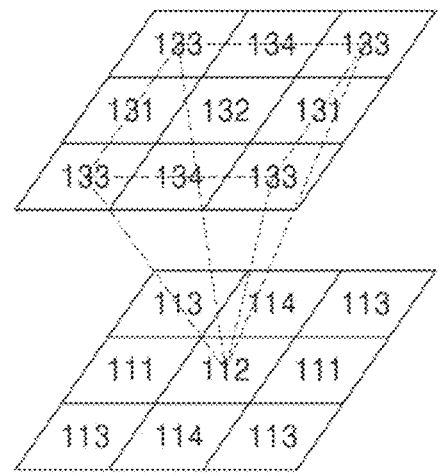
FIG. 6C illustrates a proceeding direction of blue light incident on a second region of the color separating lens array corresponding to a blue pixel and the periphery of the second region according to an example embodiment.
FIG. 6D illustrates an example of a micro-lens array that functions equivalently to the color separating lens array with respect to blue light according to an example embodiment.

FIGS. 6A and 6B are views illustrating a phase distribution of blue light that has passed through the color separating lens array 130 and a computer simulation of a focusing distribution of the blue light in a facing photosensitive cell, FIG. 6C illustrates a proceeding direction of light incident on the second region of the color separating lens array corresponding to the blue pixel B and a periphery of the second region, and FIG. 6D illustrates an example of a micro-lens array that equivalently functions as the color separating lens array 130 with respect to the blue light.

Referring to the phase distribution shown in FIG. 6A, the phase in the center of a region corresponding to the blue pixel B may be approximately 2π, and the phase in the center of a region corresponding to the adjacent green pixel G may be about π, and the phase in the center of a region corresponding to the red pixel R in a diagonal direction may be approximately a value less than π (e.g., about 0.2π to about 0.7π).

This phase distribution may represent a focusing distribution of the blue light as shown in FIG. 6B. The blue light is mostly focused on the region corresponding to the blue pixel B, and rarely reaches the regions corresponding to the other pixels.

Consequently, the blue light incident on the second region 132 corresponding to the blue pixel B and a periphery proceeds as shown in FIG. 6C after passing through the color separating lens array 130. For example, among incident light incident on the second region 132 of the color separating lens array 130 and some parts in other regions surrounding the second region 132, the blue light is focused on the second photosensitive cell 112 facing the second region 132. For example, the blue light coming from the second region 132 corresponding to that blue pixel B, blue light coming from two first regions 131 that are adjacent to the second region 132 in the transverse direction, the blue light coming from two fourth regions 134 adjacent to the second region 132 in the longitudinal direction, and the blue light coming from four third regions 113 adjacent to the second region 132 in the diagonal directions are incident on the blue pixel B.

Therefore, as shown in FIG. 6D, the color separating lens array 130 may perform an equivalent operation to an array of a plurality of micro-lenses ML1 arranged around the second photosensitive cell 112, with respect to the blue light. Each equivalent micro-lens ML1 may be larger than the second photosensitive cell 112 corresponding thereto, and thus, the blue light incident on other regions surrounding the second photosensitive cell 112, as well as the blue light incident on the region of the second photosensitive cell 112, may be focused on the second photosensitive cell 112. For example, each micro-lens ML1 may be about four times greater than the second photosensitive cell 112 corresponding to each micro-lens ML1, and four sides of each micro-lens ML1 may be in parallel with four sides of the second photosensitive cell 112.

Figure 7A:
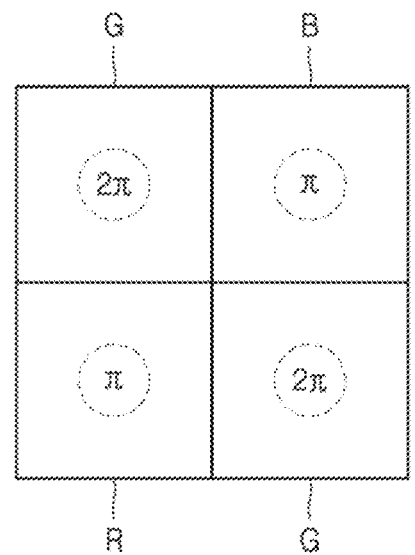
FIGS. 7A and 7B are views illustrating a phase distribution of green light that has passed through a color separating lens array and a computer simulation of a focusing distribution of the green light in a facing photosensitive cell according to an example embodiment.
Figure 7B:
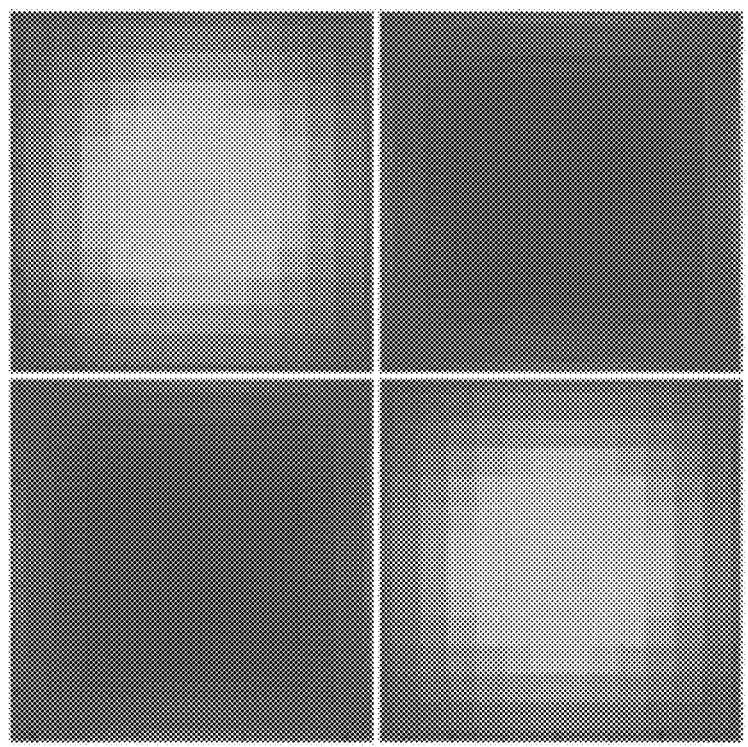
Figure 7C:
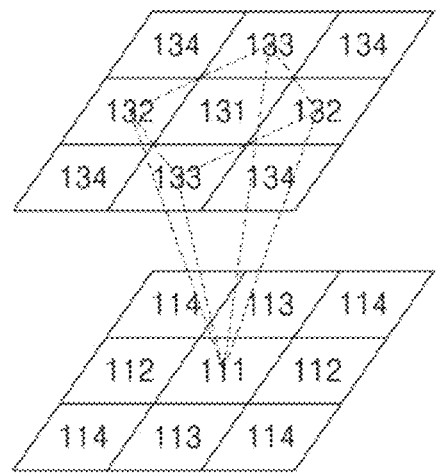
FIG. 7C illustrates a proceeding direction of green light incident on a first region of the color separating lens array corresponding to a green pixel and the periphery of the first region according to an example embodiment.
Figure 7D:
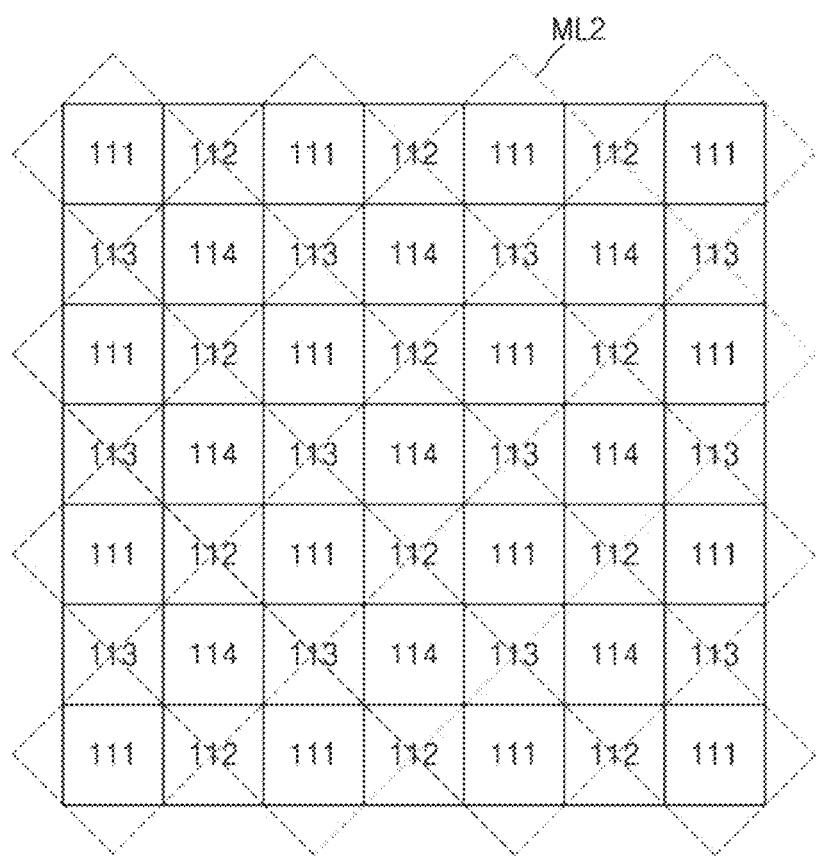
FIG. 7D illustrates an example of a micro-lens array that functions equivalently to the color separating lens array with respect to green light according to an example embodiment.

FIGS. 7A and 7B are diagrams illustrating a phase distribution of green light that has passed through a color separating lens array and a computer simulation of a focusing distribution of the green light in a facing photosensitive cell, FIG. 7C illustrates an example of a proceeding direction of the green light incident on the first region and fourth region, and peripheries thereof, where the first and fourth regions of the color separating lens array 130 correspond to the green pixel, and FIG. 7D illustrates an example of a micro-lens array that equivalently functions as the color separating lens array with respect to the green light.

According to the phase distribution exemplarily shown in FIG. 7A, the phase on the center of the region corresponding to the green pixel G is about 2π and the phase on the centers of the regions corresponding to the adjacent blue pixel B and the red pixel R has a value of about π.

This phase distribution may represent a focusing distribution of the green light as shown in FIG. 7B. The green light is focused on regions corresponding to two green pixels G, and rarely reaches the regions corresponding to the other pixels.

Consequently, the green light incident on the first and fourth regions 131 and 134 corresponding to the green pixel G and a periphery proceeds as shown in FIG. 7C after passing through the color separating lens array 130. For example, among incident light incident on the first region 131 of the color separating lens array 130 and some parts in other regions surrounding the first region 131, the green light is focused on the first photosensitive cell 111 facing the first region 131. Also, among incident light incident on the fourth region 134 of the color separating lens array 130 and some parts in other regions surrounding the fourth region 134, the green light is focused on the fourth photosensitive cell 114 facing the fourth region 134. For example, the green light coming from the first region 131 or the fourth region 134 corresponding to that green pixel G, and the green light coming from two second regions 132 and two third regions 133 adjacent to the first region 131 or the fourth region 134 in the transverse and longitudinal directions are incident on the green pixel G.

Therefore, as shown in FIG. 7D, the color separating lens array 130 may perform an equivalent operation to an array of a plurality of micro-lenses ML2 arranged around the first and fourth photosensitive cells 111 and 114, with respect to the green light. Each equivalent micro-lens ML2 is larger than the first photosensitive cell 111 or the fourth photosensitive cell 114 corresponding to each micro-lens ML2, and thus, the green light incident on other regions surrounding the first photosensitive cell 111 and the fourth photosensitive cell 114, as well as the green light incident to the regions of the first photosensitive cell 111 and the fourth photosensitive cell 114, may be focused onto the first and fourth photosensitive cells 111 and 114. For example, each micro-lens ML2 may be about twice larger than the first photosensitive cell 111 or the fourth photosensitive cell 114 corresponding each micro-lens ML2, and may be arranged to be in contact with the first and fourth photosensitive cells 111 and 114 in the diagonal direction.

Figure 8A:
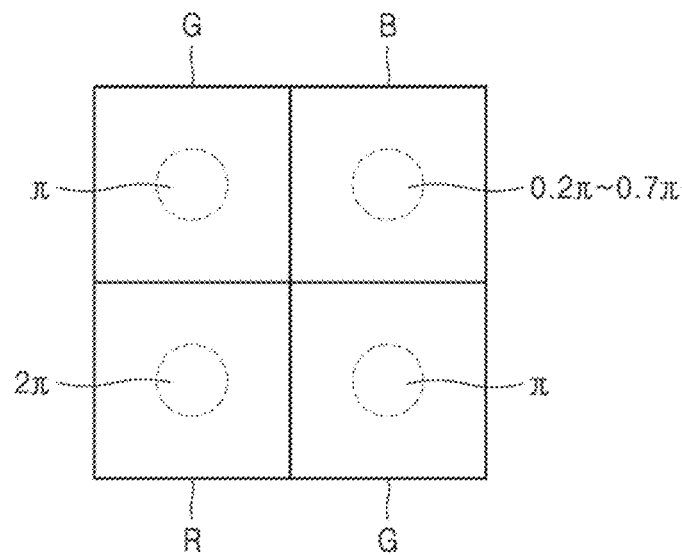
FIGS. 8A and 8B are views illustrating a phase distribution of red light that has passed through a color separating lens array and a computer simulation of a focusing distribution of the red light in a facing photosensitive cell according to an example embodiment.
Figure 8B:
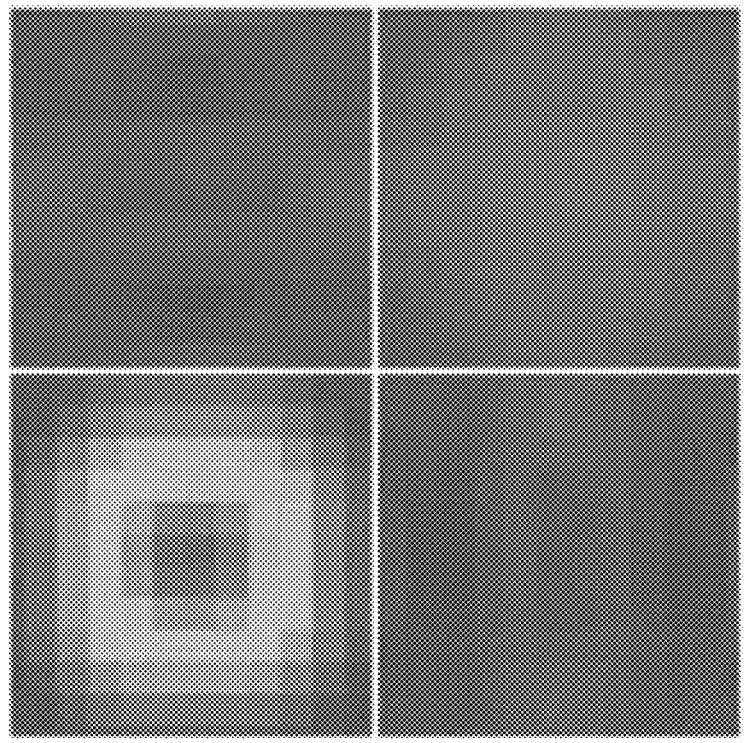
Figures 8C, 8D:
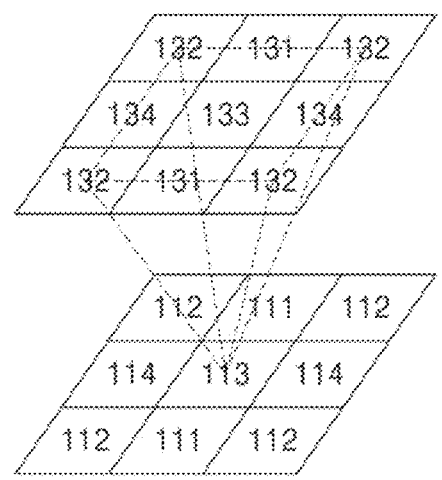
FIG. 8C illustrates a proceeding direction of red light incident on a third region of the color separating lens array corresponding to a red pixel and the periphery of the third region according to an example embodiment.
FIG. 8D illustrates an example of a micro-lens array that functions equivalently to the color separating lens array with respect to the red light according to an example embodiment.

FIGS. 8A and 8B are views illustrating a phase distribution of red light that has passed through a color separating lens array and a computer simulation of a focusing distribution of the red light in a facing photosensitive cell, FIG. 8C illustrates a proceeding direction of red light incident on the third region of the color separating lens array corresponding to the red pixel and a periphery of the third area, and FIG. 8D illustrates an example of a micro-lens array that equivalently functions as the color separating lens array with respect to the red pixel R.

Referring to the phase distribution shown in FIG. 8A, the phase in the center of a region corresponding to the red pixel R may be approximately 2π, and the phase in the center of a region corresponding to the adjacent green pixel G may be about π, and the phase in the center of a region corresponding to the blue pixel B in a diagonal direction may be approximately a value less than π(e.g., about 0.2π to about 0.7π).

This phase distribution may represent a focusing distribution of the red light as shown in FIG. 8B. The red light is focused on the region corresponding to the red pixel R and rarely reaches the regions corresponding to the other pixels.

Consequently, the light incident on the third region 133 corresponding to the red pixel R and a periphery proceeds as shown in FIG. 8C after passing through the color separating lens array 130. For example, among incident light incident on the third region 133 of the color separating lens array 130 and some parts in other regions surrounding the third region 133, the red light is focused on the third photosensitive cell 113 facing the third region 133. For example, the red light coming from the third region 133 corresponding to that red pixel R, red light coming from two fourth regions 134 that are adjacent to the third region 133 in the transverse direction, the red light coming from two first regions 131 adjacent to the third region 133 in the longitudinal direction, and the red light coming from four second regions 132 adjacent to the third region 133 in the diagonal directions are incident on the red pixel R.

Therefore, as shown in FIG. 8D, the color separating lens array 130 may perform an equivalent operation to an array of a plurality of micro-lenses ML3 arranged around the third photosensitive cell 113, with respect to the red light. Each equivalent micro-lens ML3 is larger than the third photosensitive cell 113 corresponding to the micro-lens ML3, and thus, the red light incident to other regions surrounding the third photosensitive cell 113, as well as the red light incident to the region of the third photosensitive cell 113, may be focused on the third photosensitive cell 113. For example, each micro-lens ML3 may be about four times greater than the third photosensitive cell 113 corresponding thereto, and four sides of each micro-lens ML3 may be in parallel with four sides of the third photosensitive cell 113.

With respect to results shown in FIGS. 6C, 6D, 7C, 7D, 8C, and 8D, among the incident light incident on the first region 131 of the color separating lens array 130, the green light proceeds toward the center of the first photosensitive cell 111 corresponding to the first region 131, the blue light proceeds toward the center of the second photosensitive cell 112 around the first photosensitive cell 111 corresponding to the first region 131, and the red light proceeds toward the center of the third photosensitive cell 113 around the first photosensitive cell 111 corresponding to the first region 131. Also, among the incident light incident on the second region 132 of the color separating lens array 130, the blue light proceeds toward the center of the second photosensitive cell 112 corresponding to the second region 132, the green light proceeds toward the centers of the first and fourth photosensitive cells 111 and 114 around the second photosensitive cell 112 corresponding to the second region 132, and the red light proceeds toward the center of the third photosensitive cell 113 around the second photosensitive cell 112 corresponding to the second region 132. Likewise, among the incident light incident on the third region 133 of the color separating lens array 130, the red light proceeds toward the center of the third photosensitive cell 113 corresponding to the third region 133, the green light proceeds toward the centers of the first and fourth photosensitive cells 111 and 114 around the third photosensitive cell 113 corresponding to the third region 133, and the blue light proceeds toward the center of the second photosensitive cell 112 around the third photosensitive cell 113 corresponding to the third region 133. Likewise, among the incident light incident to the fourth region 134 of the color separating lens array 130, the green light proceeds toward the center of the fourth photosensitive cell 114 corresponding to the fourth region 134, the blue light proceeds toward the centers of the second photosensitive cell 112 around the fourth photosensitive cell 114 corresponding to the fourth region 134, and the red light proceeds toward the center of the third photosensitive cell 113 around the fourth photosensitive cell 114 corresponding to the fourth region 134.

The above color separation and focusing may be more effectively performed by appropriately setting the thickness of the spacer layer 120. For example, when a theoretical thickness of the spacer layer 120 is $h_t$, a refractive index of the spacer layer 120 with respect to a wavelength $\lambda_0$ is n, and the pitch of the photosensitive cell is p, Equation 1 below may be satisfied.

$$h_t = \frac{np^2}{\lambda_0} - \frac{\lambda_0}{4n} \quad \text{[Equation 1]}$$

Here, the theoretical thickness $h_t$ of the spacer layer 120 may refer to a focal length at which light having a wavelength of $\lambda_0$ is focused onto a top surface of the photosensitive cells 111, 112, 113, and 114 by the color separating lens array 130. For example, the light having the wavelength of $\lambda_0$ may be focused at a distance $h_t$ from a lower surface of the color separating lens array 130 while passing through the color separating lens array 130.

As expressed in Equation 1 above, the theoretical thickness $h_t$ of the spacer layer 120 may vary depending on the pitch p of the photosensitive cells 111, 112, 113, and 114 and the refractive index n of the spacer layer 120. For example, when the center wavelength $\lambda_0$ of the visible ray band is 540 nm, the pitch p of the photosensitive cells 111, 112, 113, and 114 is 0.8 μm, and the refractive index n of the spacer layer 120 at the wavelength of 540 nm is 1.46, the theoretical thickness $h_t$ of the spacer layer 120, that is, a distance between the lower surface of the color separating lens array 130 and the upper surface of the sensor substrate 110, is about 1.64 m. However, the actual thickness h of the spacer layer 120 is not necessarily limited to the theoretical thickness $h_t$ expressed by Equation 1 above. For example, the actual thickness of the spacer layer 120 may be selected within a predetermined range based on the theoretical thickness $h_t$, taking into account the efficiency of the color separating lens array 130.

Figure 9A:
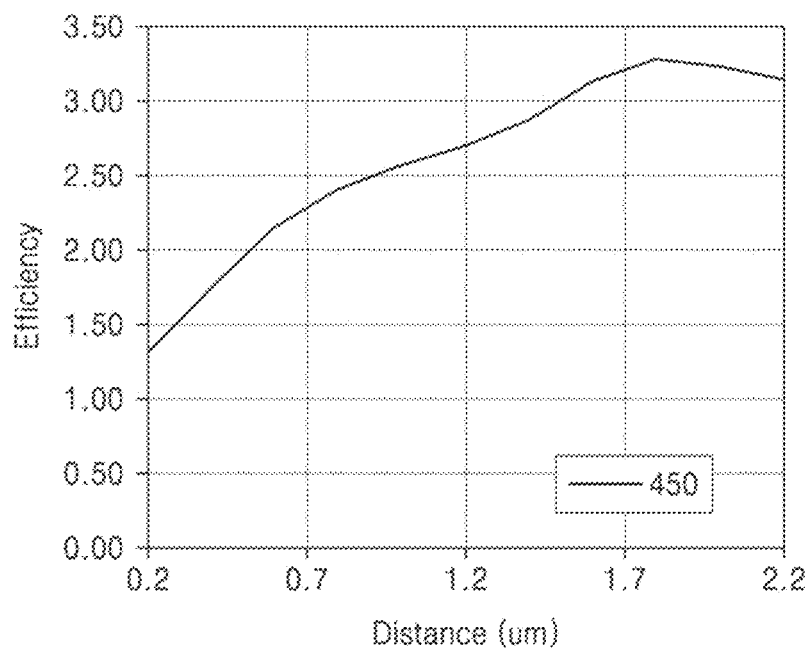
Figure 9B:
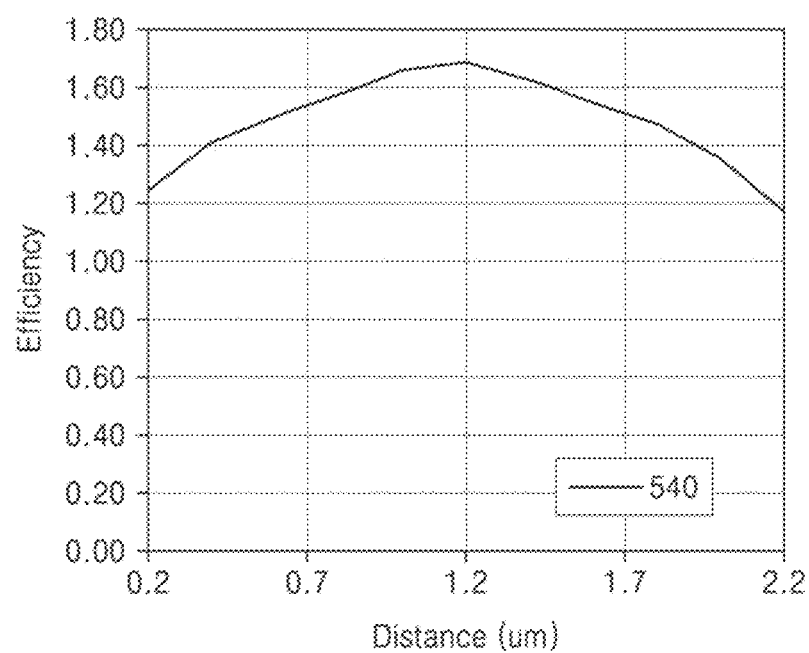

FIGS. 9A to 9E are graphs exemplarily showing a variation in the efficiency of the color separating lens array 130 according to the distance between the color separating lens array 130 and the sensor substrate 110 when the pitch of the photosensitive cells 111, 112, 113, and 114 is 0.7 μm according to an example embodiment. FIG. 9A shows focusing efficiency of the color separating lens array 130 with respect to the blue light incident on the second photosensitive cell 112 from the first to fourth regions 131, 132, 133, and 134 constituting the unit pattern array of the color separating lens array 130, FIG. 9B shows focusing efficiency of the color separating lens array 130 with respect to the green light incident on the first and fourth photosensitive cells 111 and 114 from the first to fourth regions 131, 132, 133, and 134 constituting the unit pattern array, and FIG. 9C shows focusing efficiency of the color separating lens array 130 with respect to the red light incident on the third photosensitive cell 113 from the first to fourth regions 131, 132, 133, and 134 constituting the unit pattern array.

In FIGS. 9A and 9C, four regions are arranged with respect to one photosensitive cell, and thus, theoretically the maximum value is 4. In FIG. 9B, four regions are arranged with respect to two photosensitive cells, and thus, the theoretical maximum value is 2. In the graphs of FIGS. 9A to 9C, the distance at which the focusing efficiency of the color separating lens array 130 is the highest becomes the theoretical thickness $h_t$ satisfying Equation 1 above. As shown in FIGS. 9A to 9C, the theoretical thickness $h_t$ may vary depending on the wavelength.

Figure 9E:
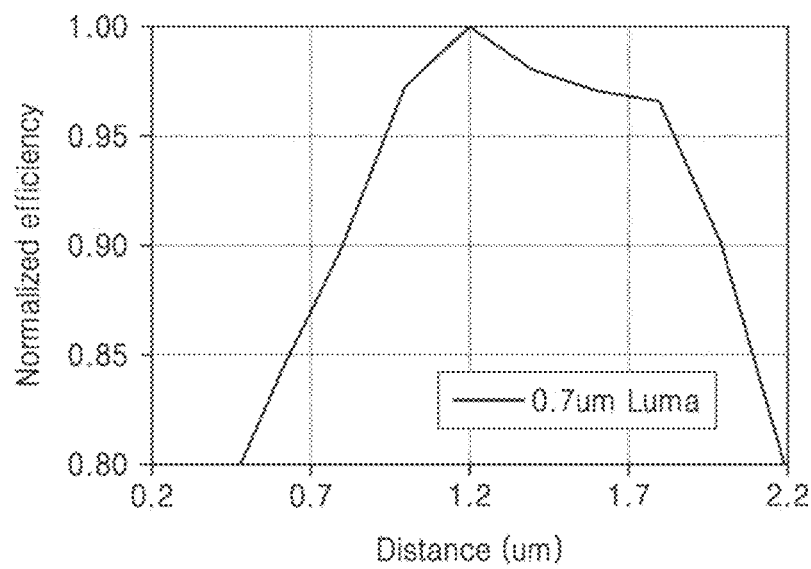
Figure 10A:
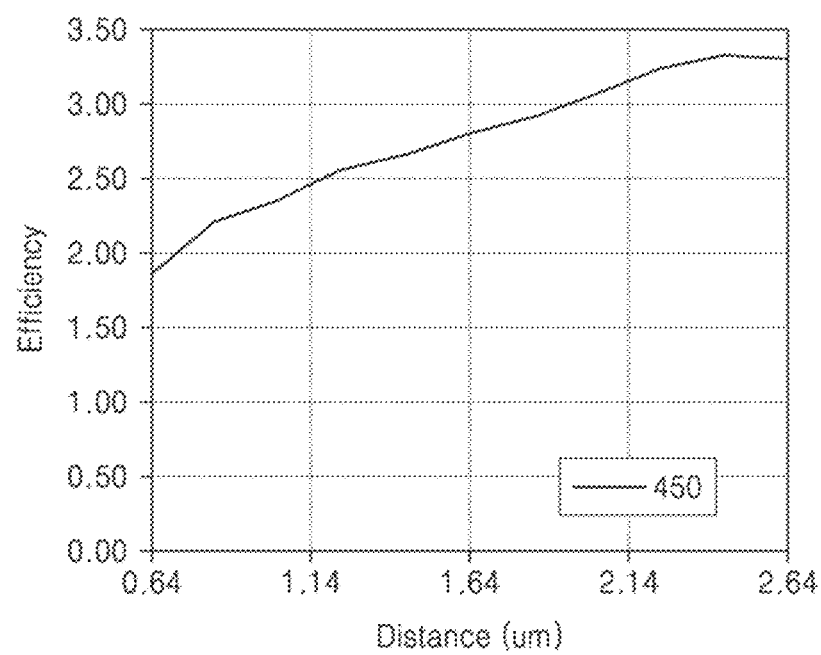
FIGS. 10A, 10B, 10C, 10D, and 10E are graphs illustrating a change in efficiency of a color separating lens array according to a distance between the color separating lens array and a sensor substrate when a pitch of a photosensitive cell is 0.8 m according to an example embodiment.
Figure 10B:
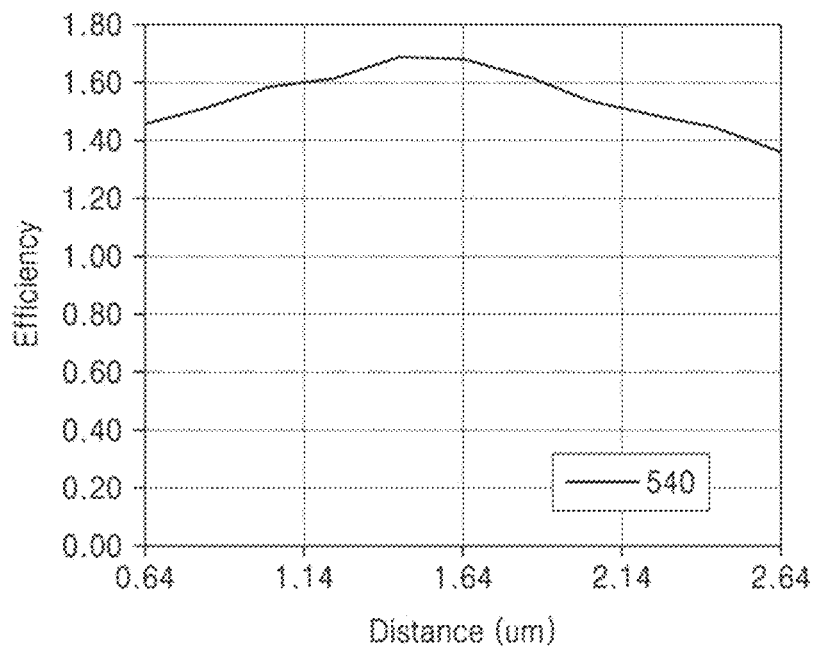
Figure 10C:
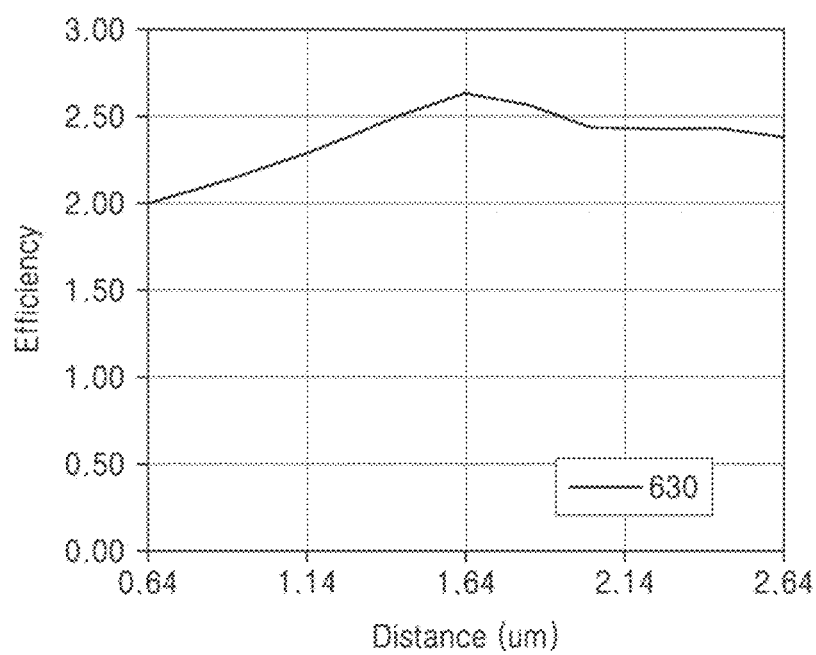
Figure 10D:
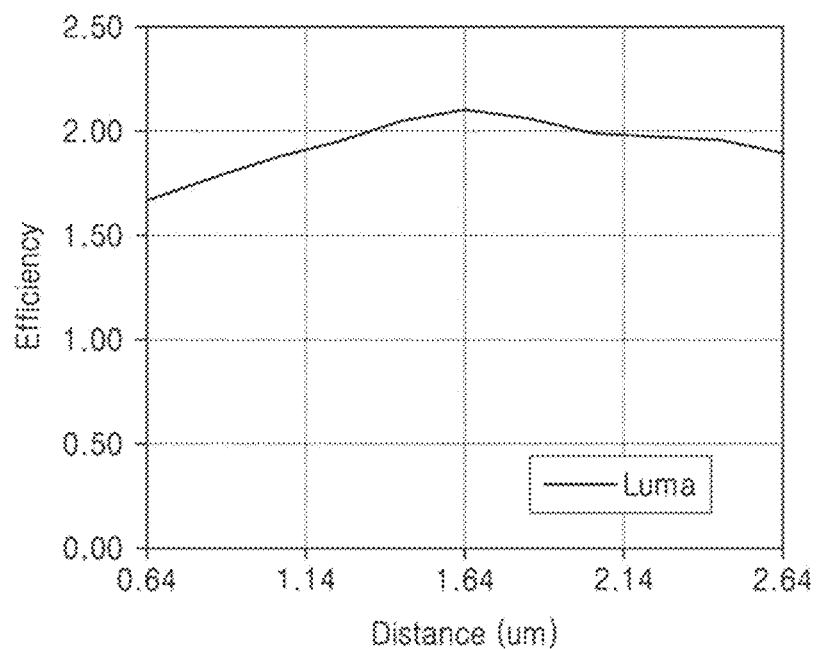
Figure 10E:
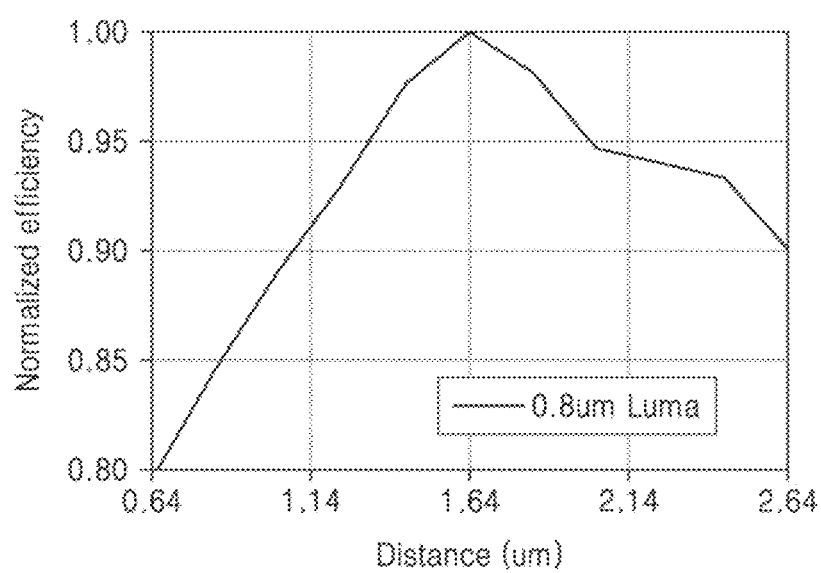
Figure 11A:
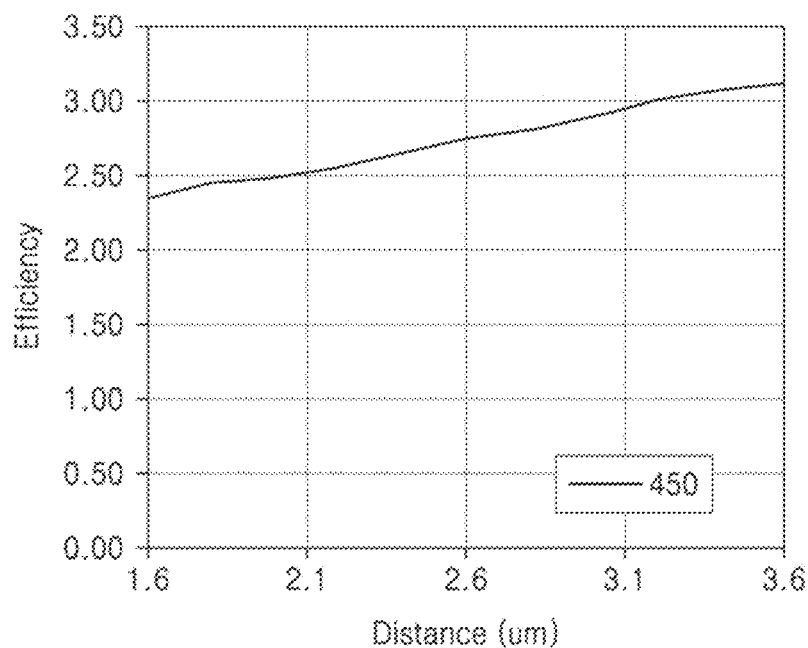
FIGS. 11A, 11B, 11C, 11D, and 11E are graphs illustrating a change in efficiency of a color separating lens array according to a distance between the color separating lens array and a sensor substrate when a pitch of a photosensitive cell is 1.0 m according to an example embodiment.
Figure 11B:
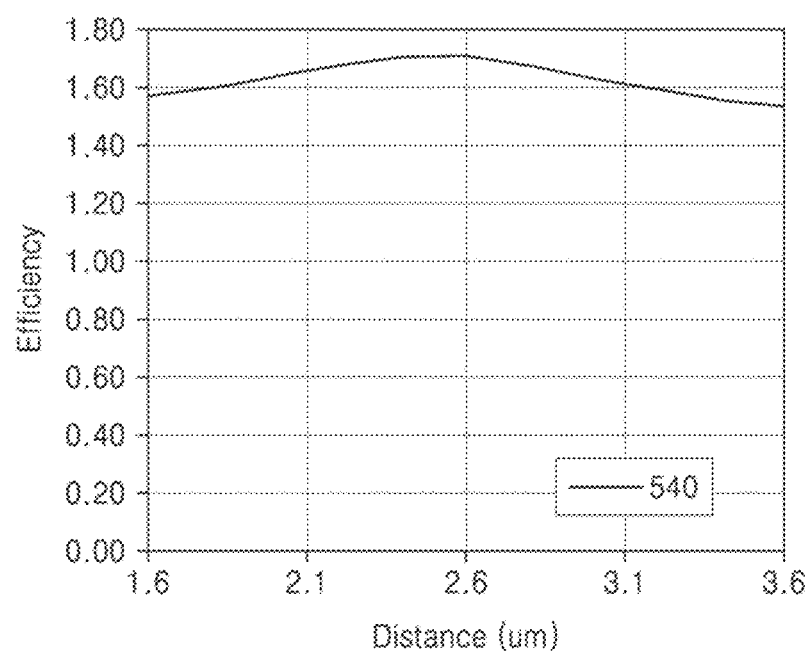
Figure 11C:
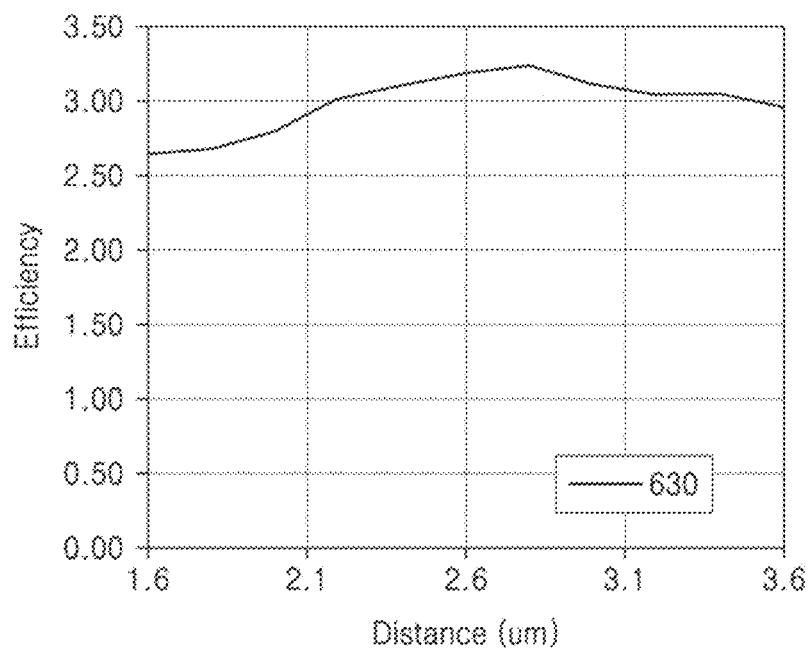
Figure 11D:
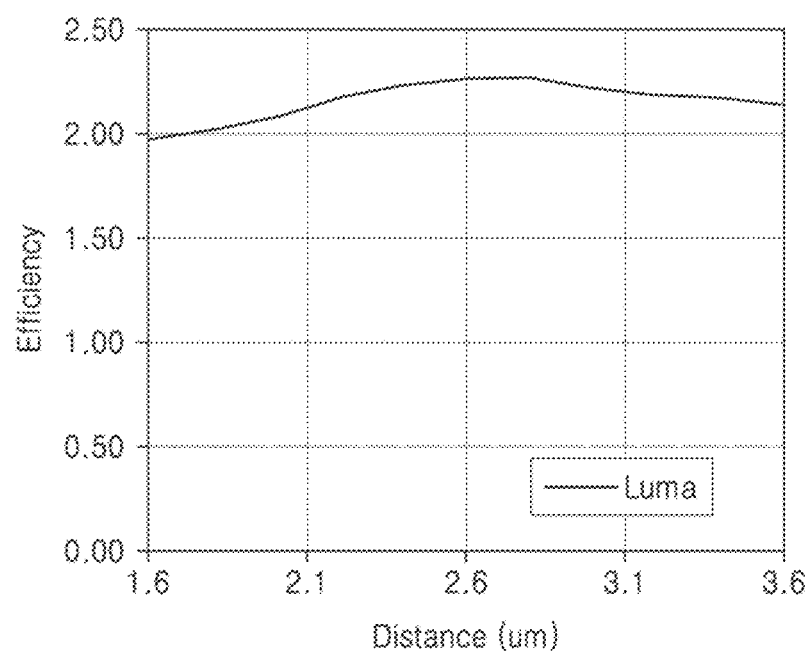
Figure 11E:
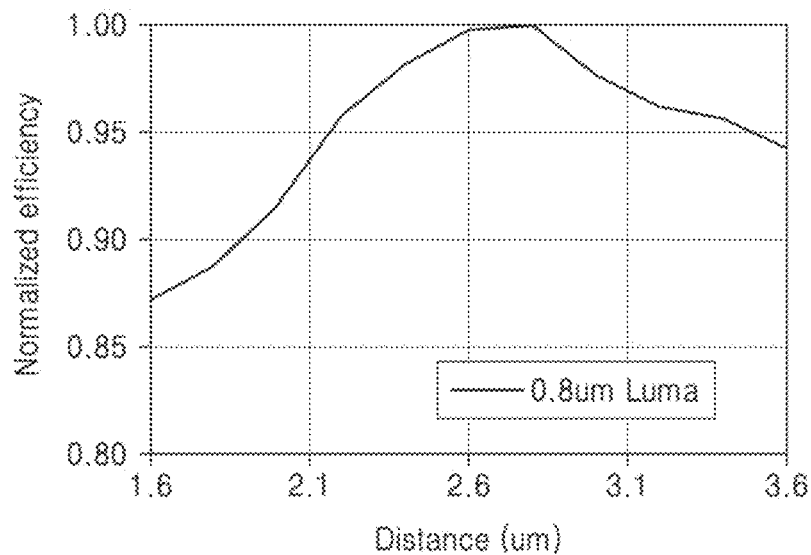

FIG. 9D is a graph exemplarily showing the variation in the efficiency of the color separating lens array 130 taking into account sensitivity characteristics of human eye with respect to the visible ray. For example, eyes of a human being generally have the highest sensitivity with respect to the green light and the lowest sensitivity with respect to the blue light. Therefore, the graph of FIG. 9D may be obtained by giving the lowest weight to the graph of FIG. 9A, giving a weight higher than the weight applied to the blue light to the graph of FIG. 9C, and giving the highest weight to FIG. 9B and averaging the summed values. FIG. 9E is a graph showing a result of normalizing the graph of FIG. 9D.

Referring to the graphs of FIGS. 9D and 9E, the efficiency of the color separating lens array 130 with respect to the visible ray taking into account the sensitivity characteristic of human eyes is the highest at the distance of about 1.2 μm when the pitch of the photosensitive cells 111, 112, 113, and 114 is 0.7 μm. Also, the efficiency of the color separating lens array 130 is about 80% of the maximum efficiency at the distance of about 0.5 μm and is about 95% of the maximum efficiency at the distance of about 1.9 μm.

FIGS. 10A to 10E are graphs exemplarily showing a variation in the efficiency of the color separating lens array 130 according to the distance between the color separating lens array 130 and the sensor substrate 110 when the pitch of the photosensitive cells 111, 112, 113, and 114 is 0.8 μm according to example embodiments. Referring to the graphs of FIGS. 10A to 10E, the efficiency of the color separating lens array 130 with respect to the visible ray taking into account the sensitivity characteristic of human eyes is the highest at the distance of about 1.64 μm when the pitch of the photosensitive cells 111, 112, 113, and 114 is 0.8 μm. Also, the efficiency of the color separating lens array 130 is about 85% of the maximum efficiency at the distance of about 0.8 μm and is about 93% of the maximum efficiency at the distance of about 2.5 μm.

FIGS. 11A to 11E are graphs exemplarily showing a variation in the efficiency of the color separating lens array 130 according to the distance between the color separating lens array 130 and the sensor substrate 110 when the pitch of the photosensitive cells 111, 112, 113, and 114 is 1.0 μm. Referring to the graphs of FIGS. 11A to 11E, the efficiency of the color separating lens array 130 with respect to the visible ray taking into account the sensitivity characteristic of human eyes is the highest at the distance of about 2.6 μm when the pitch of the photosensitive cells 111, 112, 113, and 114 is 1.0 μm. Also, the efficiency of the color separating lens array 130 is about 87% of the maximum efficiency at the distance of about 1.6 μm and is about 94% of the maximum efficiency at the distance of about 3.6 μm.

Consequently, even when the actual thickness h of the spacer layer 120 is greater or less than the theoretical thickness $h_t$ by the pitch p of the photosensitive cells 111, 112, 113, and 114, the color separating lens array 130 may have a high efficiency, e.g., 80% or greater, 90% or greater, or 95% or greater with respect to the maximum efficiency. According to the above result, the actual thickness h of the spacer layer 120 may be selected within a range of $h_t - p \leq h \leq h_t + p$.

Because the color separating lens array 130 described above may branch the incident light by wavelength and focus the branched light on a specific region without absorbing or blocking the incident light, the light utilization efficiency of the image sensor may be improved. Also, because the color separating lens array 130 has an improved color separation performance, the image sensor adopting the color separating lens array 130 may have an improved color purity. In addition, the image sensor adopting the color separating lens array 130 may implement the Bayer pattern type that is generally adopted in the image sensor, and thus, the image processing algorithm that is the same as that of the existing pixel structure may be used. Moreover, because the color separating lens array 130 may function as a lens for condensing the incident light, the image sensor employing the color separating lens array 130 may not require a separate micro-lens for focusing the light on the pixel.

Figure 12:
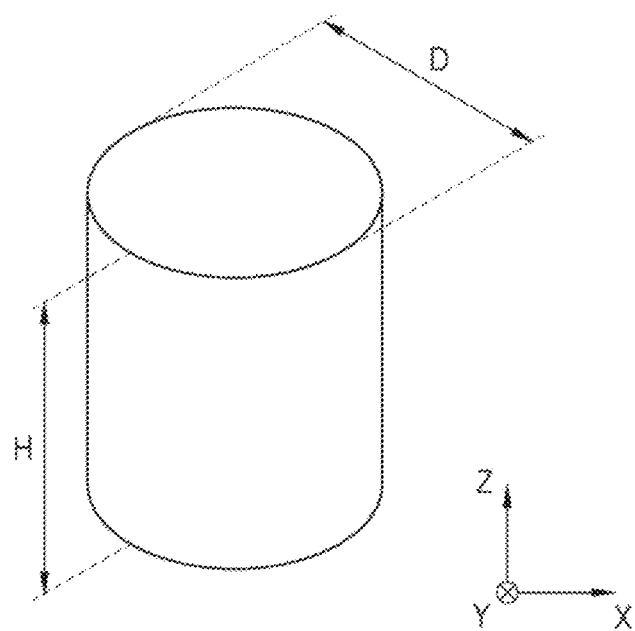
FIG. 12 is a perspective view illustrating an exemplary shape of nanoposts that may be employed in a color separating lens array of an image sensor according to an example embodiment.

FIG. 12 is a perspective view illustrating an exemplary shape of nanoposts that may be employed in the color separating lens array according to an example embodiment. Referring to FIG. 12, the nanoposts may each have a cylinder shape having a diameter D and a height H. The diameter D and the height H may have a value of sub-wavelength, and the diameter D may be changed according to a location in which the nanoposts are arranged.

Also, the nanoposts may have a shape of a pillar with various cross-sectional shapes. FIGS. 13A to 13H are plan views illustrating an exemplary shape of nanoposts that may be employed in the color separating lens array 130 of the image sensor.

Figure 13A:
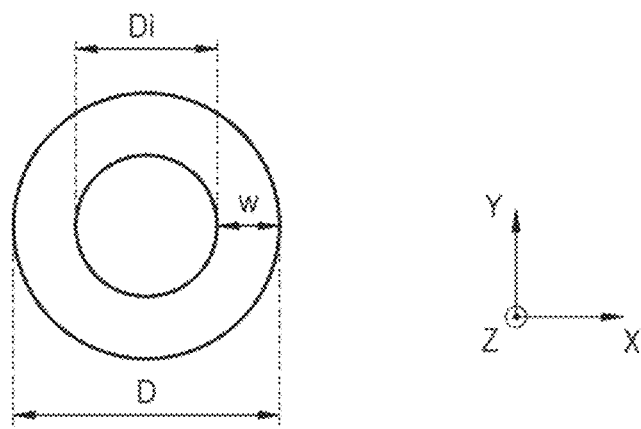
FIGS. 13A, 13B, 13C, 13D, 13E, 13F, 13G, and 13H are plan views illustrating an exemplary shape of nanoposts that may be employed in a color separating lens array of an image sensor according to another example embodiment.
Figure 13B:
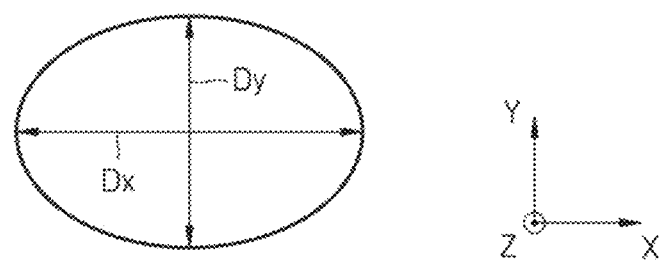

As shown in FIG. 13A, the cross-sectional shape of the nanoposts may be a circular ring shape with an outer diameter D and an inner diameter Di. A width w of the circular ring may have a value of sub-wavelength. As shown in FIG. 13B, the cross-sectional shape of the nanoposts may be an oval shape with different long axis and short axis lengths Dx and Dy in the first direction (X-direction) and the second direction (Y-direction). This shape may be employed in the first region 131 and the fourth region 134 corresponding to the green pixel, as described above with reference to FIG. 5B, for example.

Figure 13C:
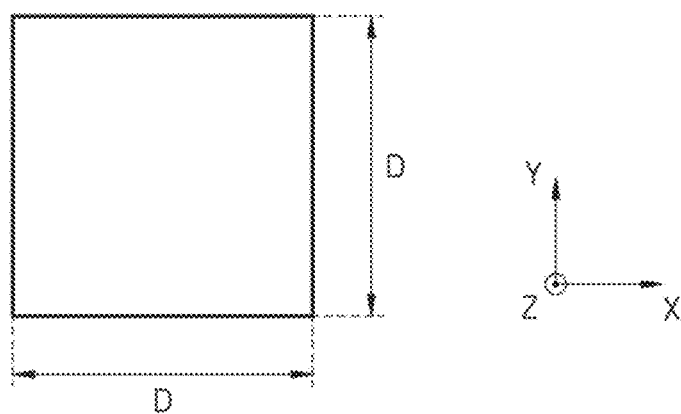
Figure 13D:
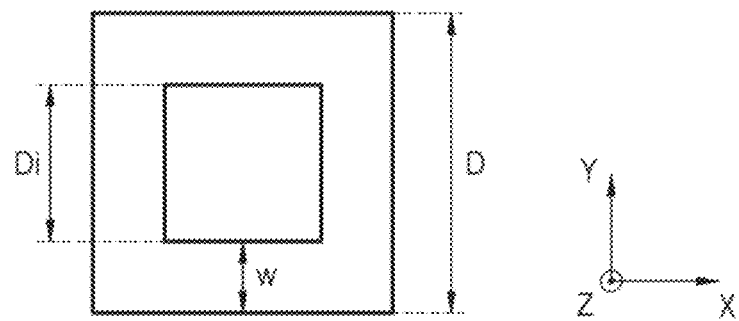
Figure 13E:
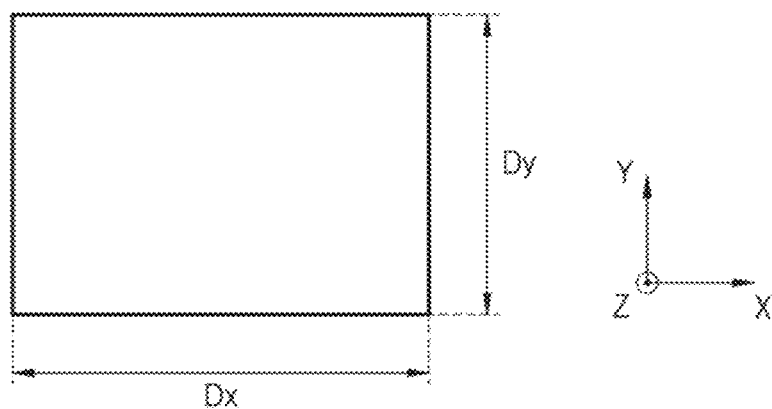
Figure 13F:
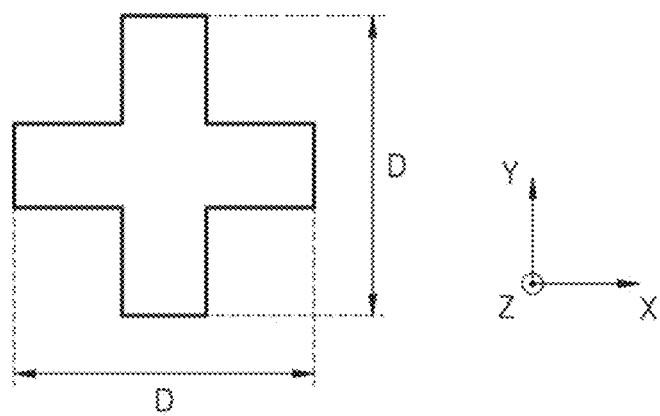
Figure 13G:
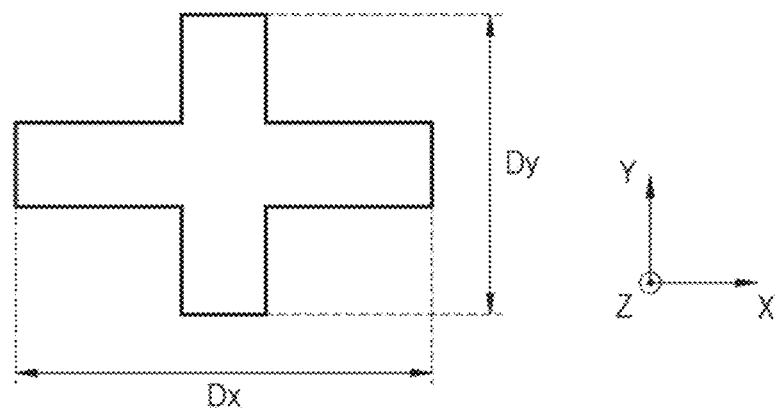

Additionally, as shown in FIGS. 13C, 13D, and 13F, the cross-sectional shape of the nanoposts may be a square shape, a square ring shape, a cross shape, or the rectangular shape or cross shape having the different lengths Dx and Dy in the first direction (X-direction) and the second direction (Y-direction) as shown in FIGS. 13E and 13G. Such rectangular or cross shape may be employed in the first region 131 and the fourth region 134 corresponding to the green pixel, as described above with reference to FIG. 5B.

Figure 13H:
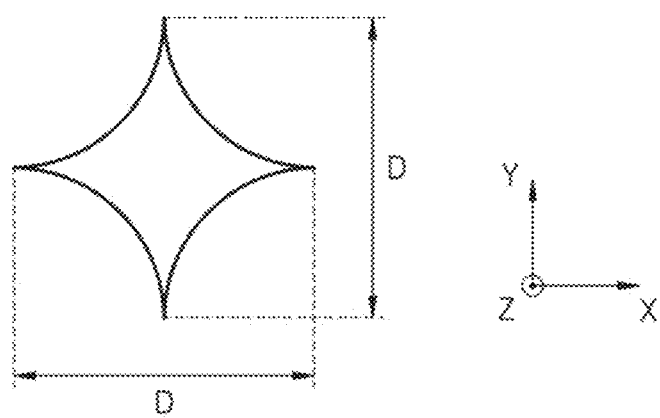

In another example embodiment, the cross-sectional shape of the nanoposts may have a plurality of concave arcs as shown in FIG. 13H.

Figure 14:
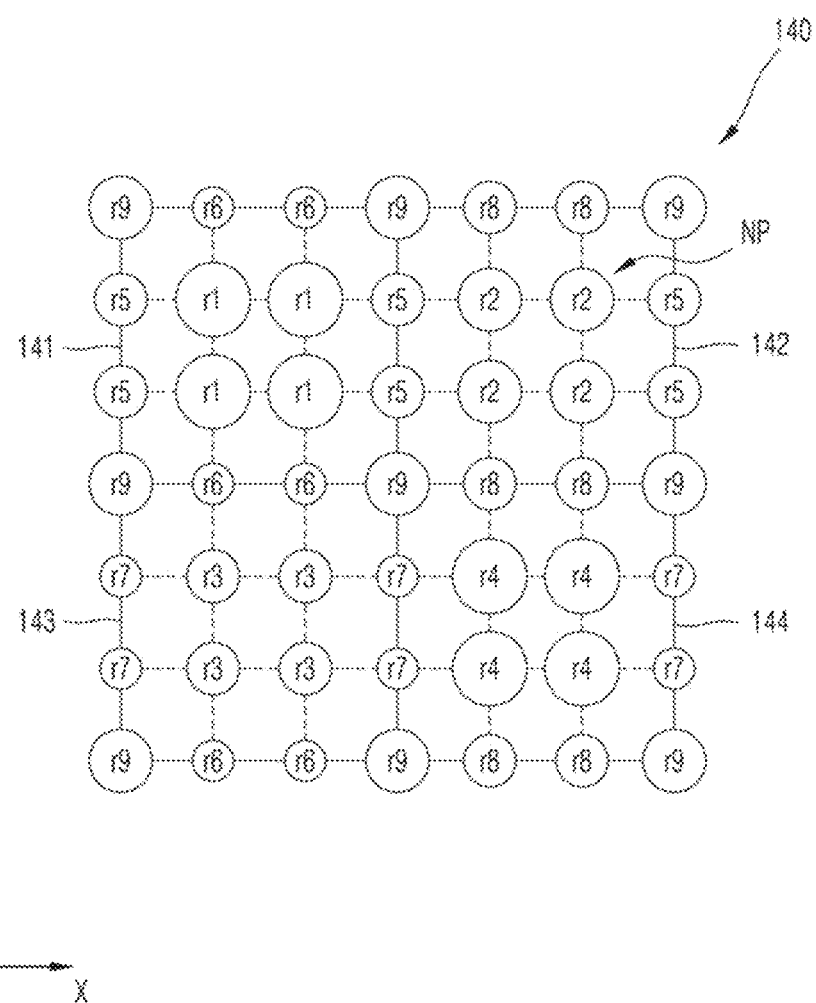
FIG. 14 is a plan view illustrating the arrangement form of a plurality of nanoposts included in a color separating lens array of an image sensor according to another example embodiment.

FIG. 14 is a plan view illustrating the arrangement form of a plurality of nanoposts included in a color separating lens array 140 according to another example embodiment.

The color separating lens array 140 has a shape corresponding to pixel arrangement of the Bayer pattern illustrated in FIG. 2A, and may include quadrant regions including a first region 141 corresponding to the green pixel G, a second region 142 corresponding to the blue pixel B, a third region 143 corresponding to the red pixel R, and a fourth region 144 corresponding to the green pixel G. The unit pattern array as above may be repeatedly arranged in the first direction (X-direction) and the second direction (Y-direction). Each of the regions may be equally divided into a plurality of sub-regions, and nanoposts NP may be arranged on cross points of boundaries of the sub-regions. FIG. 14 shows an example, in which the number of sub-regions is 9, and the nanoposts NP are arranged on grid points obtained by dividing nine sub-regions. Thus, the nanoposts NP are not on the center point of each region 141, 142, 143, or 144, and four nanoposts NP having the same shape configure a center portion. The nanoposts NP of a peripheral portion are on a boundary of another region. The nanoposts NP are indicated as r1 to r9 according to detailed locations thereof in the unit pattern array.

Referring to FIG. 14, the nanoposts r1 at the center portion of the first region 141 corresponding to the green pixel have a greater cross-sectional area than that of nanoposts r5, r6, and r9 at the peripheral portion, and nanoposts r4 on the center portion of the fourth region 144 corresponding to the green pixel has a greater cross-sectional area than that of nanoposts r7, r8, and r9 on the peripheral portion. Cross-sectional area of the nanoposts r1 and r4 arranged on the center portions of the first and fourth regions 141 and 144 corresponding to the green pixel may be greater than cross-sectional areas of the nanopost r2 arranged on the center portion of the second region 142 corresponding to the blue pixel and the nanoposts r3 arranged on the center portion of the third region 143 corresponding to the red pixel. Also, the cross-sectional area of the nanopost r2 arranged on the center portion of the second region 142 corresponding to the blue pixel may be greater than that of the nanopost r3 arranged on the center portion of the third region 143 corresponding to the red pixel.

The nanoposts NP in the second region 142 and the third region 143 may be symmetrically arranged in the first direction (X-direction) and the second direction (Y-direction), and the nanoposts NP in the first and fourth regions 141 and 144 may be asymmetrically arranged in the first direction (X-direction) and the second direction (Y-direction). For example, the nanoposts NP in the second and third regions 142 and 143 corresponding respectively to the blue pixel and the red pixel may be arranged by the same distribution rule in the first direction (X-direction) and the second direction (Y-direction), and the nanoposts NP in the first and fourth regions 141 and 144 corresponding to the green pixel may be arranged by different distribution rules in the first direction (X-direction) and the second direction (Y-direction).

From among the nanoposts NP, the cross-sectional area of the nanopost r5 located on the boundary between the first region 141 and the second region 142 that is adjacent to the first region 141 in the first direction (X-direction) is different from that of the nanopost r6 located on the boundary between the first region 141 and the third region 143 that is adjacent to the first region 141 in the second direction (Y-direction). Also, the cross-sectional area of the nanopost r7 located on the boundary between the fourth region 144 and the third region 143 that is adjacent to the fourth region 144 in the first direction (X-direction) is different from that of the nanopost r8 located on the boundary between the fourth region 144 and the second region 142 that is adjacent to the fourth region 144 in the second direction (Y-direction).

On the other hand, the cross-sectional area of the nanopost r5 located on the boundary between the first region 141 and the second region 142 that is adjacent to the first region 141 in the first direction (X-direction) is equal to that of the nanopost r8 located on the boundary between the fourth region 144 and the second region 142 that is adjacent to the fourth region 144 in the second direction (Y-direction). In addition, the cross-sectional area of the nanopost r6 located on the boundary between the first region 141 and the third region 143 that is adjacent to the first region 141 in the second direction (Y-direction) is equal to that of the nanopost r7 located on the boundary between the fourth region 144 and the third region 143 that is adjacent to the fourth region 144 in the first direction (X-direction).

In addition, the nanoposts p9 at four corners in each of the first to fourth regions 141, 142, 143, and 144, that is, points where the four regions cross one another, have the same cross-sectional areas from one another.

As described above, in the second and third regions 142 and 143 respectively corresponding to the blue pixel B and the red pixel R, the nanoposts NP may be arranged in the form of 4-fold symmetry, and in the first and fourth regions 141 and 144 corresponding to the green pixels G, the nanoposts NP may be arranged in the form of 2-fold symmetry. In addition, the first region 141 and the fourth region 144 are rotated by 90° angle with respect to each other. This may be also applied to an embodiment that will be described later with reference to FIGS. 16 and 17.

Figure 15:
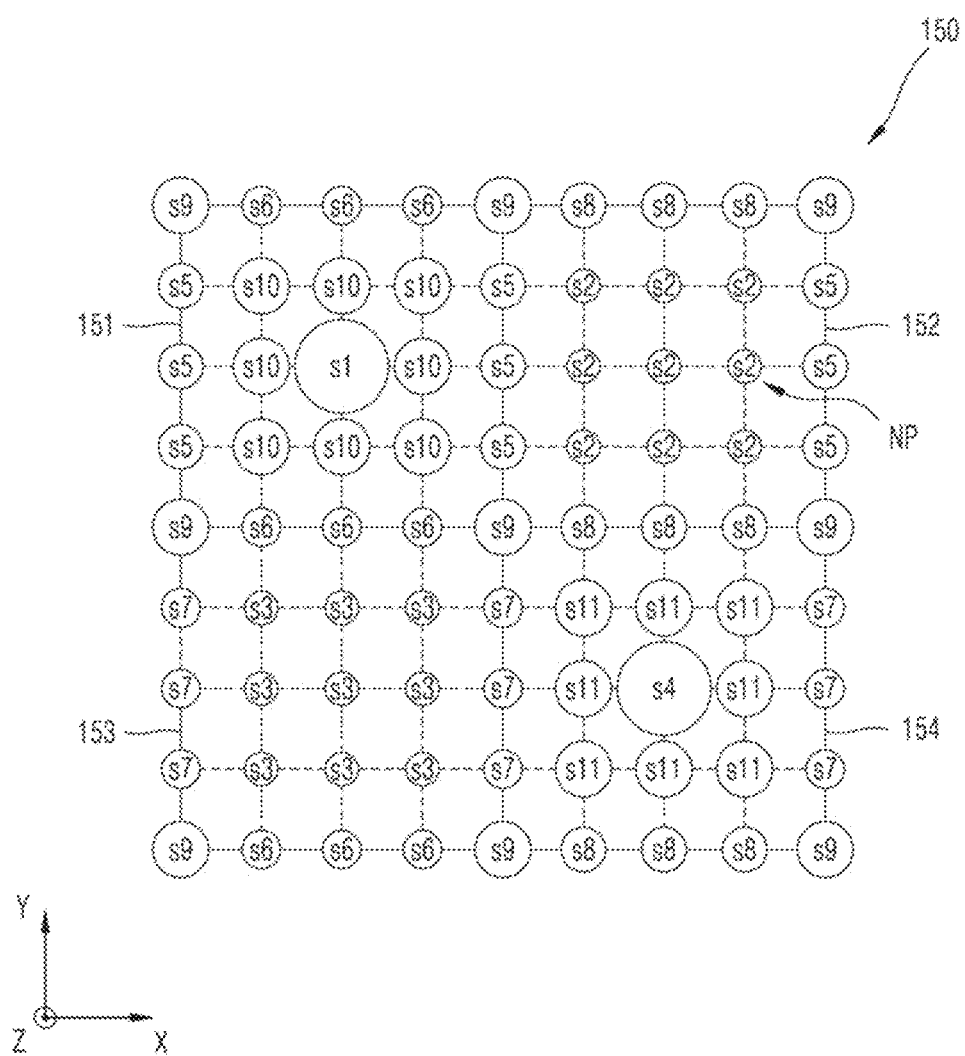
FIG. 15 is a plan view illustrating the arrangement form of a plurality of nanoposts included in a color separating lens array of an image sensor according to another example embodiment.

FIG. 15 is a plan view illustrating the arrangement form of a plurality of nanoposts included in a color separating lens array 150 according to another example embodiment.

The color separating lens array 150 has a shape corresponding to the pixel arrangement of the Bayer pattern, and may include quadrant regions, e.g., a first region 151 corresponding to a green pixel, a second region 152 corresponding to a blue pixel, a third region 153 corresponding to a red pixel, and a fourth region 154 corresponding to a green pixel.

Each of the regions may be equally divided into a plurality of sub-regions, and nanoposts NP may be arranged on cross points of boundaries of the sub-regions. FIG. 15 is different from the nanostructure arrangement of FIG. 14 in that an example in which the number of sub-regions is 16 is shown, and nanoposts NP are arranged on grid points dividing 16 sub-regions, and thus, the nanoposts NP are arranged on a center point of each region 151, 152, 153, or 154. The nanoposts NP are indicated as s1 to s11 according to detailed locations thereof in the unit pattern array.

In the example embodiment illustrated in FIG. 15, a nanopost s1 located at the center point of the first region 151 corresponding to the green pixel and a nanopost s4 located at the center point of the fourth region 154 have cross-sectional areas greater than those of the nanoposts NP located on the peripheral portion, and greater than those of the nanoposts NP arranged on the second region 152 corresponding to the blue pixel and the third region 153 corresponding to the red pixel.

The nanopost s1 having the greatest cross-sectional area in the first region 151 is at the center point, and nanoposts s10, s5, and s6 having cross-sectional areas that are gradually reduced are arranged toward the peripheral portion. The nanopost s4 having the greatest cross-sectional area in the fourth region 154 is at the center point, and nanoposts s11, s7, and s8 having cross-sectional areas that are gradually reduced are arranged toward the peripheral portion. In the second region 152, nine nanoposts s2 having the same cross-sectional area are arranged on the center portion, and the nanoposts s5 and s8 having greater cross-sectional areas than those of the nanoposts s2 are arranged on the peripheral portion. In the third region 153, nine nanoposts s3 having the same cross-sectional area are arranged on the center portion, and the nanoposts s6 and s7 having greater cross-sectional areas than those of the nanoposts s3 are arranged on the peripheral portion. In the second and third regions 152 and 153, the nanoposts NP on the peripheral portion are on the boundaries with other regions.

In the example embodiment of FIG. 15, similar to the example embodiment illustrated in FIG. 14, the nanoposts NP in the second and third regions 152 and 153 may be symmetrically arranged in the first direction (X-direction) and the second direction (Y-direction), and the nanoposts NP in the first and fourth regions 151 and 154 may be asymmetrically arranged in the first direction (X-direction) and the second direction (Y-direction). Also, the nanoposts s9 arranged at four corners in each of the first to fourth regions 151, 152, 153, and 154, that is, locations where the four regions are adjacent to one another, have the same cross-sectional area as one another.

Figure 16:
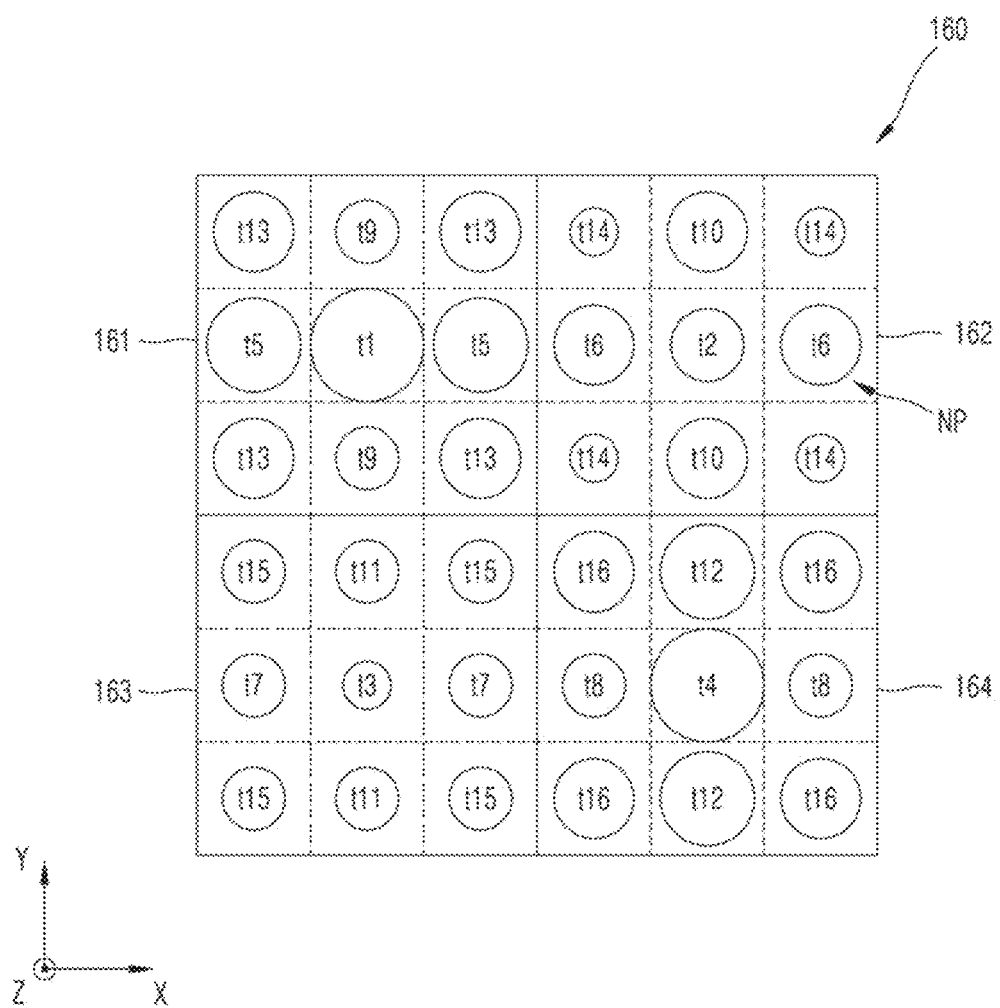
FIG. 16 is a plan view illustrating the arrangement form of a plurality of nanoposts included in a color separating lens array of an image sensor according to another example embodiment.

FIG. 16 is a plan view illustrating the arrangement form of a plurality of nanoposts included in a color separating lens array 160 according to another example embodiment.

The color separating lens array 160 has a shape corresponding to the pixel arrangement of the Bayer pattern, and may include quadrant regions, e.g., a first region 161 corresponding to a green pixel, a second region 162 corresponding to a blue pixel, a third region 163 corresponding to a red pixel, and a fourth region 164 corresponding to a green pixel.

Each of the regions may be equally divided into a plurality of sub-regions, and nanoposts NP may be arranged in the sub-regions. Similar to the example of FIG. 14, each of the regions in the color separating lens array 160 is partitioned into nine sub-regions, except that the nanoposts NP are arranged in each sub-region, not on the cross points among the sub-regions. The nanoposts NP are indicated as t1 to t16 according to detailed locations thereof in the unit pattern array.

According to the example embodiment of FIG. 16, the nanopost t1 located on a center of the first region 161 and nanopost t4 located on a center of the fourth region 164 may each have a cross-sectional area greater than those of the nanoposts NP arranged in the second and third regions 162 and 163, as well as the nanoposts NP located on the peripheral portions.

A cross-sectional area of the nanopost t2 arranged on a center of the second region 162 may be greater than that of the nanopost t3 arranged on a center of the third region 163. In the second region 162, the nanoposts t6 and t10 located on peripheral portions apart from the center in the first direction (X-direction) and the second direction (Y-direction) have cross-sectional areas greater than that of the nanopost t2 at the center, and the nanoposts t14 apart from the center in the diagonal directions have cross-sectional areas smaller than that of the nanopost t2 on the center.

In the third region 163, the nanopost t3 on the center has the smallest cross-sectional area, and nanoposts t7, t11, and t15 at the peripheral portions have cross-sectional areas greater than that of the nanopost t3 on the center.

The nanoposts NP in the second region 162 and the third region 163 may be symmetrically arranged in the first direction (X-direction) and the second direction (Y-direction), and the nanoposts NP in the first and fourth regions 161 and 164 may be asymmetrically arranged in the first direction (X-direction) and the second direction (Y-direction). For example, the nanoposts NP in the second and third regions 162 and 163 corresponding respectively to the blue pixel and the red pixel may be arranged by the same distribution rule in the first direction (X-direction) and the second direction (Y-direction), and the nanoposts NP in the first and fourth regions 161 and 164 corresponding to the green pixel may be arranged by different distribution rules in the first direction (X-direction) and the second direction (Y-direction).

In the first region 161, the nanopost t5 adjacent to the nanopost t1 on the center in the first direction (X-direction) and the nanopost t9 adjacent to the nanopost t1 in the second direction (Y-direction) have different cross-sectional areas from each other. In the fourth region 164, the nanopost t8 adjacent to the nanopost t4 on the center in the first direction (X-direction) and the nanopost t12 adjacent to the nanopost t4 in the second direction (Y-direction) have different cross-sectional areas from each other. Also, the nanopost t5 adjacent to the nanopost t1 on the center of the first region 161 in the first direction (X-direction) and the nanopost t12 adjacent to the nanopost t4 on the center of the fourth region 164 in the second direction (Y-direction) have the same cross-sectional area, and the nanopost t9 adjacent to the nanopost t1 on the center of the first region 161 in the second direction (Y-direction) and the nanopost t8 adjacent to the nanopost t4 on the center of the fourth region 164 in the first direction (X-direction) have the same cross-sectional area. The nanoposts t13 adjacent to four corners of the first region 161 and the nanoposts t16 adjacent to four corners of the fourth region 164 have the same cross-sectional area. As described above, the first region 161 and the fourth region 164 are rotated by 90° angle with respect to each other.

In the second region 162, the nanopost t6 adjacent to the nanopost t2 on the center in the first direction (X-direction) and the nanopost t10 adjacent to the nanopost t2 in the second direction (Y-direction) have the same cross-sectional area. The nanoposts t14 adjacent to four corners of the second region 162 have the same cross-sectional area.

In the third region 163, the nanopost t7 adjacent to the nanopost t3 on the center in the first direction (X-direction) and the nanopost t11 adjacent to the nanopost t3 in the second direction (Y-direction) have the same cross-sectional area. The nanoposts t15 adjacent to four corners of the third region 163 have the same cross-sectional area.

Figure 17:
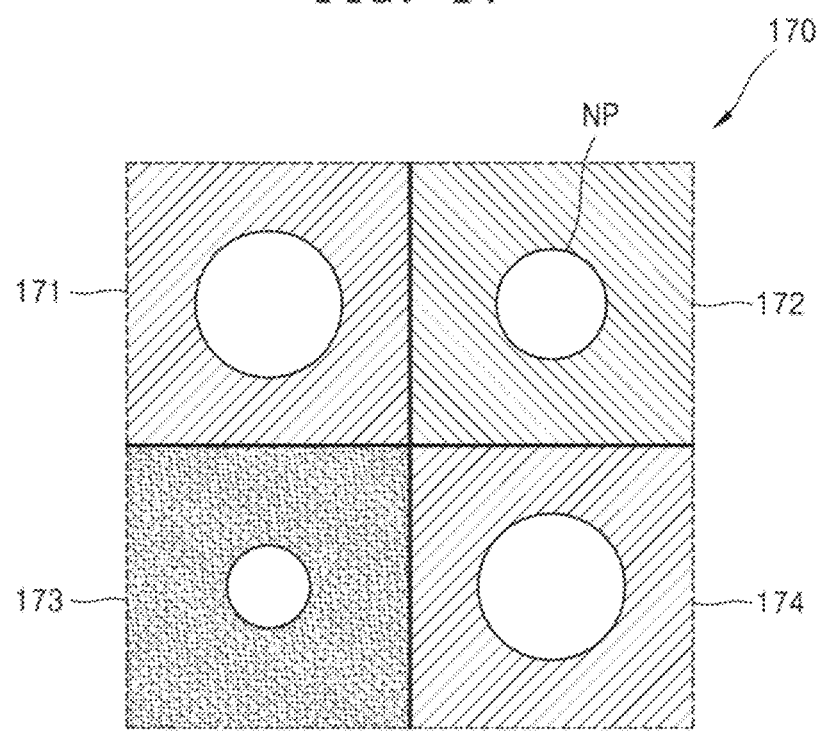
FIG. 17 is a plan view illustrating the arrangement form of a plurality of nanoposts included in a color separating lens array of an image sensor according to another example embodiment.

FIG. 17 is a plan view illustrating the arrangement form of a plurality of nanoposts included in a color separating lens array 170 according to another example embodiment.

The color separating lens array 170 in the image sensor according to the example embodiment may have the simplest structure. One nanopost NP is arranged in each of a first region 171 corresponding to a green pixel, a second region 172 corresponding to a blue pixel, a third region 173 corresponding to a red pixel, and a fourth region 174 corresponding to a green pixel, the nanoposts NP in the first and fourth regions 171 and 174 have a largest cross-sectional area, the nanopost NP in the second region 172 has a cross-sectional area that is smaller than that the cross-sectional area of the nanopost NP in the first region 171, and the nanopost NP in the third region 173 has a smallest cross-sectional area.

Figure 18:
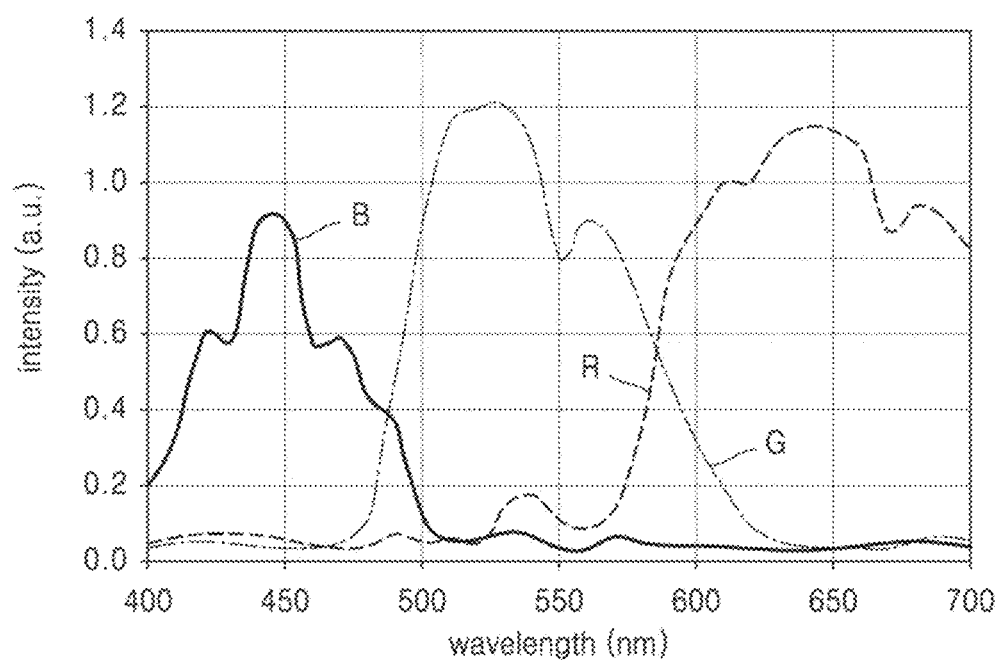
FIG. 18 is a graph exemplarily showing a spectrum distribution of light incident respectively on a red pixel, a green pixel, and a blue pixel in the image sensor including the color separating lens array of FIG. 17.

FIG. 18 is a graph exemplarily showing a spectrum distribution of light incident respectively to a red pixel R, a green pixel G, and a blue pixel B in the image sensor including the color separating lens array of FIG. 17.

Figure 19A:
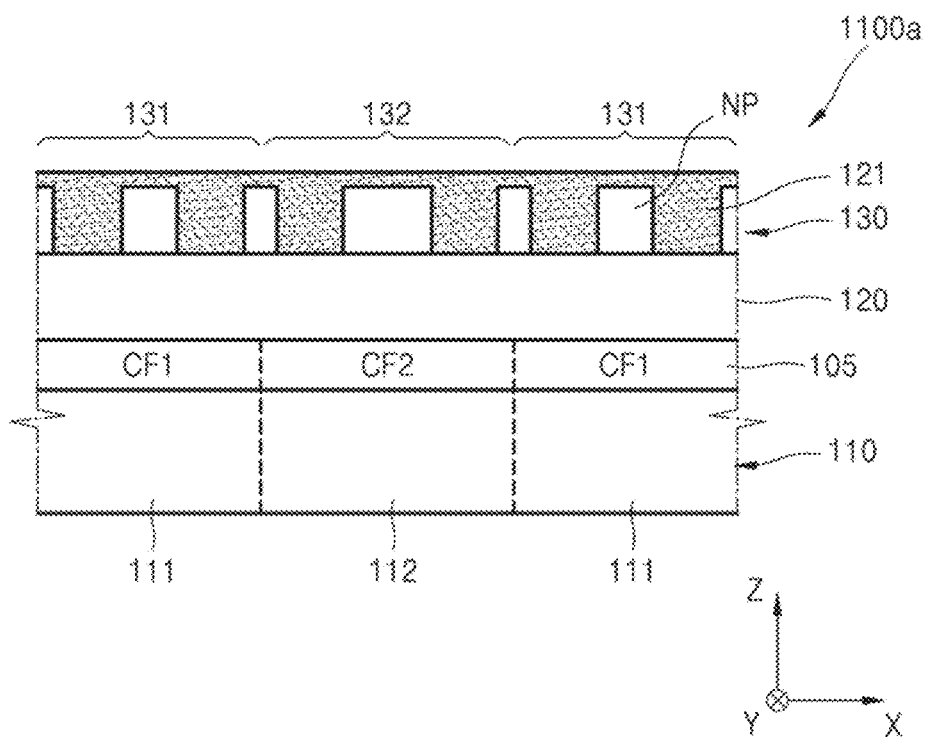
FIGS. 19A and 19B are cross-sectional views illustrating a schematic structure of a pixel array in an image sensor according to another example embodiment, viewed from different cross-sections.
Figure 19B:
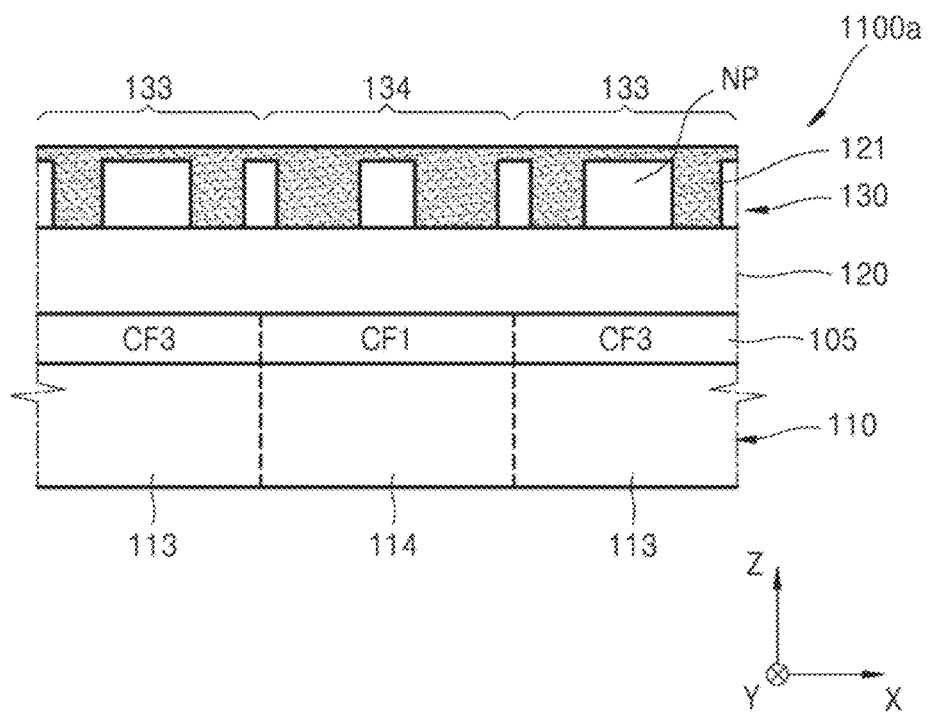

FIGS. 19A and 19B are cross-sectional views illustrating a schematic structure of a pixel array 1100a according to another example embodiment, when viewed from different cross-sections.

The pixel array 1100a is different from the example shown in FIGS. 4A and 4B in that a color filter 105 is further provided between the sensor substrate 110 and the color separating lens array 130. The color filter 105 may be arranged between the sensor substrate 110 and the spacer layer 120.

The pixel array 1100a may include a transparent dielectric layer 121 that may protect the color separating lens array 130. The dielectric layer 121 may be arranged to cover a space between adjacent nanoposts NP and upper surfaces of the nanoposts NP. The dielectric layer 121 may include a material having a lower refractive index than a refractive index of the nanoposts NP, e.g., the same material as that of the spacer layer 120.

The color filter 105 has a filter region having a shape corresponding to the pixel arrangement in the Bayer pattern. As shown in FIG. 19A, a green filter region CF1 and a blue filter region CF2 are alternately arranged, and as shown in FIG. 19B, in a next row in the Y-direction, a red filter region CF3 and the green filter region CF1 are alternately arranged. Because, in the color separating lens array 130, light having different wavelengths is branched into the plurality of photosensitive cells 111, 112, 113, and 114 and are condensed, the configuration of the color filter 105 may not be included in a pixel array when the color separating lens array sufficiently branches light having different wavelengths. However, the color filter 105 may be additionally provided such that color purity may be complemented. As light of which the colors are separated to a significant degree is incident to the color filter 105, light loss may not be large.

Figure 20:
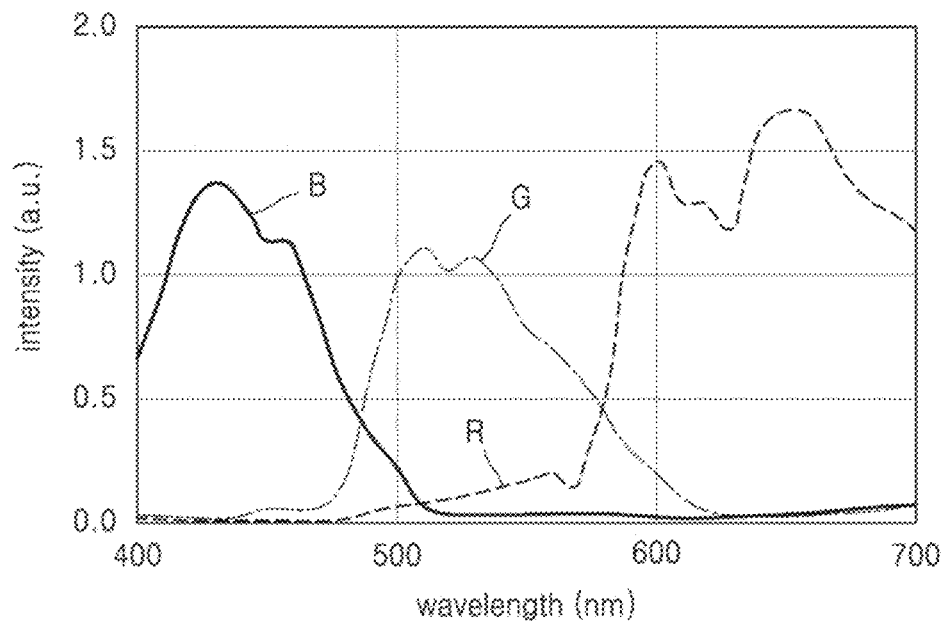
FIGS. 20 and 21 are graphs showing a spectrum distribution of light incident onto each of a red pixel, a green pixel, and a blue pixel of an image sensor according to an embodiment, which relate to a case where a color filter is provided and a case where no color filter is provided, respectively.
Figure 21:
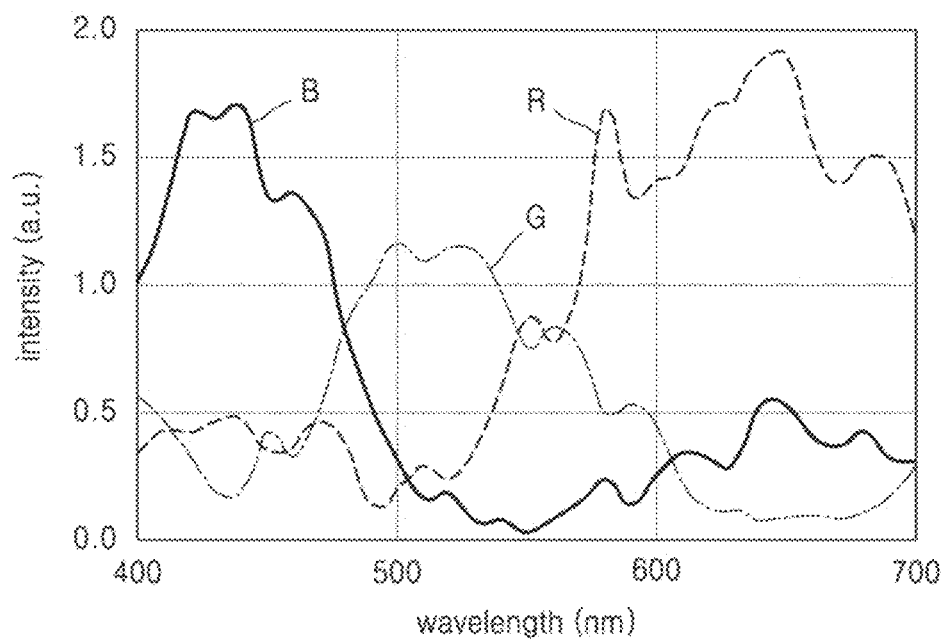

FIGS. 20 and 21 are graphs showing a spectrum distribution of light incident onto each of a red pixel R, a green pixel G, and a blue pixel B of the image sensor, which relate to the case where a color filter is provided and the case where no color filter is provided, respectively.

The graph of FIG. 20 shows a spectrum of the image sensor including the color filter shown in FIGS. 19A and 19B, and the graph of FIG. 21 shows a spectrum of the image sensor without a color filter shown in FIGS. 4A and 4B. FIGS. 20 and 21 show the simulation results of the image sensor, in which a width of a pixel is about 0.7 μm. When a color filter is provided, the entire amount of light is reduced, but the color separation performance is improved compared to the comparative example.

The image sensor including the color separating lens array according to the above example embodiments may be applied to various optical devices such as a camera. For example, FIG. 22 is a conceptual diagram of a camera 2000 according to an example embodiment.

Figure 22:
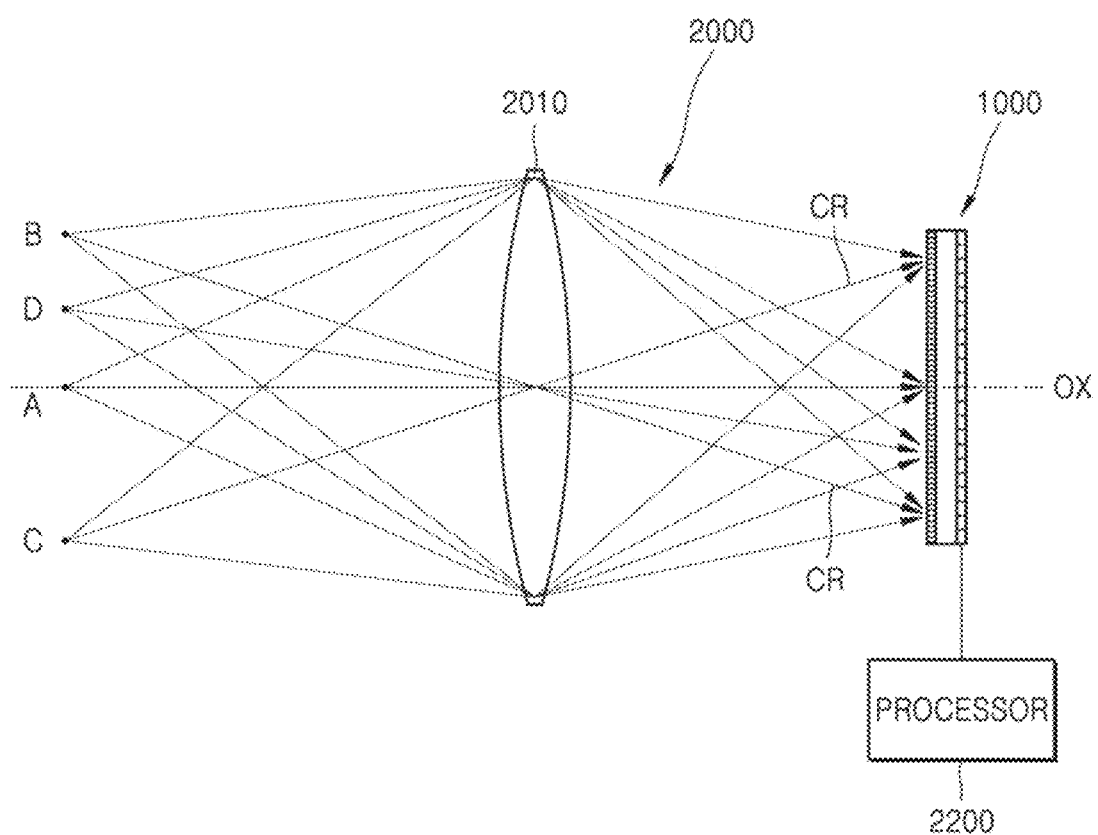
FIG. 22 is a conceptual diagram of a camera according to an example embodiment.

Referring to FIG. 22, the camera 2000 according to the example embodiment may include an objective lens 2010 configured to form an optical image by focusing light reflected from an object and an image sensor 1000 configured to convert the optical image formed by the objective lens 2010 to an electric image signal. The image sensor 1000 includes the color separating lens array described above. Also, the camera 2000 further includes a processor 2200 configured to process the electrical signal from the image sensor 1000 as an image signal. The processor 2200 forms an image by performing an operation such as a noise reduction, a color interpolation, etc. on a signal of each color output from the image sensor 1000. The camera 2000 may further include an infrared-ray (IR) cut-off filter between the image sensor 1000 and the objective lens 2010, a display panel for displaying the image formed by the processor 2200, and a memory for storing image data formed by the processor 2200. The camera 2000 may be built in a mobile electronic device, e.g., a mobile phone, a laptop computer, a tablet personal computer (PC), etc.

The objective lens 2010 focuses an image of an object on the image sensor 1000, wherein the object is located outside the camera 2000. When the image sensor 1000 is accurately located on a focal plane of the objective lens 2010, light starting from at a certain point of the object arrives at a certain point on the image sensor 1000 by passing through the objective lens 2010. For example, light starting from a certain point A on an optical axis OX passes through the objective lens 2010 and then arrives at a center of the image sensor 1000 on the optical axis OX. Also, light starting from any one of points B, C, and D located out of the optical axis OX travels across the optical axis OX by the objective lens 2010 and arrives at a point in a peripheral portion of the image sensor 1000. For example, in FIG. 22, light starting from the point B located above the optical axis OX arrives at a lower peripheral portion of image sensor 1000, crossing the optical axis OX, and light starting from the point C located under the optical axis OX arrives at an upper peripheral portion of the image sensor 1000, crossing the optical axis OX. Also, light starting from the point D located between the optical axis OX and the point B arrives at a position between the lower peripheral portion and the center of image sensor 1000.

Accordingly, the light starting from the different points A, B, C, and D is incident on the image sensor 1000 at different incidence angles according to distances between the points A, B, C, and D and the optical axis OX. An incidence angle of the light incident on the image sensor 1000 is typically defined to be a chief ray angle (CRA). A chief ray denotes a light ray starting from a point of the object and arriving at the image sensor 1000 by passing through a center of the objective lens 2010, and the CRA denotes an angle formed by the chief ray with respect to the optical axis OX. The CRA of the light starting from the point A on the optical axis OX is 0° and the light is perpendicularly incident on the image sensor 1000. The CRA increases as the starting point is away from the optical axis OX.

From the viewpoint of the image sensor 1000, the CRA of the light incident on the center portion of the image sensor 1000 is 0° and the CRA of the incident light gradually increases toward the edge of the image sensor 1000. For example, the CRA of the light starting from each of the points B and C and arriving at the outermost edge of the image sensor 1000 is the largest, whereas the CRA of the light starting from the point A and arriving at the center of the image sensor 1000 is 0°. Also, the CRA of the light starting from the point D and arriving at a position between the center and the edge of the image sensor 1000 is greater than 0° and less than the CRA of the light starting from each of the points B and C.

However, the color separating lens array described above may generally have a directivity. For example, the color separating lens array efficiently operates with respect to the light incident on the color separating lens array within a certain angle range, but when the incidence angle is away from the certain angle range, the color separation performance of the color separating lens array degrades. Accordingly, when the nanoposts of the color separating lens array have the same arrangement form in the entire area of the image sensor 1000, the color separation efficiency is not consistent throughout the entire area of the image sensor 1000 and may vary depending on regions in the image sensor 1000. Thus, the quality of the image provided by the camera 2000 may degrade.

Figure 23A:
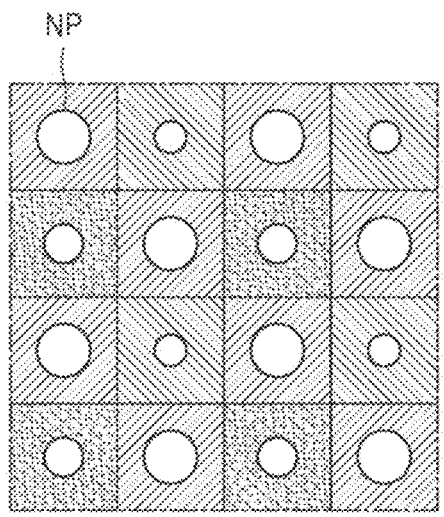
FIGS. 23A, 23B, and 23C are plan views showing a variation in an arrangement form of nanoposts in a color separating lens array, according to a location on an image sensor according to example embodiments.
Figure 23B:
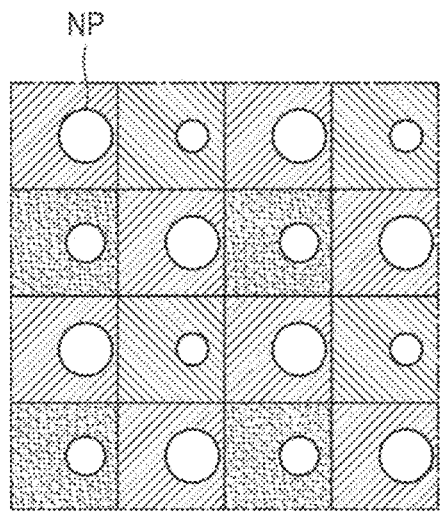
Figure 23C:
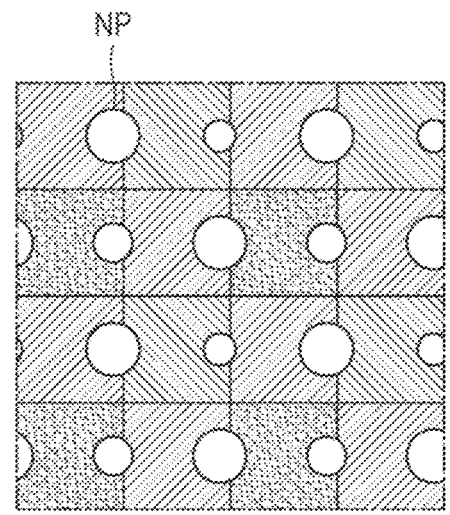

Therefore, the nanoposts of the color separating lens array may be designed to have different arrangement forms, taking into account the CRA of the incident light, which varies depending on the location on the image sensor 1000. FIGS. 23A to 23C are plan views showing a variation in an arrangement form of nanoposts in a color separating lens array, according to a location on an image sensor according to an example embodiment. In particular, FIG. 23A shows locations of the nanoposts NP each located at a center of the image sensor 1000, FIG. 23B shows locations of the nanoposts NP each arranged between the center and the edge of the image sensor 1000, and FIG. 23C shows locations of the nanoposts NP each located at the edge of the image sensor 1000. FIGS. 23A to 23C are not restrict the nanoposts NP to a certain arrangement, but are provided to conceptually describe relative variation in the locations of the nanoposts NP according to locations on the image sensor 1000.

As shown in FIGS. 23A to 23C, from the center toward the edge of the image sensor 1000, the first to fourth regions of the color separating lens array are shifted farther from corresponding pixels or photosensitive cells. For example, on the center of the image sensor 1000, on the center of the color separating lens array, or on the center of the sensor substrate, locations of the first to fourth regions of the color separating lens array may coincide with locations of the green pixel, the blue pixel, the red pixel, and the green pixel (or locations of corresponding photosensitive cells) corresponding to the first to fourth regions. In addition, locations of the first to fourth regions of the color separating lens array may be shifted further from the locations of the green pixel, the blue pixel, the red pixel, and the green pixel (or locations of corresponding photosensitive cells) corresponding to the first to fourth regions away from the center of the image sensor 1000, away from the center of the color separating lens array, or away from the center of the sensor substrate. Degree of shifting the first to fourth regions of the color separating lens array may be determined according to a CRA of the light incident to the color separating lens array. In particular, on a peripheral portion of the image sensor 1000, on a peripheral portion of the color separating lens array, or on a peripheral portion of the sensor substrate, the first to fourth regions of the color separating lens array are shifted towards the center direction of the image sensor 1000 with respect to the first to fourth photosensitive cells corresponding thereto.

Hereinafter, it will be expressed as a center portion of the image sensor 1000; however, because the image sensor 1000, the color separating lens array, and the sensor substrate face one another, the center portion of the image sensor 1000 may denote the center portion of the color separating lens array or the center portion of the sensor substrate. Likewise, the peripheral portion/edge of the image sensor 1000 may denote the peripheral portion/edge of the color separating lens array or the peripheral portion/edge of the sensor substrate.

Figure 24:
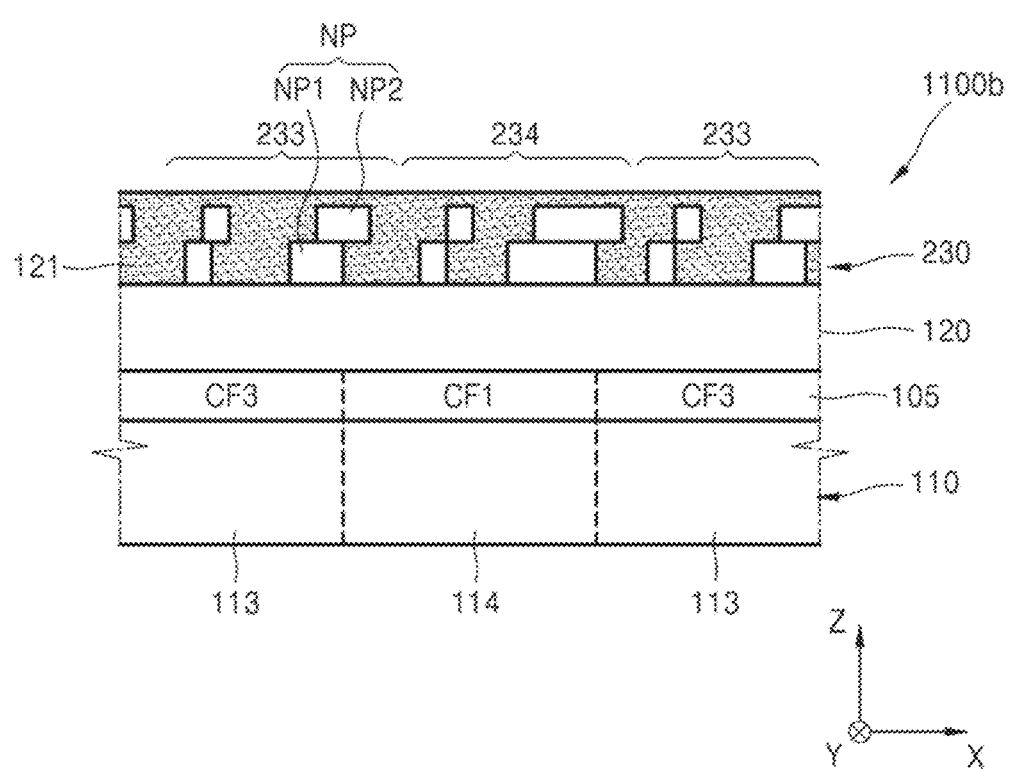
FIG. 24 is a cross-sectional view illustrating a schematic structure of a pixel array in an image sensor according to another example embodiment.

FIG. 24 is a cross-sectional view illustrating a schematic structure of a pixel array 1100*b* according to another example embodiment.

Referring to FIG. 24, the pixel array 1100*b* in the image sensor according to the example embodiment is different from the above-described example embodiments, in view of including a color separating lens array 230 including nanoposts NP stacked in dual stages. The nanoposts NP may include first nanoposts NP1 arranged on the spacer layer 120, and second nanoposts NP2 arranged on the first nanoposts NP1. The second nanoposts NP2 may be shifted with respect to the first nanoposts NP1 along an inclination direction of the light. For example, when the light incident on the color separating lens array 230 is slanted from the right to the left, the second nanoposts NP2 may be shifted to right side with respect to the first nanoposts NP1. When the light incident on the color separating lens array 230 is slanted from the left to the right, the second nanoposts NP2 may be shifted to the left side with respect to the first nanoposts NP1.

Also, considering the CRA of the light incident on the image sensor 1000 shown in FIG. 22, the second nanoposts NP2 may be shifted toward the center direction of the image sensor 1000 with respect to the first nanoposts NP1. For example, in a direction from the center portion to the left edge of the image sensor 1000, the second nanoposts NP2 may be more shifted to the right side with respect to the first nanoposts NP1, and in a direction from the center portion to the right edge of the image sensor 1000, the second nanoposts NP2 may be more shifted to the left side with respect to the first nanoposts NP1.

Likewise, third and fourth regions 233 and 234 of the color separating lens array 230 may be shifted toward the center direction of the image sensor 1000 with respect to the red pixel (or the third photosensitive cell) and the green pixel (or the fourth photosensitive cell) corresponding thereto. For example, in the direction from the center portion toward the left edge of the image sensor 1000, the third and fourth regions 233 and 234 of the color separating lens array 230 may be shifted further to the right side with respect to the green pixel and the red pixel corresponding thereto. The first and second regions on another cross-section of the color separating lens array 230 may also be shifted toward the center portion of the image sensor 1000 with respect to the green pixel (or the first photosensitive cell) and the blue pixel (or the second photosensitive cell) corresponding thereto.

In particular, the third and fourth regions 233 and 234 of the color separating lens array 230 may be shifted such that the red light and the green light are condensed on the center of the third photosensitive cell 113 and the center of the fourth photosensitive cell 114 corresponding thereto. A shifted distance s of the third region 233 and the fourth region 234 of the color separating lens array 230 may be determined by, for example, Equation 2 below.

$$s = d \times \tan(CRA') \qquad \text{[Equation 2]}$$

In Equation 2, d denotes a shortest distance or interval between a lower surface of the color separating lens array 230 and the upper surface of the sensor substrate 110, and CRA' denotes an incidence angle of the light incident on the sensor substrate 110. Also, CRA' may be determined by Equation 3 below.

$$CRA' = \sin^{-1}(\sin CRA \times n) \quad \text{[Equation 3]}$$

In Equation 3, CRA denotes an incidence angle of the light incident on the color separating lens array 230, and n denotes a refractive index of a material disposed between the color separating lens array 230 and the sensor substrate 110. Therefore, the shifted distance s of the third and fourth regions 233 and 234 of the color separating lens array 230 from the corresponding pixels may be determined by an incidence angle of the light incident on the color separating lens array 230, and the refractive index of the material arranged between the color separating lens array 230 and the sensor substrate 110. When the color filter 105, as well as the spacer layer 120, is arranged between the color separating lens array 230 and the sensor substrate 110, CRA' may be determined based on the incidence angle of the light incident on the spacer layer 120, the refractive index of the spacer layer 120, the incidence angle of the light incident on the color filter 105, and the refractive index of the color filter 105.

Figure 25:
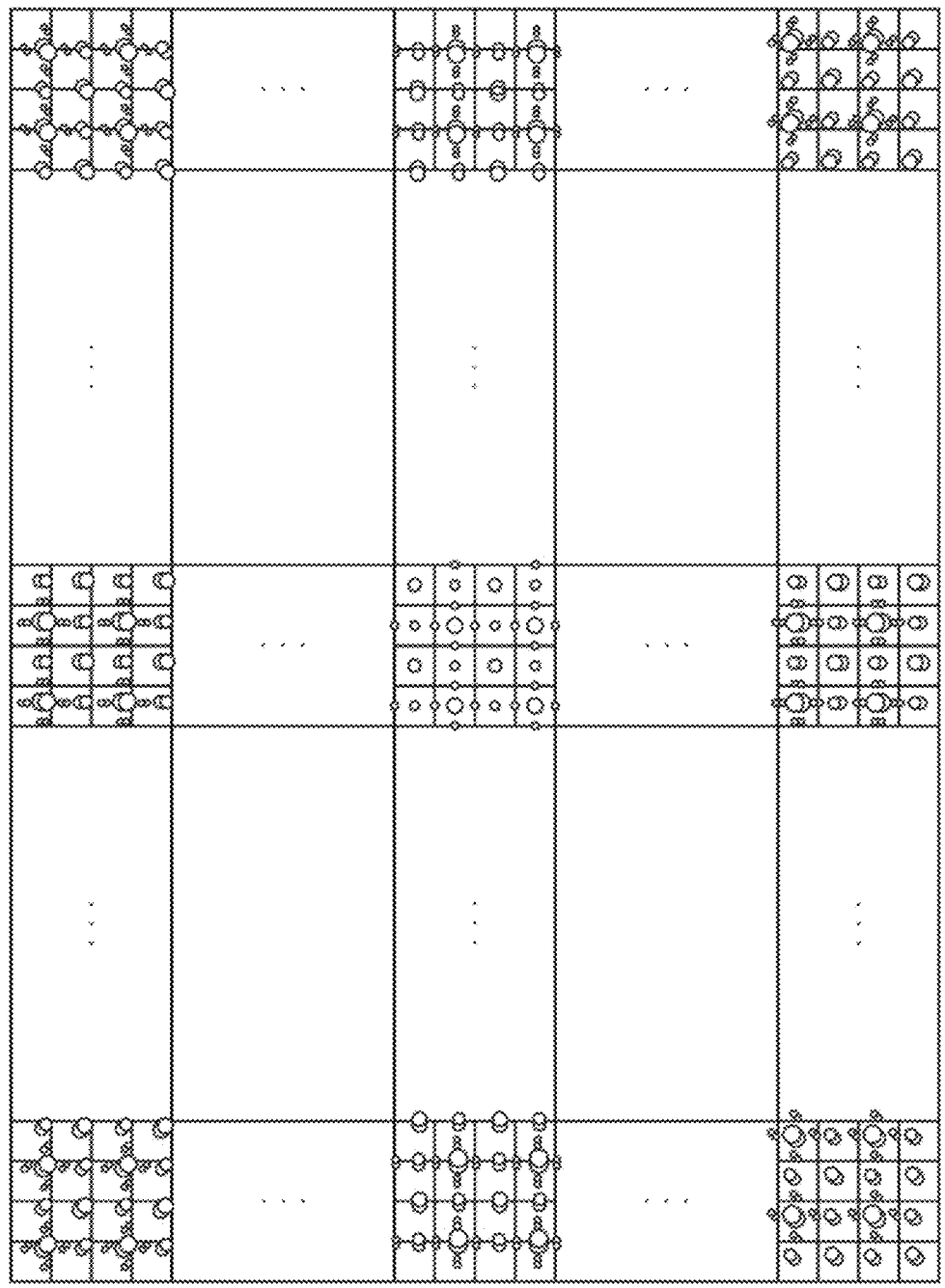
FIG. 25 is a plan view exemplarily showing a shift of nanoposts that are two-dimensionally arranged in a color separating lens array applied to an image sensor of the camera of FIG. 22.
Figure 26:
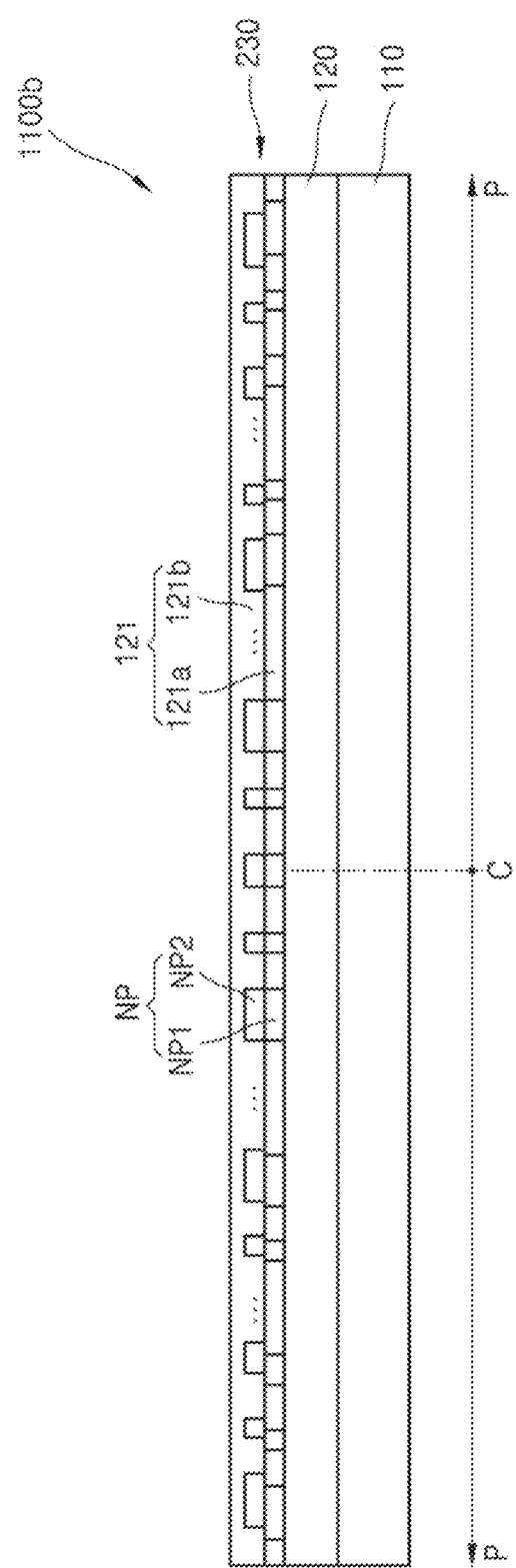
FIG. 26 is a cross-sectional view of a pixel array in an image sensor including the color separating lens array of FIG. 25.

FIG. 25 is a plan view exemplarily showing a shift of nanoposts that are two-dimensionally arranged in a color separating lens array applied to the image sensor 1000 of the camera of FIG. 22, and FIG. 26 is a cross-sectional view of a pixel array including the color separating lens array shown in FIG. 25.

Referring to FIGS. 25 and 26, on a center C of the image sensor 1000, first to fourth regions of the color separating lens array 230 are not shifted with respect to corresponding pixels (or photosensitive cells). Also, on the center C of the image sensor 1000, the second nanoposts NP2 are not shifted with respect to the first nanoposts NP1. In addition, in a peripheral portion P of the image sensor 1000, the first to fourth regions of the color separating lens array 230 are shifted toward the center C of the image sensor 1000, and the second nanoposts NP2 are shifted toward the center C of the image sensor 1000 with respect to the first nanoposts NP1. Therefore, in the image sensor 1000 employed in the camera 2000 of FIG. 22, an entire area of the color separating lens array 230 may be less than an entire area of the pixel array 1100b of the image sensor 1000 or an entire area of the sensor substrate 110.

According to the example embodiment of FIG. 24, the color filter 105 is arranged on the sensor substrate 110, but when the color separating lens array 230 may have a sufficient performance at the peripheral portion P of the image sensor 1000, the color filter 105 may be omitted as shown in FIG. 26.

Figure 27:
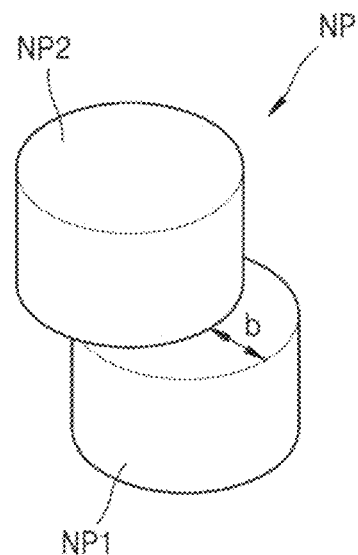
FIG. 27 is a perspective view illustrating an exemplary shape of nanoposts employed in a color separating lens array of the image sensor of FIG. 26.

FIG. 27 is a perspective view illustrating an exemplary shape of nanoposts employed in the color separating lens array of the image sensor of FIG. 26. As shown in FIG. 27, the first nanoposts NP1 of the lower portion and the second nanoposts NP2 of the upper portion may be stacked to be offset from each other. A deviation degree is indicated by b in FIG. 27, and the deviation degree may be increased from the center C to the peripheral portion P of the image sensor 1000, that is, in a radial direction as a distance from the center C increases. A direction in which the second nanoposts NP2 deviate from the first nanoposts NP1, is a direction from the peripheral portion P to the center C. In particular, the deviation degree b may be determined such that the light is incident on a center of an upper surface of the second nanopost NP2 and on a center of an upper surface of the first nanopost NP1.

In order to manufacture the nanoposts NP having the above configuration, as shown in FIG. 26, the dielectric layer 121 may include a first dielectric layer 121a that is arranged on the spacer layer 120 to fill spaces among the first nanoposts NP1 and support the second nanoposts NP2, and a second dielectric layer 121b covering the second nanoposts NP2. The first and second dielectric layers 121a and 121b may include a material having a lower refractive index than a refractive index of the material included in the first and second nanoposts NP1 and NP2.

A structure in which the nanoposts NP are stacked in two layers is shown, but embodiments are not limited thereto, for example, a structure having three or more layers may be used. For example, FIG. 28 is a cross-sectional view showing a structure of a pixel array 1100c according to another example embodiment.

Figure 28:
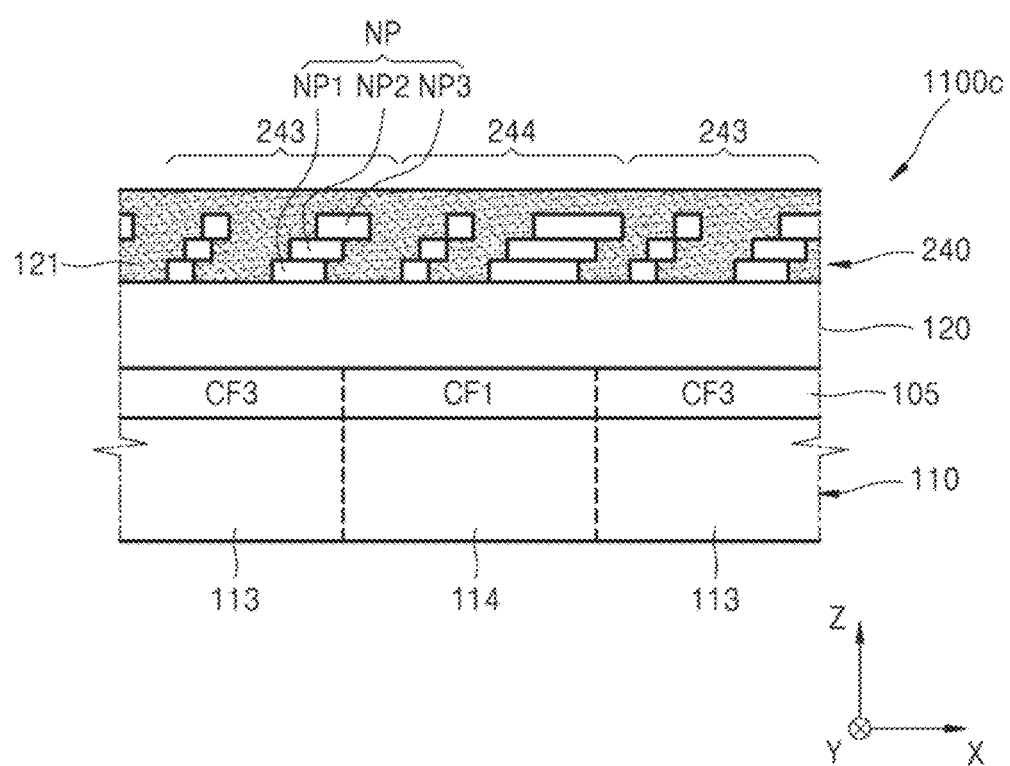
FIG. 28 is a cross-sectional view illustrating a schematic structure of a pixel array in an image sensor according to another example embodiment.

Referring to FIG. 28, the pixel array 1100c of the image sensor includes a color separating lens array 240 having nanoposts NP stacked in three layers. The nanoposts NP may include first nanoposts NP1 arranged on the spacer layer 120, second nanoposts NP2 arranged on the first nanoposts NP1, and third nanoposts NP3 arranged on the second nanoposts NP2. The second nanoposts NP2 are shifted toward the center of the image sensor with respect to the first nanoposts NP1, and the third nanoposts NP3 are shifted toward the center of the image sensor with respect to the second nanoposts NP2.

Also, a fourth region 244 of the color separating lens array 240 is shifted toward the center of the image sensor with respect to a green pixel or a fourth photosensitive cell 114 corresponding thereto, and a third region 243 is shifted toward the center of the image sensor with respect to a red pixel or a third photosensitive cell 113 corresponding thereto.

Figure 29A:
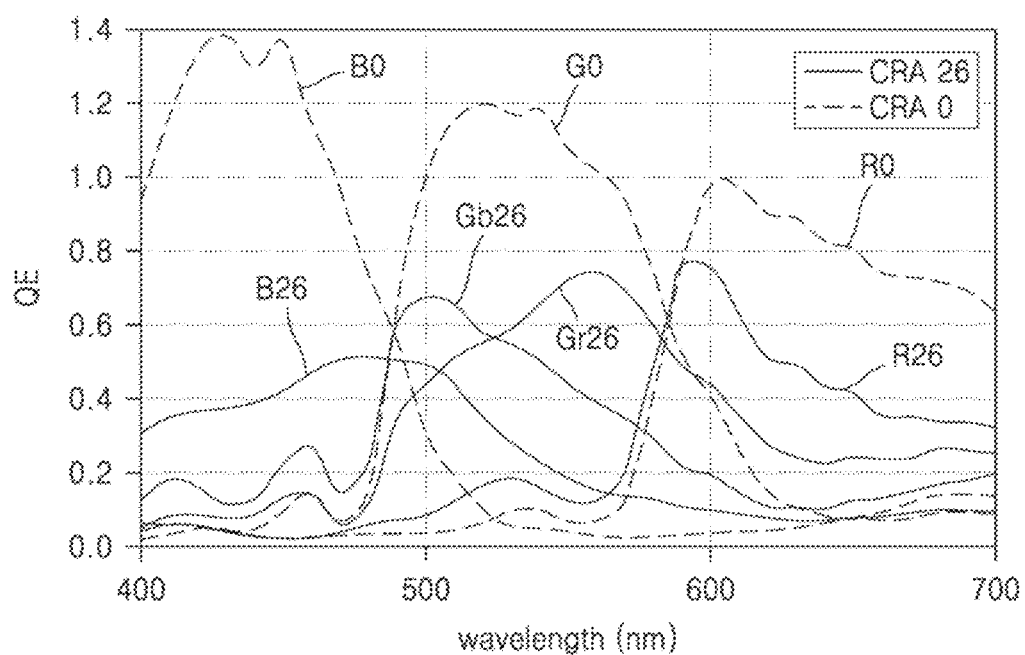
FIGS. 29A, 29B, and 29C are graphs exemplarily showing spectrum distributions of light incident respectively on a red pixel, a green pixel, and a blue pixel in an image sensor according to an example embodiment, and respectively relate to a case in which a variation in a chief ray angle according to a location on the image sensor is not considered, a case in which locations of nanoposts are changed taking into account the variation in the chief ray angle, and a case in which nanoposts are configured in double stages in consideration of the variation in the chief ray angle.
Figure 29B:
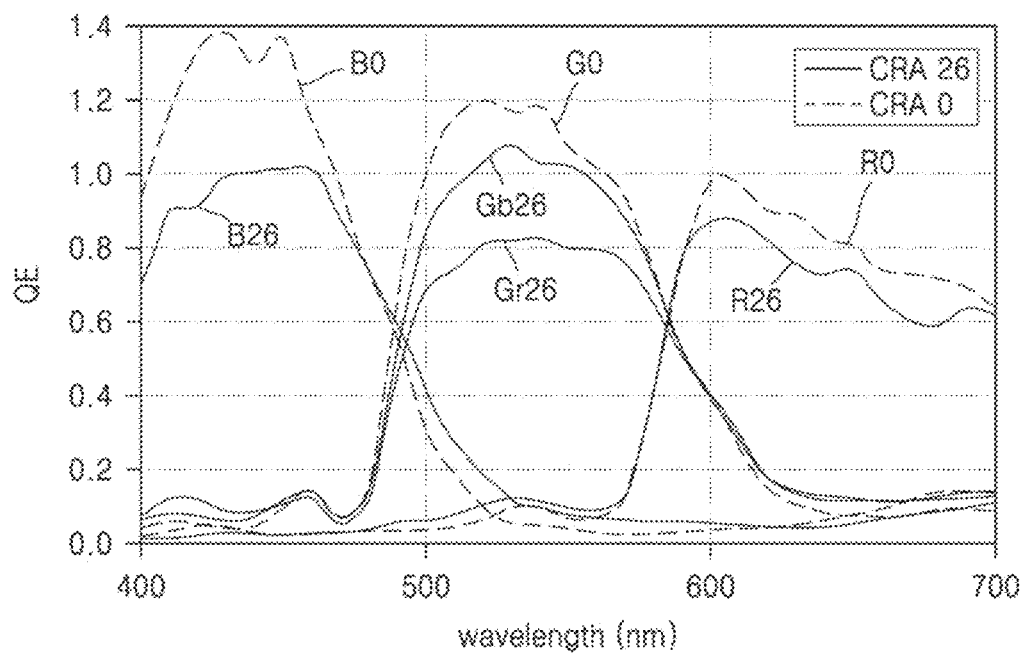
Figure 29C:
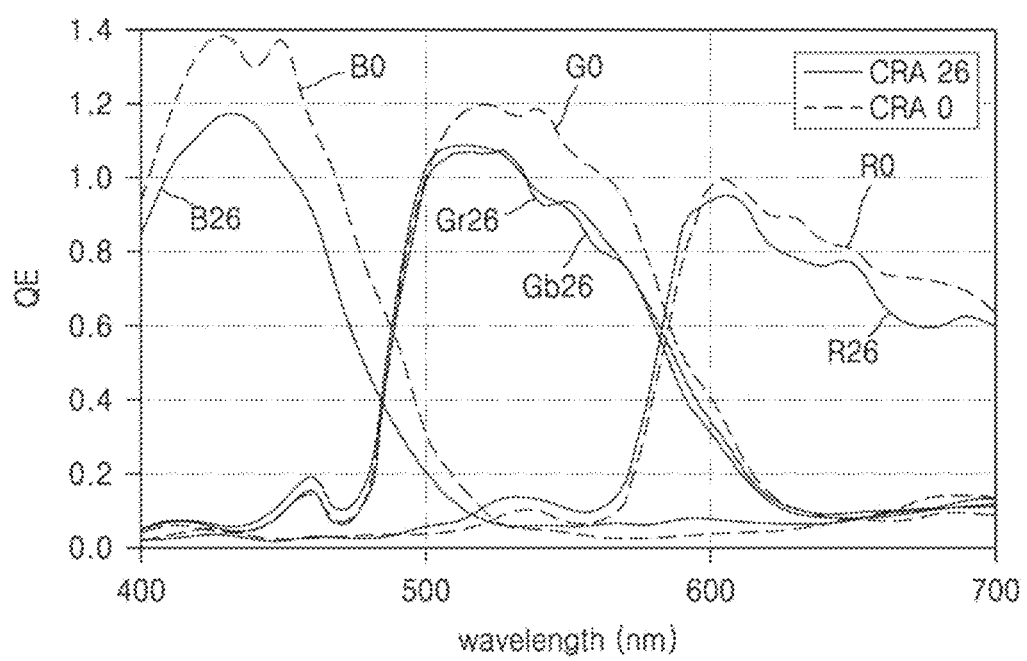

FIGS. 29A to 29C are graphs exemplarily showing spectrum distribution of light incident respectively on a red pixel, a green pixel, and a blue pixel in an image sensor according to an example embodiment, and respectively relate to a case in which a variation in a CRA according to a location on the image sensor is not considered, a case in which locations of nanoposts are changed taking into account the variation in the CRA, and a case in which nanoposts are configured in a double stages in consideration of the variation in the CRA. In FIGS. 29A to 29C, a graph denoted as B0 shows a spectrum distribution of the light incident on the blue pixel when the CRA is 0°, a graph denoted as G0 shows a spectrum distribution of the light incident on the green pixel when the CRA is 0°, and a graph denoted as R0 shows a spectrum distribution of the light incident on the red pixel when the CRA is 0°. In addition, a graph denoted as B26 shows a spectrum distribution of the light incident on the blue pixel when the CRA is 26°, a graph denoted as Gb26 shows a spectrum distribution of the light incident on the green pixel that is arranged alternately with the blue pixel in the first direction when the CRA is 26°, a graph denoted as Gr26 shows a spectrum distribution of the light incident on the green pixel that is arranged alternately with the red pixel in the first direction when the CRA is 26°, and a graph denoted as R26 shows a spectrum distribution of the light incident on the red pixel when the CRA is 26°.

As shown in the graphs of FIG. 29A, when the variation in the CRA is not considered, the performance of the color separating lens array with respect to the light having the CRA of 26° degrades. In addition, as shown in the graphs of FIG. 29B, when the nanoposts are shifted based on the variation in the CRA, the performance of the color separating lens array with respect to the light having the CRA of 26° has improved. Also, as shown in the graphs of FIG. 29C, when the nanoposts are arranged in two stages with the shift of the nanoposts, the performance of the color separating lens array with respect to the light having the CRA of 26° has further improved nearly to the performance of the color separating lens array with respect to the light having the CRA of 0°.

Figure 30A:
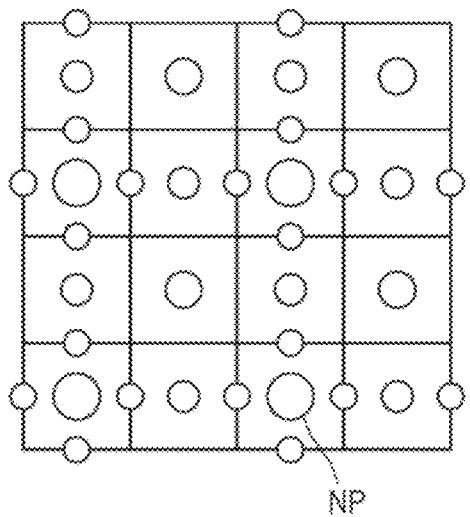
FIGS. 30A and 30B are plan views showing a variation in a line width of a nanopost according to a location on an image sensor according to another example embodiment.
Figure 30B:
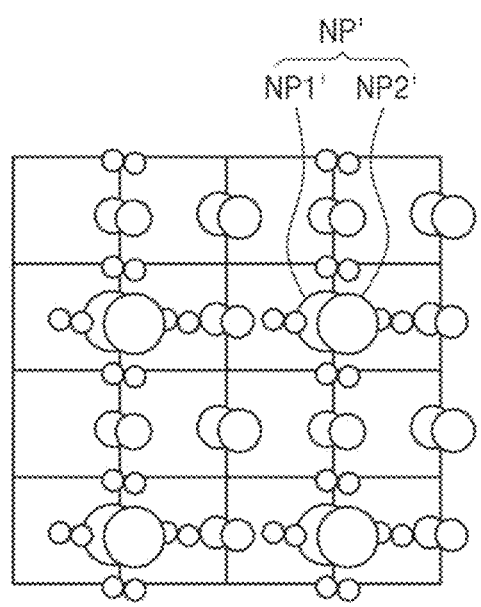

FIGS. 30A and 30B are plan views showing a variation in a line width of a nanopost NP according to a location on an image sensor according to another example embodiment. FIG. 30A shows line widths of the nanoposts NP of the color separating lens array on the center of the image sensor, and FIG. 30B exemplarily shows line widths of nanoposts NP' of the color separating lens array on the peripheral portion of the image sensor. In the example embodiment illustrated in FIG. 30B, the nanoposts are shifted with respect to corresponding pixels and second nanoposts NP2' are shifted with respect to first nanoposts NP1', and moreover, the line widths of the nanoposts NP' are changed. A variation in the line width of the nanopost NP' may be determined by Equation 4 below according to the CRA.

$$w \sim w_0 \cdot (1 + \sin CRA/10) \qquad \text{[Equation 4]}$$

In Equation 4 above, w denotes a line width of the nanopost NP' on the peripheral portion of the image sensor, and $w_0$ denotes a line width of the nanopost NP on the center of the image sensor. Therefore, the line width of the nanopost NP' may increase toward the peripheral portion of the image sensor. FIG. 30B exaggerates the increase in the line width of the nanopost NP' for convenience of description. The line width of the nanopost NP' at the edge of the image sensor may be increased by about 2.5% to about 6.5% as compared with the line width on the center of the image sensor.

Here, the variation in the line width is obtained by comparing the line widths of the nanoposts arranged at the same location in the same region from among the first to fourth regions of the color separating lens array. For example, the line width of the nanopost arranged on the center of the first region of the color separating lens array in the center of the image sensor may be compared with the line width of the nanopost arranged on the center of the first region of the color separating lens array in the peripheral portion of the image sensor. The nanoposts arranged on different regions of the color separating lens array or the nanoposts arranged at different locations in the same region are not compared with each other.

Figure 31:
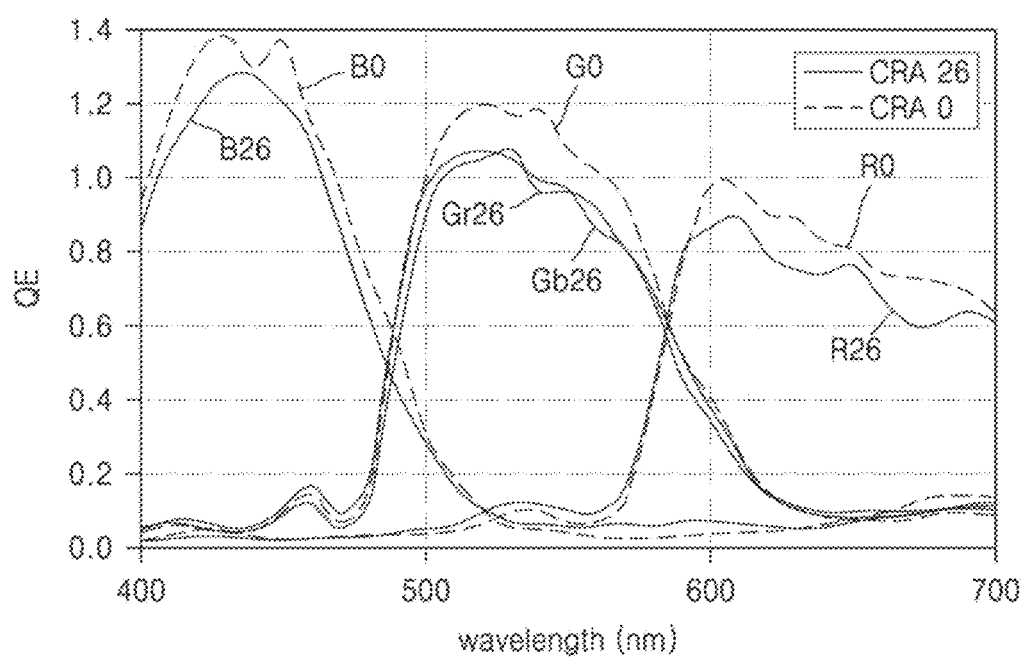
FIG. 31 is a graph exemplarily showing a spectrum distribution of light incident respectively on a red pixel, a green pixel, and a blue pixel in the image sensor of FIG. 30.

FIG. 31 is a graph exemplarily showing a spectrum distribution of light incident respectively to a red pixel, a green pixel, and a blue pixel in the image sensor of FIG. 30. When the graph of FIG. 31 is compared with the graph of FIG. 29C, when the line width of the nanopost is further changed with shifting of the nanoposts and two-stage configuration of the nanoposts, the performance of the color separating lens array with respect to the light having the CRA of 26° is further improved.

Figure 32:
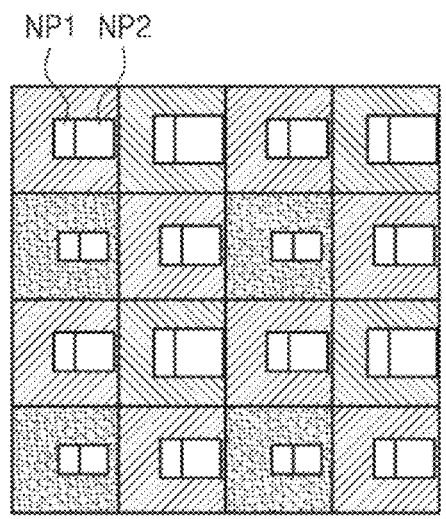
FIGS. 32 and 33 are plan views showing various shapes of nanoposts employed in a color separating lens array according to another example embodiment.
Figure 33:
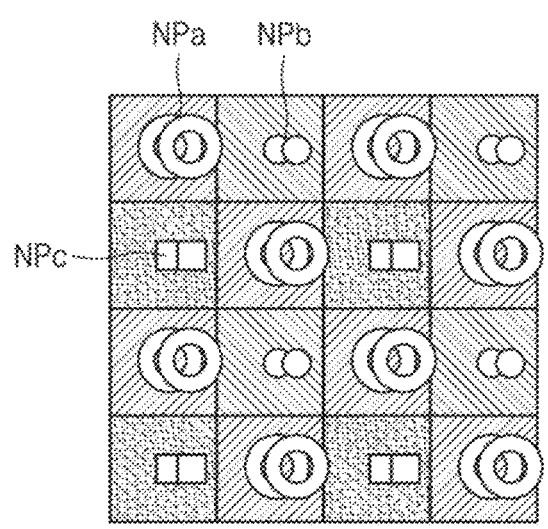

FIGS. 32 and 33 are plan views showing various shapes of nanoposts employed in a color separating lens array according to another example embodiment. As shown in FIGS. 32 and 33, the nanoposts having various shapes may be arranged after being shifted. For example, as shown in FIG. 32, nanoposts NP1 and NP2 that have rectangular cross-sections and are stacked in two stages may be shifted from each other. Also, as shown in FIG. 33, ring-type nanoposts NPa stacked in two stages, circular nanoposts NPb stacked in two stages, and rectangular nanoposts NPc stacked in two stages may be shifted from each other in each of the regions of the color separating lens array.

Figure 34:
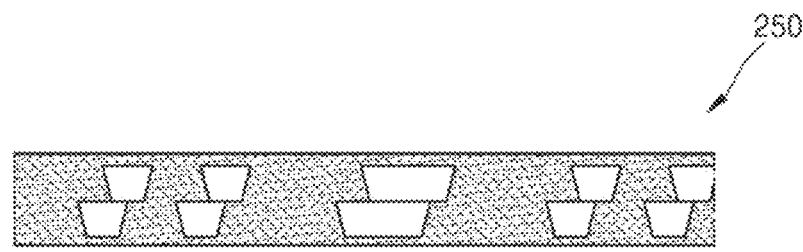
FIGS. 34 and 35 are cross-sectional views showing various cross-sectional shapes of nanoposts employed in a color separating lens array according to another example embodiment.
Figure 35:
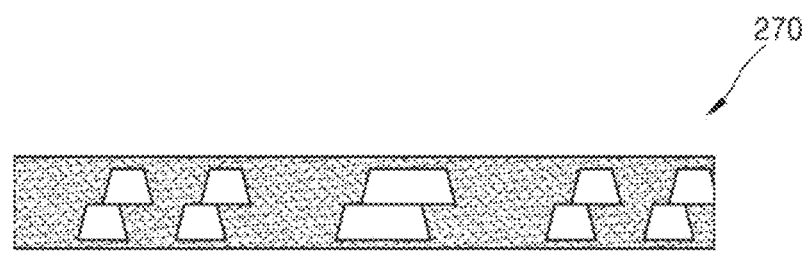

FIGS. 34 and 35 are cross-sectional views showing various cross-sectional shapes of nanoposts employed in a color separating lens array according to another example embodiment. As shown in FIGS. 34 and 35, side surfaces of the nanoposts may be formed as inclined surfaces. For example, in a color separating lens array 250 shown in FIG. 34, the side surfaces of the nanoposts are inclined such that the cross-sectional area of the nanopost may increase from lower portion to the upper portion. Therefore, the nanoposts in the color separating lens array 250 may have a cross-section of a trapezoidal shape, of which an upper surface is greater than a lower surface. For example, in a color separating lens array 260 shown in FIG. 35, the side surfaces of the nanoposts are inclined such that the cross-sectional area of the nanopost may decrease from lower portion to the upper portion. Therefore, the nanoposts in the color separating lens array 260 may have a cross-section of a trapezoidal shape, of which a lower surface is greater than an upper surface.

Inclinations of the inclined surfaces of the nanoposts that are arranged in the first to fourth regions of the color separating lens array 250 or 260 may be different from one another. In addition, the inclinations of the inclined surfaces in the nanoposts located to correspond to the center of the image sensor may be different from those of the inclined surfaces of the nanoposts located to correspond to the peripheral portion of the image sensor.

Figure 36:
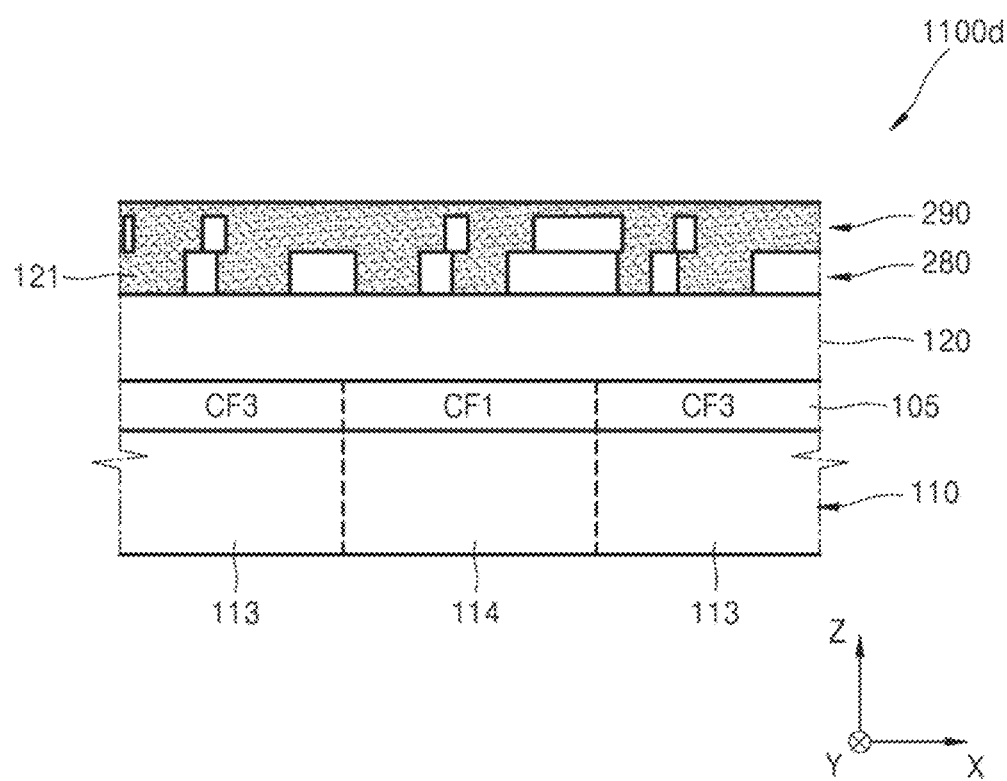
FIG. 36 is a cross-sectional view illustrating a schematic structure of a pixel array in an image sensor according to another example embodiment.

FIG. 36 is a cross-sectional view illustrating a schematic structure of a pixel array 1100d according to another example embodiment.

Referring to FIG. 36, the pixel array 1100d of the image sensor may include a first color separating lens array 280 and a second color separating lens array 290 having a plurality of nanoposts that are differently arranged. The second color separating lens array 290 may be arranged on the first color separating lens array 280. The nanoposts of the second color separating lens array 290 are not shifted from the nanoposts of the first color separating lens array 280, and the arrangement form of the nanoposts of the second color separating lens array 290 may be different from that of the nanoposts of the first color separating lens array 280.

The arrangement of the plurality of nanoposts in the first color separating lens array 280 and the arrangement of the plurality of nanoposts in the second color separating lens array 290 may be determined in consideration of the CRA of the light incident on the image sensor. For example, the arrangement of the plurality of nanoposts in the first color separating lens array 280 and the second color separating lens array 290 may be designed such that the light that is incident on the sensor substrate 110 after continuously passing through the second color separating lens array 290 and the first color separating lens array 280 may be more efficiently separated and condensed without regard to the incidence angle.

As described above, the color separation efficiency may be improved by using the color separating lens array in which the nanoposts of sub-wavelengths are arranged by a predetermined rule, and the image sensor employing the color separating lens array may have an improved performance. A detailed shape is just an example, and a variety of modifications and combinations are possible. For example, the wavelength band of visible rays is illustrated. However, embodiments are not limited thereto, and separation of different wavelength bands is possible according to the arrangement rule of the nanoposts. Also, the number of nanoposts provided in each of the plurality of regions of the color separating lens array may be variously modified. The pixel arrangement in the image sensor is described as the Bayer pattern as an example, but embodiments are not limited to the above example. For example, the red pixel, the green pixel, and the blue pixel may be repeatedly arranged in the stated order in one direction, or the CYGM-type arrangement shown in FIG. 2B or the RGBW-type arrangement shown in FIG. 2C may be also used. Also, one or more example embodiments may be applied to a pixel arrangement pattern, in which a plurality of unit pixels each including pixels of two or more colors are repeatedly arranged. The color separating lens array may adopt region division suitable for this pixel arrangement and may select a nanopost arrangement rule according to regions.

It is described above that the color separating lens array is configured by arranging the nanoposts formed in a definable shape, but the color separating lens array may be configured as a free pattern of various shapes that may not be defined. For example, FIG. 37 is a conceptual diagram showing a structure and operations of a color separating lens array 330 according to another example embodiment.

Figure 37:
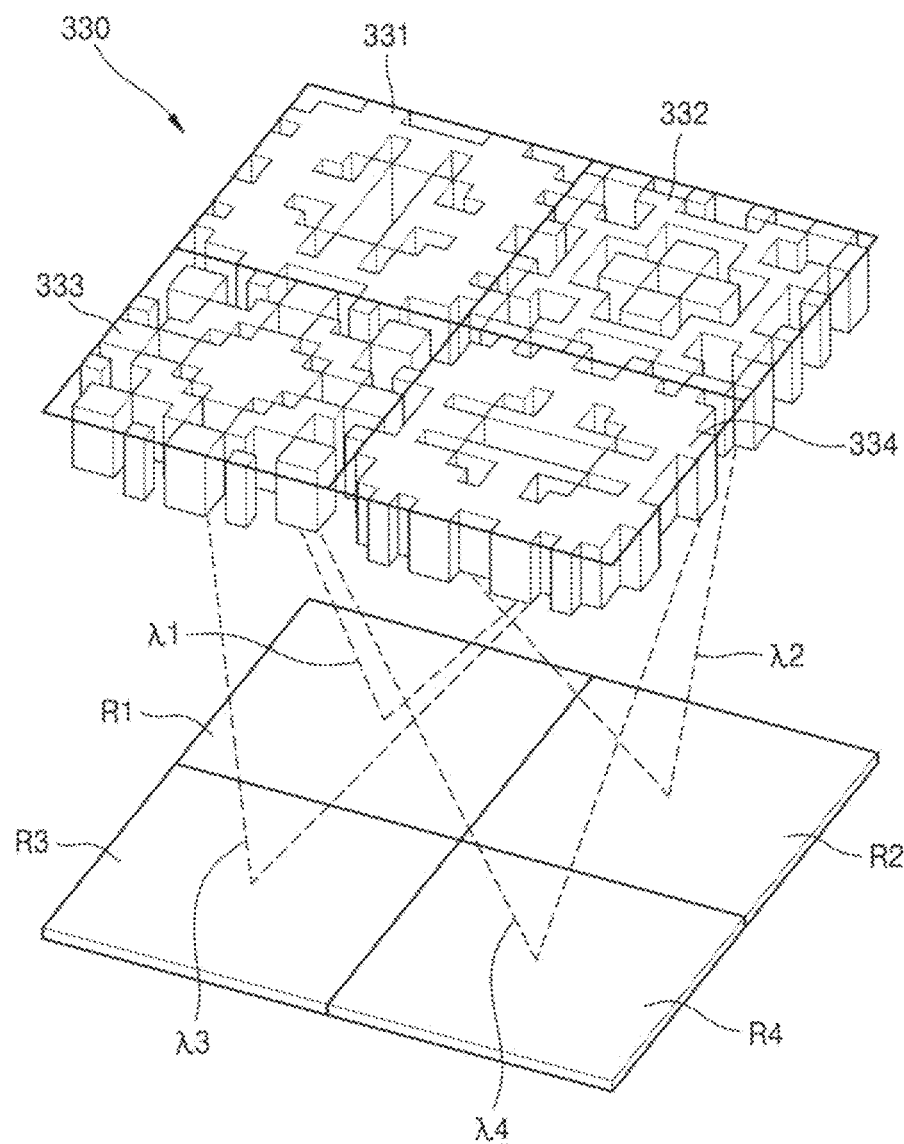
FIG. 37 is a conceptual diagram showing a structure and operations of a color separating lens array according to another example embodiment.

Referring to FIG. 37, a unit pattern array of the color separating lens array 330 may include first to fourth regions 331, 332, 333, and 334 each including first to fourth fine structures that are distinguished from one another. For example, the first region 331 may have a first pattern, the second region 332 may have a second pattern different from the first pattern, the third region 333 may have a third pattern different from the first and second patterns, and the fourth region 334 may have a fourth pattern different from the first to third patterns.

The first to fourth regions 331, 332, 333, and 334 may be arranged on a same plane in the form of, for example, 2×2 arrangement. Therefore, the first and second regions 331 and 332 may be adjacent to each other in the first direction, and the third and fourth regions 333 and 334 may be adjacent to each other in the first direction. In addition, the first and third regions 331 and 333 are adjacent to each other in the second direction that is perpendicular to the first direction, and the second and fourth regions 332 and 334 are adjacent to each other in the second direction. The first and fourth regions 331 and 334 are arranged in a diagonal direction, and the second and third regions 332 and 333 are arranged in another diagonal direction.

According to the example embodiment, the first to fourth patterns may be determined such that, among the incident light incident on the color separating lens array 330, light of a first wavelength $\lambda 1$ is condensed on a first target region R1 facing the first region 331 in a vertical direction, light of a second wavelength $\lambda 2$ is condensed on a second target region R2 facing the second region 332 in the vertical direction, light of a third wavelength $\lambda 3$ is condensed on a third target region R3 facing the third region 333 in the vertical direction, and fourth wavelength light $\lambda 4$ is condensed on a fourth target region R4 facing the fourth region 334 in the vertical direction. The first to fourth patterns in the first to fourth regions 331, 332, 333, and 334 may be variously designed according to the pixel arrangement and color characteristics of the image sensor to which the color separating lens array 330 is applied.

For example, when the color separating lens array 330 is applied to the image sensor of the Bayer pattern type shown in FIG. 2A, the first and fourth regions 331 and 334 face the green pixel G, the second region 332 faces the blue pixel B, and the third region 333 faces the red pixel R. In addition, the light of a first wavelength $\lambda 1$ and the fourth wavelength light $\lambda 4$ may be green light, the light of a second wavelength $\lambda 2$ may be blue light, and the light of a third wavelength $\lambda 3$ may be red light.

Figure 38:
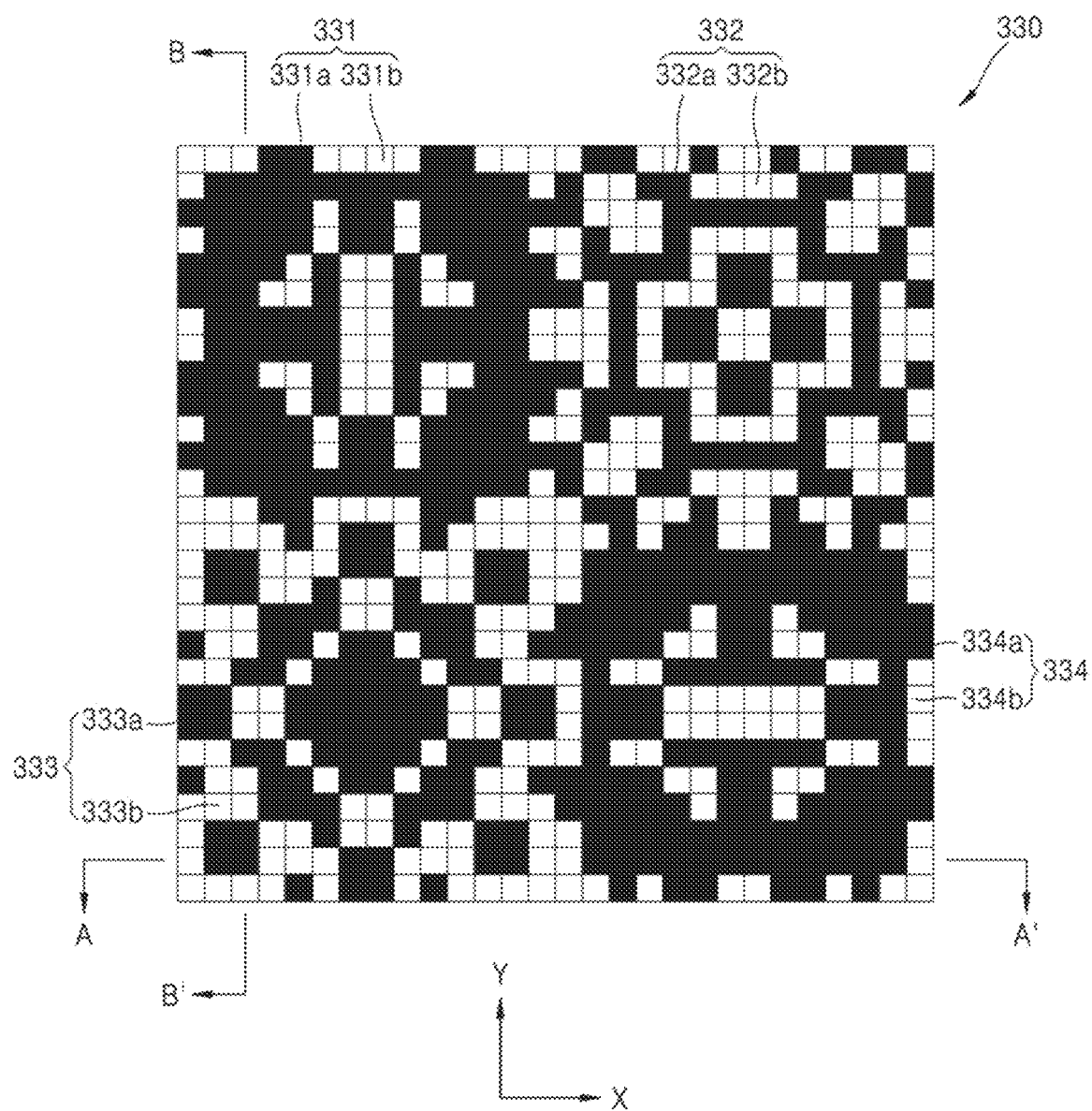
FIG. 38 is a plan view showing an example of a unit pattern array of a color separating lens array that may be applied to an image sensor of a Bayer pattern type according to an example embodiment.

FIG. 38 is a plan view showing an example of a unit pattern array of a color separating lens array that may be applied to an image sensor of a Bayer pattern type. Referring to FIG. 38, the first region 331 facing the green pixel G includes a first dielectric 331a forming the first pattern and a second dielectric 331b filling spaces in the first dielectric 331a. The second region 332 facing the blue pixel B includes a first dielectric 332a forming the second pattern and a second dielectric 332b filling spaces in the first dielectric 332a, the third region 333 facing the red pixel R includes a first dielectric 333a forming the third pattern and a second dielectric 333b filling spaces in the first dielectric 333a, and the fourth region 334 facing the green pixel G includes a first dielectric 334a forming the fourth pattern and a second dielectric 334b filling spaces in the first dielectric 334a.

Both the first region 331 and the fourth region 334 may have the same shape because they both face the green pixel, but rotating directions thereof may be different from each other. For example, as shown in FIG. 38, the pattern of the fourth region 334 may be obtained by rotating the pattern of the first region 331 by 90°. The above difference may be determined according to arrangement of adjacent pixels. In the case of FIG. 38, the blue pixels B are arranged on left and right sides of the green pixel G facing the first region 331, and the red pixels R are arranged on left and right sides of the green pixel G facing the fourth region 334. Thus, the patterns having the same shape and rotating in different directions may be obtained due to the difference.

The first dielectrics 331a, 332a, 333a, and 334a may include the same material, and the second dielectrics 331b 332b, 333b, and 334b may include the same material. For example, the first dielectrics 331a, 332a, 333a, and 334a may include a dielectric material having a high refractive index and a low absorption rate at the visible ray band, e.g., titanium oxide ($TiO_2$), gallium nitride (GaN), silicon nitride ($SiN_3$), zinc sulfide (ZnS), zinc selenide (ZnSe), silicon nitride ($Si_3N_4$), etc., and the second dielectrics 331b, 332b, 333b, and 334b may include a dielectric material having a low refractive index and a low absorption rate at the visible ray band, e.g., air, silicon oxide ($SiO_2$), siloxane-based spin on glass (SOG), etc. When the second dielectrics 331b, 332b, 333b, and 334b include air, the color separating lens array 330 shown in FIG. 38 may be simply obtained by etching the first dielectrics 331a, 332a, 333a, and 334a.

Figure 39:
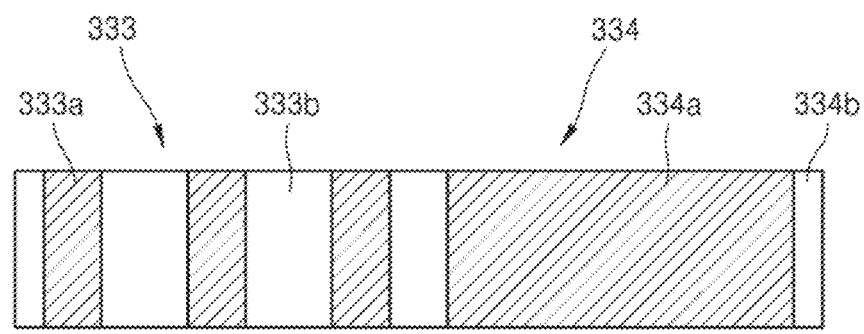
FIG. 39 is a cross-sectional view of the unit pattern array of FIG. 38 taken along line A-A'.
Figure 40:
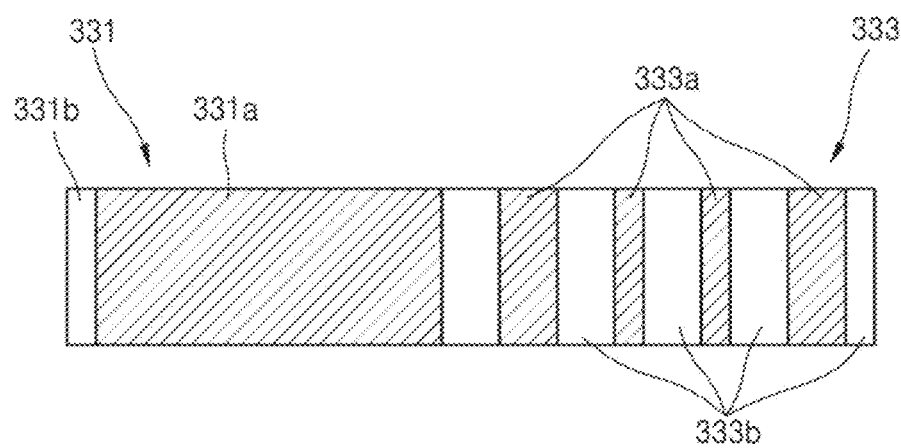
FIG. 40 is a cross-sectional view of the unit pattern array of FIG. 38 taken along line B-B'.

FIG. 39 is a cross-sectional view of the unit pattern array of FIG. 38 taken along line A-A' (X-direction), and FIG. 40 is a cross-sectional view of the unit pattern array of FIG. 38 taken along line B-B' (Y-direction).

Referring to FIGS. 39 and 40, the first dielectrics 331a, 332a, 333a, and 334a and the second dielectrics 331b, 332b, 333b, and 334b may extend in parallel with each other in the vertical direction. The vertical sections shown in FIGS. 39 and 40 are exemplary, and the shape of the vertical sections of the first to fourth regions 331, 332, 333, and 334 may vary depending on locations of line A-A' and line B-B'. For example, since line A-A' moves in the Y-direction, the shape of the vertical section shown in FIG. 39 changed, and since line B-B' moves in the X-direction, the shape of the vertical section shown in FIG. 40 changes. Regardless of the change in the shape of the vertical section, the first dielectrics 331*a*, 332*a*, 333*a*, and 334*a* and the second dielectrics 331*b*, 332*b*, 333*b*, and 334*b* may exist together on every vertical section of the first to fourth regions 331, 332, 333, and 334.

Figure 41:
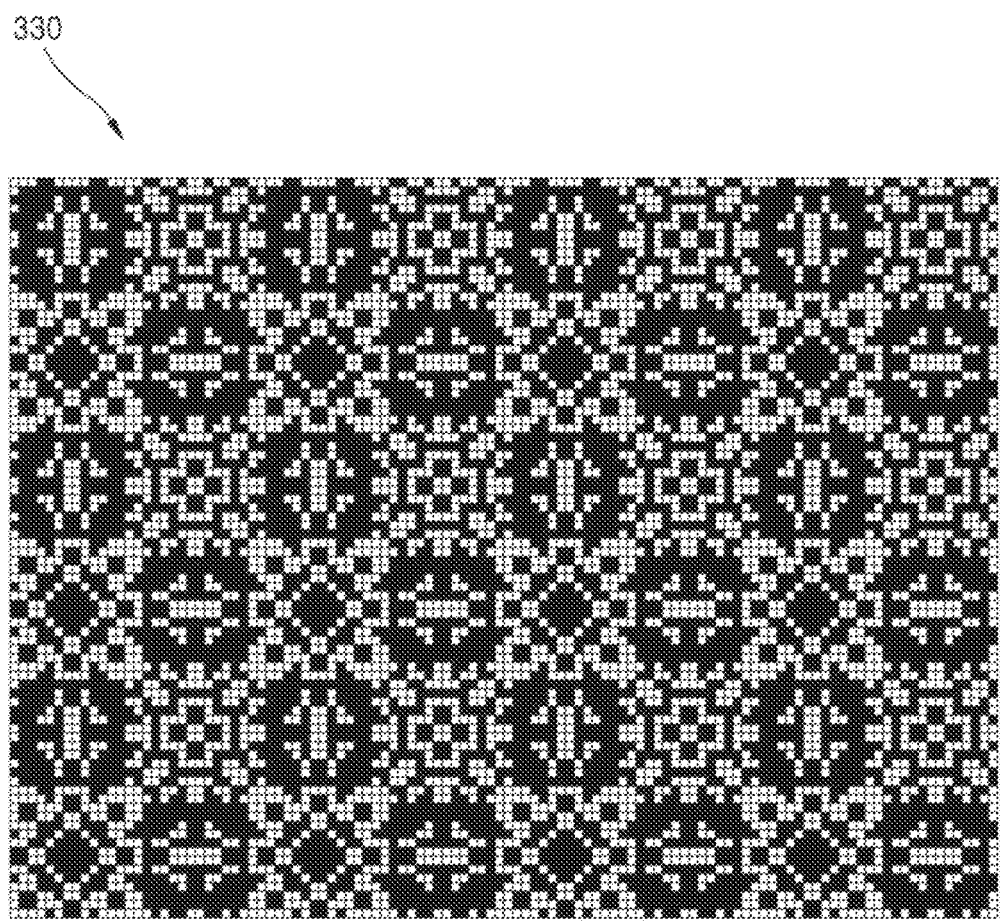
FIG. 41 is a plan view showing an example of an arrangement in a color separating lens array including a plurality of unit pattern arrays of FIG. 38.

FIG. 41 is a plan view showing an example of arrangement in the color separating lens array 330 including the plurality of unit pattern arrays of FIG. 38. As shown in FIG. 41, the color separating lens array 330 may have a structure, in which the unit pattern arrays of 2×2 shown in FIG. 38 are repeatedly and two-dimensionally arranged.

Figure 42A:
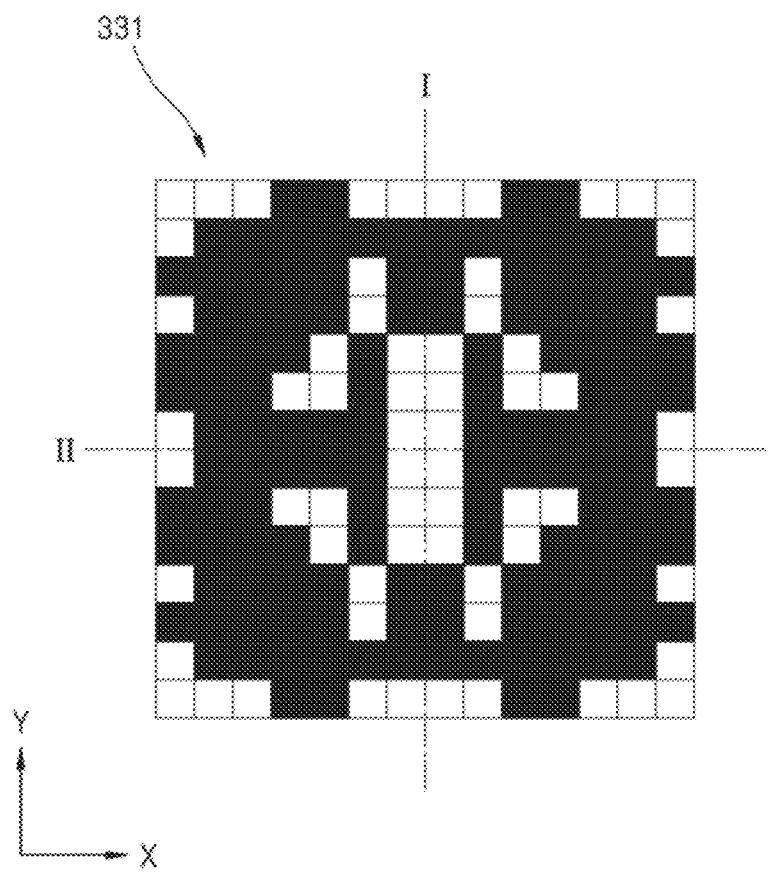
FIG. 42A is a diagram showing an example of a first area in the unit pattern array of FIG. 38.
Figure 42B:
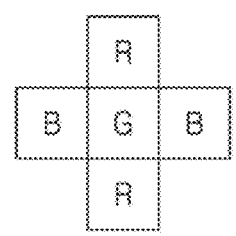
FIG. 42B is a diagram showing a pixel corresponding to the first area and peripheral pixels in an image sensor according to an example embodiment.

In the color separating lens array 330 applied to the image sensor of the Bayer pattern type, the first to fourth patterns of the first to fourth regions 331, 332, 333, and 334 may have predetermined rules. For example, FIG. 42A is a diagram showing an example of the pattern of the first region 331 in the unit pattern array of FIG. 38, and FIG. 42B is a diagram showing a pixel corresponding to the first region 331 and a peripheral pixel in the image sensor. Referring to FIG. 42B, the blue pixels B are arranged at left and right sides of the green pixel G corresponding to the first region 331 and the red pixels R are arranged at upper and lower sides of the green pixel G. Green pixels corresponding to the fourth region 334 are arranged in diagonal directions of the green pixel G corresponding to the first region 331. Therefore, in order to obtain an optical effect that, among the light that has transmitted through the first region 331, the blue light proceeds in the direction to the left and right sides of the first region 331 and the red light proceeds in the direction to upper and lower sides of the first region 331, the first pattern of the first region 331 may have a 2-fold symmetry. For example, as shown in FIG. 42A, the first pattern of the first region 331 may be symmetric about a first axis (I) in the Y-direction and at the same time, symmetric about a second axis (II) in the X-direction.

Figures 43A, 43B:
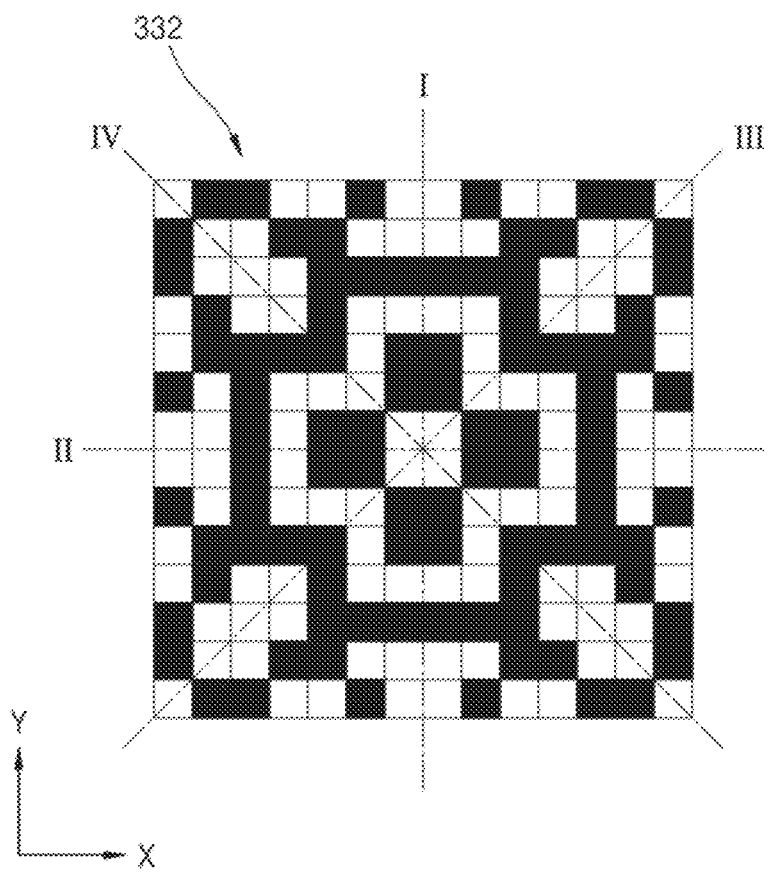
FIG. 43A is a diagram showing an example of a second area in the unit pattern array of FIG. 38.
FIG. 43B is a diagram showing a pixel corresponding to the second area and peripheral pixels in an image sensor according to an example embodiment.

FIG. 43A is a diagram exemplarily showing a shape of the second region 332 in the unit pattern array of FIG. 38, and FIG. 43B is a diagram showing a pixel corresponding to the second region 332 and a peripheral pixel in an image sensor. Referring to FIG. 43B, the green pixels G are arranged at left and right sides and upper and lower sides of the blue pixel B corresponding to the second region 332. In addition, the red pixels R are arranged in two diagonal directions crossing each other. Therefore, in order to obtain an optical effect that, among the light that has transmitted through the second region 332, the green light proceeds in the direction to the left and right sides and the upper and lower sides of the second region 332 and the red light proceeds in the diagonal direction of the second region 332, the second pattern of the second region 332 may have a 4-fold symmetry. For example, as shown in FIG. 43A, the second pattern of the second region 332 may be symmetric about the first axis (I) in the Y-direction, about the second axis (II) in the X-direction, and in a third axis (III) and a fourth axis (IV) in diagonal directions.

Figures 44A, 44B:
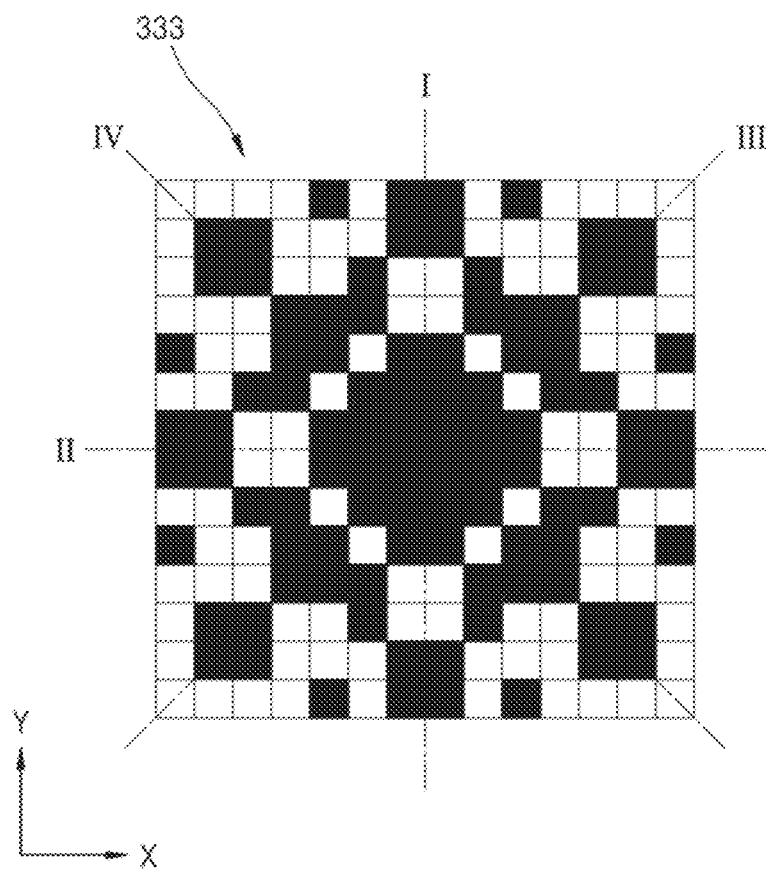
FIG. 44A is a diagram showing an example of a third area in the unit pattern array of FIG. 38.
FIG. 44B is a diagram showing a pixel corresponding to the third area and peripheral pixels in an image sensor according to an example embodiment.

FIG. 44A is a diagram exemplarily showing a shape of the third region 333 in the unit pattern array of FIG. 38, and FIG. 44B is a diagram showing a pixel corresponding to the third region 333 and a peripheral pixel in an image sensor. Referring to FIG. 44B, the green pixels G are arranged at left and right sides and upper and lower sides of the red pixel R corresponding to the third region 333. In addition, the blue pixels B are arranged in two diagonal directions crossing each other. Therefore, in order to obtain an optical effect that, among the light that has transmitted through the third region 333, the green light proceeds in the direction to the left and right sides and the upper and lower sides of the third region 333 and the blue light proceeds in the diagonal direction of the third region 333, the third pattern of the third region 333 may have a 4-fold symmetry. For example, as shown in FIG. 44A, the third pattern of the third region 333 may be symmetric about the first axis (I) in the Y-direction, about the second axis (II) in the X-direction, and in the third axis (III) and the fourth axis (IV) in diagonal directions.

Figure 45A:
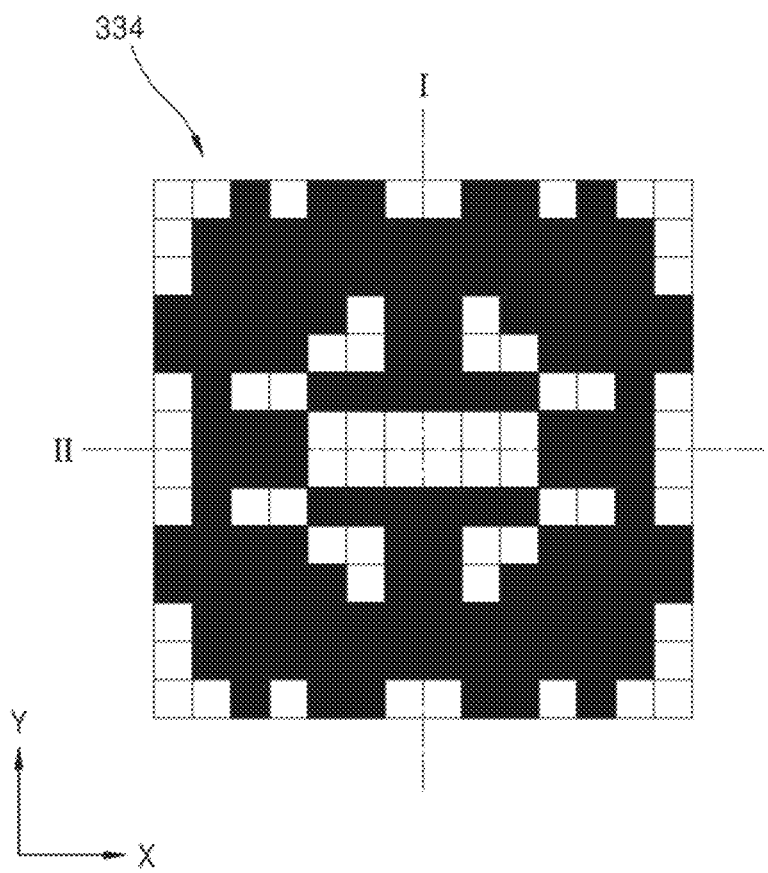
FIG. 45A is a diagram showing an example of a fourth area in the unit pattern array of FIG. 38.
Figure 45B:
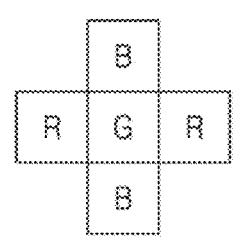
FIG. 45B is a diagram showing a pixel corresponding to the fourth area and peripheral pixels in an image sensor according to an example embodiment.

FIG. 45A is a diagram exemplarily showing a shape of the fourth region 334 in the unit pattern array of FIG. 38, and FIG. 45B is a diagram showing a pixel corresponding to the fourth region 334 and a peripheral pixel in an image sensor. Referring to FIG. 45B, the red pixels R are arranged at left and right sides of the green pixel G corresponding to the fourth region 334 and the blue pixels B are arranged at upper and lower sides of the green pixel G. The green pixels corresponding to the first region 331 are arranged in the diagonal directions, but are not shown in FIG. 45B. Therefore, in order to obtain an optical effect that, among the light that has transmitted through the fourth region 334, the red light proceeds in the direction to the left and right sides of the fourth region 334 and the blue light proceeds in a direction to the upper and lower sides of the fourth region 334, the fourth pattern of the fourth region 334 may have a 2-fold symmetry. For example, as shown in FIG. 45A, the fourth pattern of the fourth region 334 may be symmetric about the first axis (I) in the Y-direction and at the same time, symmetric about the second axis (II) in the X-direction. Also, the pixel arrangement shown in FIG. 45B is rotated by 90° angle from the pixel arrangement shown in FIG. 42B. Therefore, the fourth pattern of the fourth region 334 may have a shape that is the same as the first pattern of the first region 331 rotated by 90° angle.

In the color separating lens array 330 applied to the image sensor of the Bayer pattern type, as another rule for the first to fourth patterns of the first to fourth regions 331, 332, 333, and 334, the first to fourth patterns of the first to fourth color regions 331, 332, 333, and 334 may be designed such that the blue light, green light, and red light that have passed through the color separating lens array 330 may have a predetermined target phase distribution. For example, the first to fourth patterns of the first to fourth regions 331, 332, 333, and 334 may be determined such that a phase making the blue light transmitted through the color separating lens array 330 may travel toward and be condensed on a position of the blue pixel B corresponding to the second region 332 and not travel to positions corresponding to the first region 331 and the fourth region 334 adjacent to the second region 332 is formed.

Also, the first to fourth patterns of the first to fourth regions 331, 332, 333, and 334 may be determined such that a phase making the green light transmitted through the color separating lens array 330 may travel toward and be condensed on a position of the green pixel G corresponding to the first and fourth regions 331 and 334 and not travel to positions corresponding to the second region 332 and the third region 333 adjacent to the first and fourth regions 331 and 334 is formed.

Also, the first to fourth patterns of the first to fourth regions 331, 332, 333, and 334 may be determined such that a phase making the red light transmitted through the color separating lens array 330 may travel toward and be condensed on a position of the red pixel R corresponding to the third region 333 and not travel to positions corresponding to the first and fourth regions 331 and 334 adjacent to the third region 333 is formed.

The target phase distribution that is to be implemented by the color separating lens array 330 may be the same as the above description about the color separating lens array 130, and thus, detailed descriptions thereof are omitted. The color separating lens array 330 may perform the same operations as those described above with reference to FIGS. 6A to 6D, 7A to 7D, and 8A to 8D, according to the first to fourth patterns of the first to fourth regions 331, 332, 333, and 334.

The patterns of the color separating lens array 330 satisfying the above phase distribution may be automatically designed through various types of computer simulations. For example, the patterns of the first to fourth regions 331, 332, 333, and 334 may be optimized through a nature-inspired algorithm such as a genetic algorithm, a particle swarm optimization algorithm, an ant colony optimization algorithm, etc., or a reverse design based on an adjoint optimization algorithm.

The first to fourth patterns of the first to fourth regions 331, 332, 333, and 334 may be optimized while evaluating performances of candidate color separating lens arrays based on evaluation factors such as color separation spectrum, optical efficiency, signal-to-noise ratio, etc. when designing the color separating lens array 330. For example, the first to fourth patterns of the first to fourth regions 331, 332, 333, and 334 may be optimized in a manner that a target numerical value of each evaluation element is determined in advance and the sum of the differences from the target numerical values of a plurality of evaluation elements is reduced. The performance may be indexed for each evaluation element, and the first to fourth patterns of the first to fourth regions 331, 332, 333, and 334 may be optimized such that a value representing the performance may be maximized.

The color separating lens array 330 shown in FIG. 38 is an example. In addition, the color separating lens array 330 of various types may be obtained through the above optimization design, according to the sizes and thicknesses of the first to fourth regions 331, 332, 333, and 334 in the color separating lens array 330, a color characteristic and a pitch between pixels in the image sensor, to which the color separating lens array 330 is to be applied, a distance between the color separating lens array 330 and the image sensor, an incidence angle of the incident light, etc. For example, FIG. 46 is a plan view exemplarily showing a shape of a unit pattern array in a color separating lens array according to another example embodiment, which may be applied to an image sensor of Bayer pattern type, and FIG. 47 is a plan view exemplarily showing a shape of a unit pattern array in a color separating lens array according to another example embodiment, which may be applied to the image sensor of the Bayer pattern type.

Figure 46:
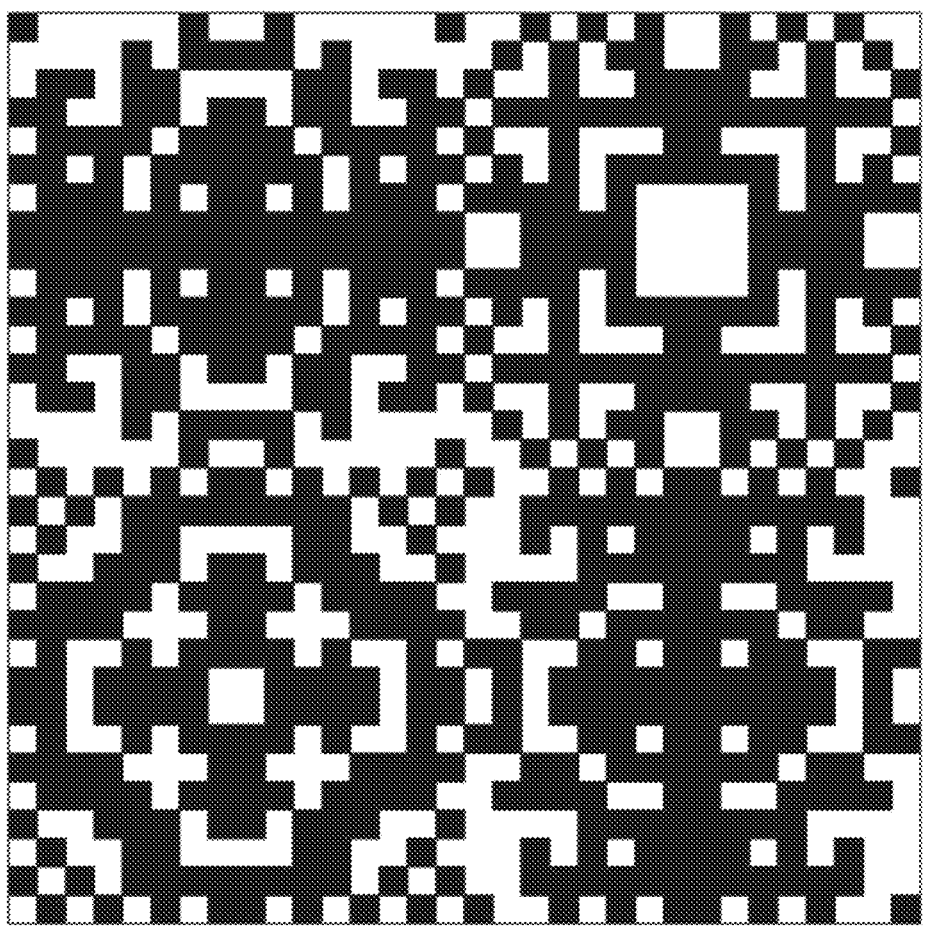
FIG. 46 is a plan view showing an exemplary form of a unit pattern array in a color separating lens array according to another example embodiment.

Each of the first to fourth regions 331, 332, 333, and 334 shown in FIG. 38 is optimized in a digitized binary form in a 14×14 rectangular arrangement, and each of the first to fourth regions 331, 332, 333, and 334 shown in FIG. 46 is optimized in a digitized binary form in a 16×16 rectangular arrangement. Therefore, the unit pattern array of the color separating lens array 330 shown in FIG. 38 has a shape of 28×28 rectangular arrangement, and the unit pattern array of the color separating lens array shown in FIG. 46 has a shape of 32×32 rectangular arrangement. In this case, the shape of the vertical section of the first to fourth regions 331, 332, 333, and 334 shown in FIGS. 39 and 40 is discontinuously changed as line A-A' moves in the Y-direction or as line B-B' moves in the X-direction.

Figure 47:
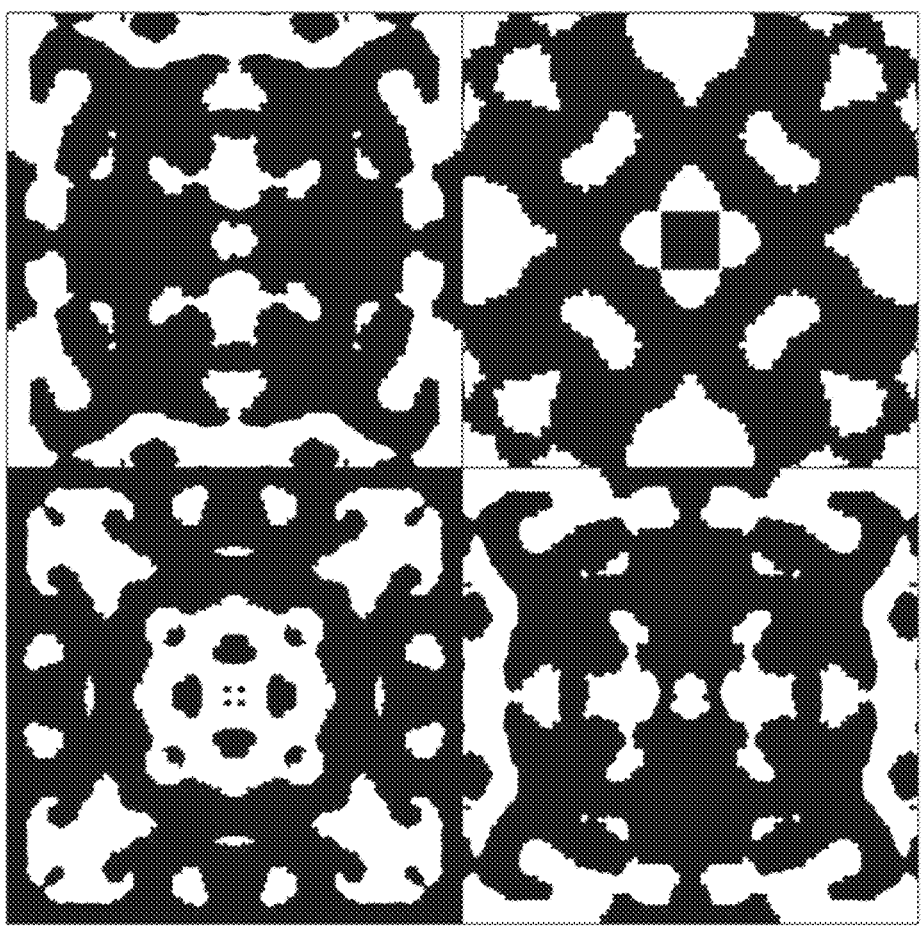
FIG. 47 is a plan view showing an exemplary form of a unit pattern array in a color separating lens array according to another example embodiment.

Each of the first to fourth regions 331, 332, 333, and 334 shown in FIG. 47 may be optimized in the form of a continuous curve that is not digitized. In this case, the shape of the vertical section of the first to fourth regions 331, 332, 333, and 334 shown in FIGS. 39 and 40 is continuously changed as line A-A' moves in the Y-direction or as line B-B' moves in the X-direction.

Figure 48A:
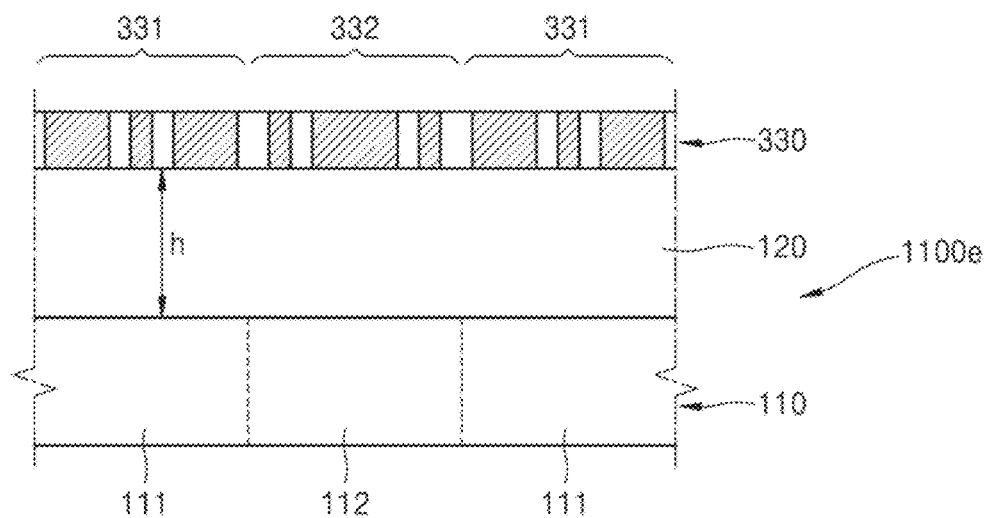
FIGS. 48A and 48B are cross-sectional views of a pixel array in an image sensor adopting a color separating lens array according to an example embodiment, taken along different cross-sections.
Figure 48B:
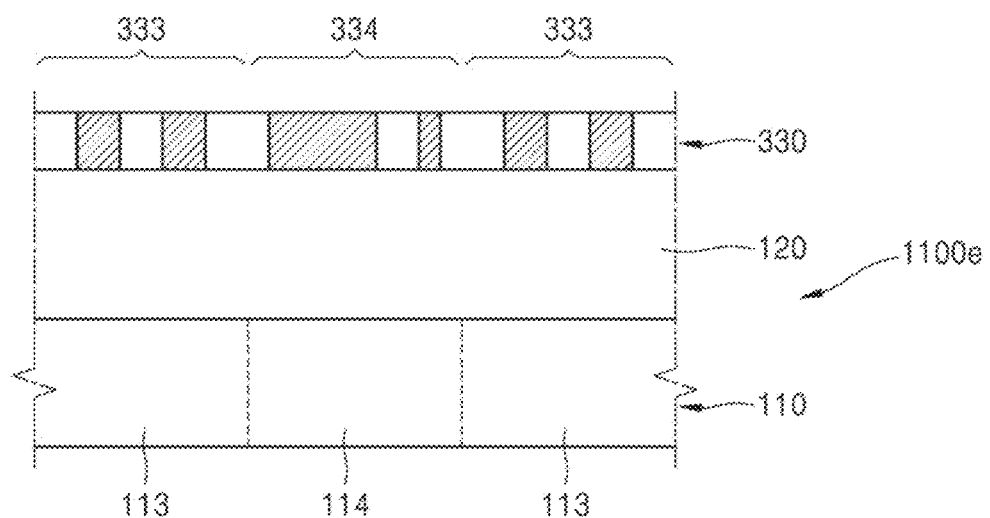

FIGS. 48A and 48B are cross-sectional views of a pixel array in an image sensor adopting the color separating lens array 330, seen from different cross-sections. Referring to FIGS. 48A and 48B, the pixel array 1100e of the image sensor may include the sensor substrate 110, the spacer layer 120, and the color separating lens array 330. The first region 331 of the color separating lens array 330 is arranged in correspondence with the first photosensitive cell 111 of the sensor substrate 110, and the second region 332 of the color separating lens array 330 is arranged in correspondence with the second photosensitive cell 112 of the sensor substrate 110. The third region 333 of the color separating lens array 330 is arranged in correspondence with the third photosensitive cell 113 of the sensor substrate 110, and the fourth region 334 of the color separating lens array 330 is arranged in correspondence with the fourth photosensitive cell 114 of the sensor substrate 110. A color filter may be further arranged between the sensor substrate 110 and the spacer layer 120. As mentioned above, the thickness of the spacer layer 120 is determined by the predetermined propagation distance requirements configured to separate the light of different wavelengths by the color separating lens array 330 to be condensed on corresponding photosensitive cells.

The above-described patterns of the color separating lens array 330 are examples, and may be variously modified. For example, the other wavelength band than the visible ray band may be separated according to other pattern shapes of the first to fourth regions 331, 332, 333, and 334 in the color separating lens array 330. Also, the number of color separation patterns configuring one unit pattern array in the color separating lens array 330 may vary depending on the application examples of the color separating lens array 330. The pixel arrangement in the image sensor is described as the Bayer pattern as an example, but may be applied to the pixel arrangements shown in FIGS. 2B and 2C. The pattern suitable for the above pixel arrangement may be determined by adopting the regions of the color separating lens array 330 and using the above-described optimization method for each region.

Figure 49:
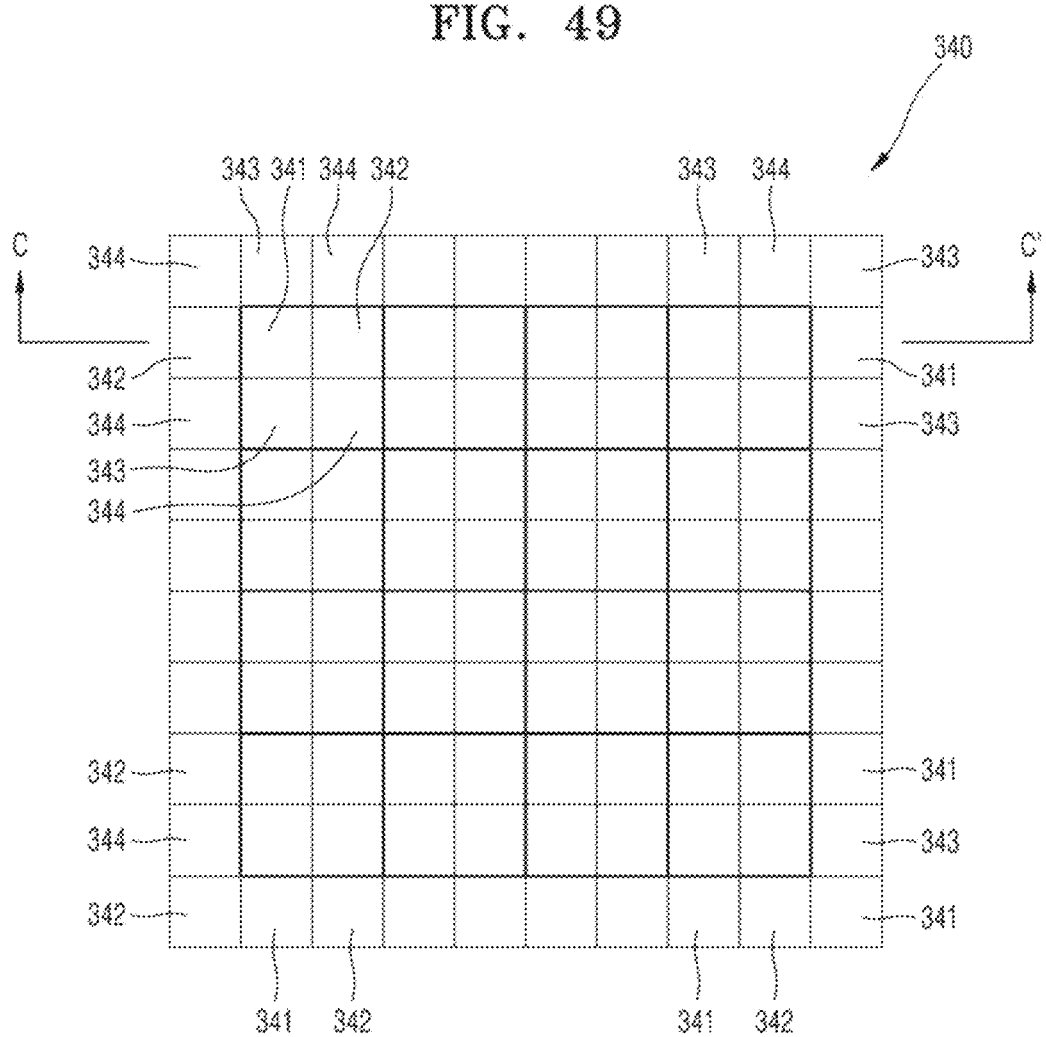
FIG. 49 is a plan view showing an example of a color separating lens array according to another example embodiment.

FIG. 49 is a plan view showing an example of a color separating lens array 340 according to another example embodiment. Referring to FIG. 49, the color separation pattern array 340 may include a plurality of unit pattern arrays denoted in bold lines, wherein the unit pattern arrays are arranged two-dimensionally. Each of the unit pattern arrays may include first to fourth regions 341, 342, 343, and 344 arranged in 2×2 dimensional shape. In the entire arrangement of the color separating lens array 340, the first and second regions 341 and 342 are alternately arranged in the transverse direction in one row, and the third and fourth regions 343 and 344 are alternately arranged in the transverse direction in another row. Also, the first and third regions 341 and 343 are alternately arranged in the longitudinal direction in one column, and the second and fourth regions 342 and 344 are alternately arranged in the longitudinal direction in another column.

In addition, the color separating lens array 340 may further include a plurality of first to fourth color separation patterns 341, 342, 343, and 344 that are not included in any of the unit pattern arrays. The plurality of first to fourth color separation patterns 341, 342, 343, and 344 that are not included in any unit pattern array may be arranged along edges of the color separating lens array 340. For example, a plurality of second regions 342 and a plurality of fourth regions 344 constituting one column are additionally arranged on a left edge of the color separating lens array 340, a plurality of first regions 341 and a plurality of third regions 343 constituting one column are additionally arranged on a right edge of the color separating lens array 340, a plurality of third regions 343 and a plurality of fourth regions 344 constituting one row are additionally arranged on an upper edge of the color separating lens array 340, and a plurality of first regions 341 and a plurality of second regions 342 constituting one row are additionally arranged on a lower edge of the color separating lens array 340.

Figure 50:
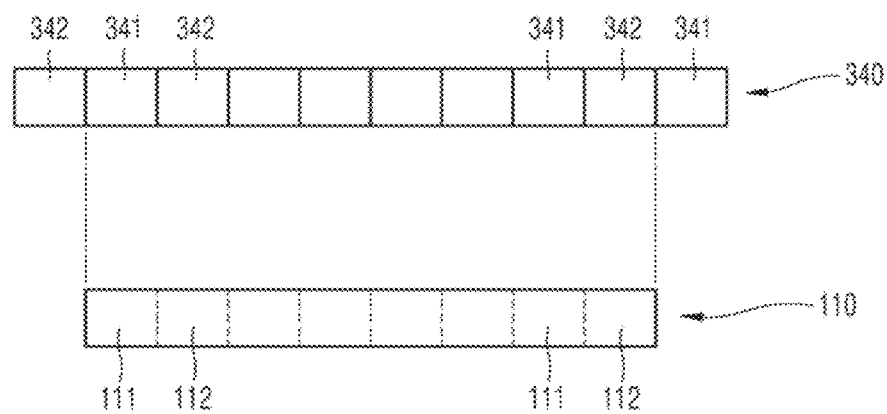
FIG. 50 is a cross-sectional view of a pixel array in an image sensor including the color separating lens array of FIG. 49.

FIG. 50 shows a vertical section of the color separating lens array 340 shown in FIG. 49, taken along line C-C'. Referring to FIG. 50, the color separating lens array 340 may include a plurality of first regions 341 and a plurality of second regions 342 which protrude in a horizontal direction with respect to the edges of the sensor substrate 110 and do not face any of the photosensitive cells in the sensor substrate 110 in the vertical direction. The plurality of first to fourth regions 341, 342, 343, and 344 that are not included in any of the unit pattern arrays in FIG. 50 all protrude in the horizontal direction with respect to the edges of the sensor substrate 110 and do not face any of the photosensitive cells in the vertical direction.

As described above with reference to FIGS. 6A to 6D, 7A to 7D, and 8A to 8D, the photosensitive cell may receive light not only from the region of the color separating lens array 340 corresponding thereto in the vertical direction, but also from a plurality of other peripheral regions. When the first to fourth regions 341, 342, 343, and 344 are not added along the edges of the color separating lens array 340, the intensity of light incident to the photosensitive cells arranged along the edges of the sensor substrate 110 may be reduced, and a color purity may also degrade. By additionally arranging the first to fourth regions 341, 342, 343, and 344 along the edges of the color separating lens array 340, the light may be incident to the photosensitive cells arranged along the edges of the sensor substrate 110, identically to those arranged inside the sensor substrate 110. The example embodiment illustrated in FIGS. 49 and 50 may be also applied to the color separating lens array including the arrangement of the plurality of nanoposts described above.

Figure 51:
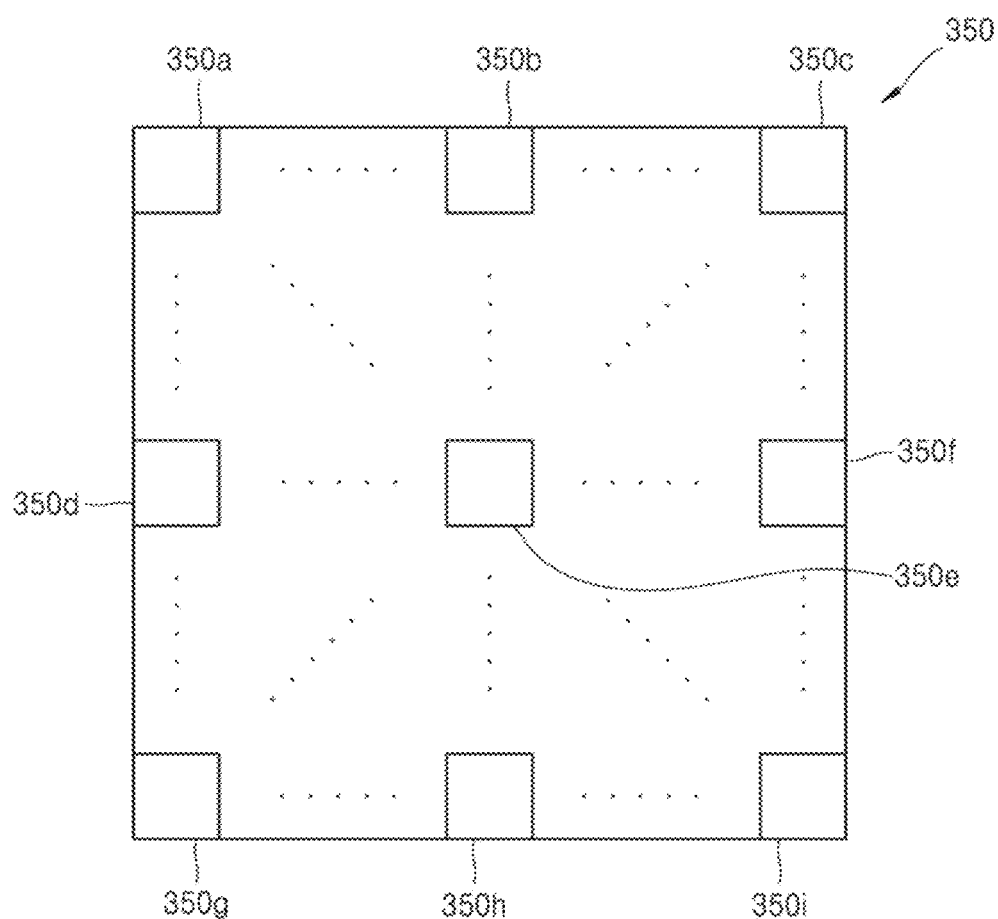
FIG. 51 is a plan view showing an example of an arrangement of a plurality of unit pattern arrays in a color separating lens array according to another example embodiment.

When the example embodiment is applied to the camera 2000 shown in FIG. 22, the plurality of unit pattern arrays in the color separating lens array may be designed to have different shapes in consideration of the CRA of the incident light. For example, FIG. 51 is a plan view showing an example of arrangement of a plurality of unit pattern arrays in a color separating lens array 350 according to another example embodiment. Referring to FIG. 51, the color separating lens array 350 may include a plurality of unit pattern arrays 350a, 350b, 350c, 350d, 350e, 350f, 350g, 350h, and 350i having different patterns according to locations thereof on the image sensor. For example, patterns of first to fourth regions in each of the unit pattern arrays 350a to 350i may be determined through the above-described optimization algorithm in consideration of the CRA of the incident light incident onto the locations on the image sensor, on which the unit pattern arrays 350a to 350i are arranged. When the CRA of the light incident onto the center of the image sensor is 0 and gradually increases toward the edge of the image sensor, the patterns of the first to fourth regions in each of the unit pattern arrays 350a to 350i may be gradually changed from the unit pattern array 350e that is at the center of the image sensor toward the unit pattern arrays 350a, 350b, 350c, 350d, 350f, 350g, 350h, and 350i arranged at the edges of the image sensor.

Figure 52:
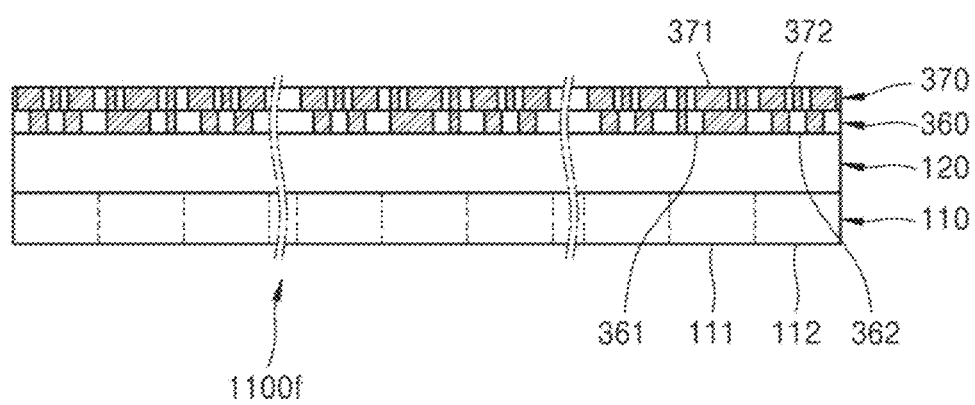
FIG. 52 is a cross-sectional view illustrating a schematic structure of a pixel array in an image sensor according to another example embodiment.

Also, in order to obtain a consistent color separation efficiency without regard to the change in the CRA of the incident light, which varies depending on the location on the image sensor, two different color separating lens arrays may be stacked in a dual-layered structure. For example, FIG. 52 is a cross-sectional view illustrating a schematic structure of a pixel array 1100f in an image sensor according to another example embodiment. Referring to FIG. 52, the pixel array 1100f of the image sensor may include a first color separating lens array 360 on the spacer layer 120 and a second color separating lens array 370 on the first color separating lens array 360.

The first color separating lens array 360 may include a first region 361 arranged facing the first photosensitive cell 111 in the vertical direction, and a second region 362 arranged facing the second photosensitive cell 112 in the vertical direction. The cross-sectional view of FIG. 52 only shows the first region 361 and the second region 362, but the first color separating lens array 360 may further include a third region and a fourth region in another cross-section. The second color separating lens array 370 may include a first region 371 arranged facing the first photosensitive cell 111 in the vertical direction, and a second region 372 arranged facing the second photosensitive cell 112 in the vertical direction. Therefore, the first region 361 and the second region 362 of the first color separating lens array 360 may be arranged to face the first region 371 and the second region 372 of the second color separating lens array 370 in the vertical direction, respectively. Also, the second color separating lens array 370 may further include third and fourth regions.

The first and second regions 361 and 362 of the first color separating lens array 360 may have different patterns, and the first and second regions 371 and 372 of the second color separating lens array 370 may have different patterns. Also, the first region 361 of the first color separating lens array 360 may have a different pattern from those of the first and second regions 371 and 372 of the second color separating lens array 370, and the second region 362 of the first color separating lens array 360 may have a different pattern from those of the first and second regions 371 and 372 of the second color separating lens array 370.

In the above structure, the patterns of the second color separating lens array 370 and the first color separating lens array 360 may be designed such that the light incident on the sensor substrate 110 after successively passing through the second color separating lens array 370 and the first color separating lens array 360 may be more effectively color-separated. For example, the second color separating lens array 370 may have a shape varying depending on locations on the image sensor and may change the proceeding direction of the incident light to be nearly parallel with a surface normal of the first color separating lens array 360. In this case, the patterns of the first color separating lens array 360 may be consistent regardless of locations on the image sensor. Also, the patterns of the first color separating lens array 360 and the patterns of the second color separating lens array 370 may be shifted from each other in a direction in which the light travels.

In the image sensor according to the above example embodiments, the light loss caused by the color filter rarely happens, and a sufficient light intensity may be provided to the pixels even when sizes of the pixels are reduced. Therefore, an ultra-high resolution, ultra-small, and highly sensitive image sensor having hundreds of millions of pixels or more may be manufactured. Such an ultra-high resolution, ultra-small, and highly sensitive image sensor may be employed in various high-performance optical devices or high-performance electronic devices. For example, the electronic devices may include, for example, smart phones, mobile phones, cell phones, personal digital assistants (PDAs), laptop computers, personal computers (PCs), a variety of portable devices, electronic devices, surveillance cameras, medical camera, automobiles, Internet of Things (IoT), other mobile or non-mobile computing devices and are not limited thereto.

Figure 53:
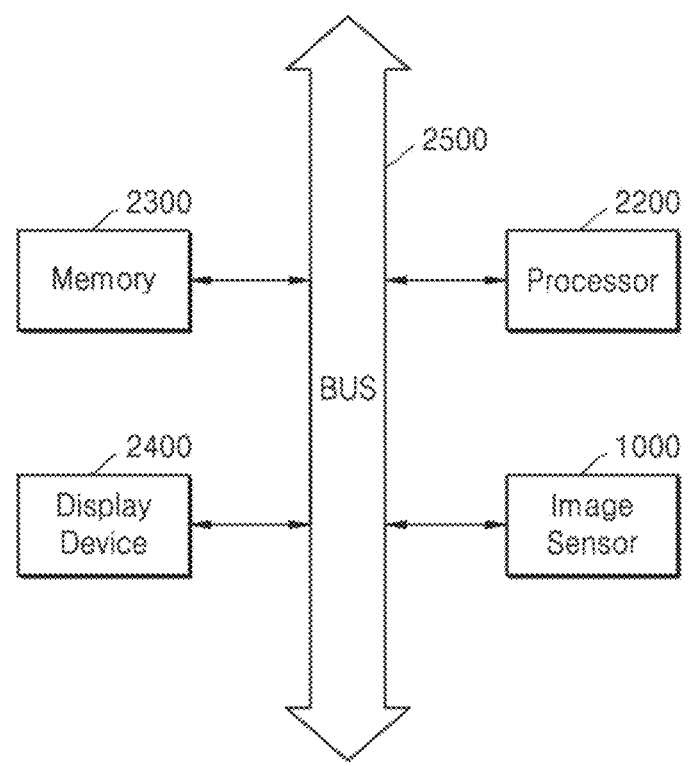
FIG. 53 is a block diagram of an electronic device including an image sensor according to one or more example embodiments.
Figure 54:
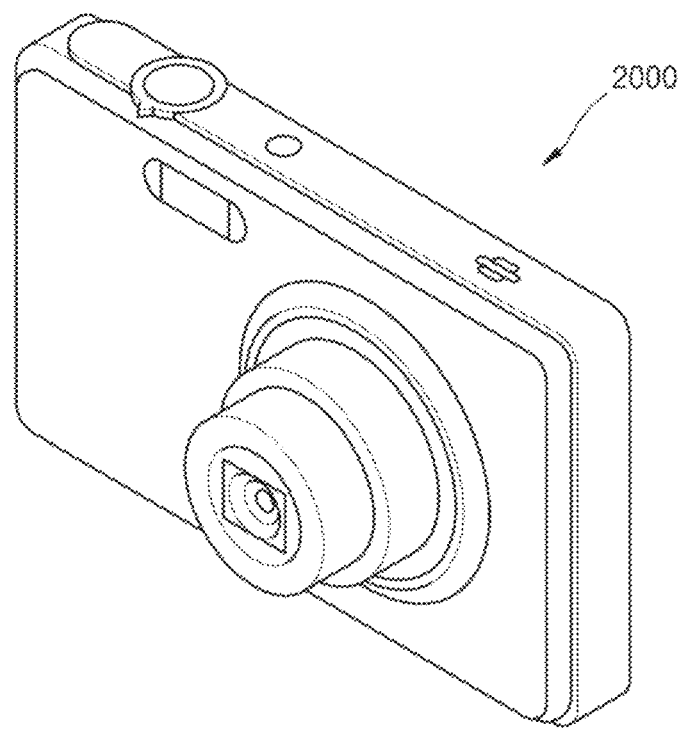
FIGS. 54, 55, 56, 57, 58, 59, 60, 61, 62, 63, and 64 are diagrams showing various examples of an electronic device to which an image sensor according to one or more example embodiments is applied.

FIG. 53 is a block diagram of an electronic device including an image sensor according to one or more example embodiments. The electronic device includes an image sensor 1000, a processor 2200, a memory 2300, a display device 2400, and a bus 2500. The image sensor 1000 acquires image information about an external object according to control of the processor 2200, and provides the image information to the processor 2200. The processor 2200 stores the image information provided from the image sensor 1000 in the memory 2300 via the bus 2500, and outputs the image information stored in the memory 2300 to the display device 2400 to display the image information to the user. Also, the processor 2200 may perform various image processes on the image information provided from the image sensor 1000.

FIGS. 54 to 64 are diagrams showing various examples of an electronic device to which an image sensor according to one or more example embodiments is applied.

The image sensor according to the example embodiments may be applied to various multimedia devices having image capturing functions. For example, the image sensor may be applied to the camera 2000 shown in FIG. 54. The camera 2000 may be a digital camera or a digital camcorder.

Figure 55:
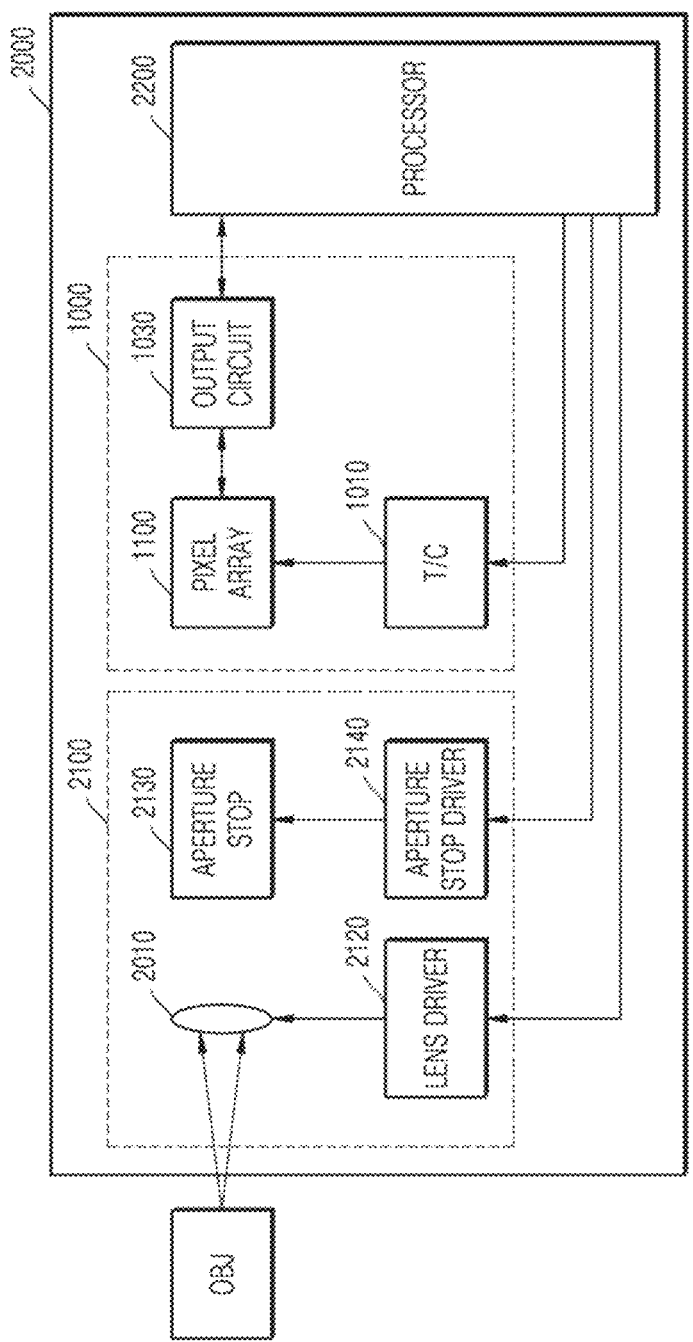

Referring to FIG. 55, the camera 2000 may include an imaging unit 2100, the image sensor 1000, and the processor 2200.

The imaging unit 2100 forms an optical image by focusing the light reflected from an object OBJ. The imaging unit 2100 may include an objective lens 2010, a lens driver 2120, an aperture stop 2130, and an aperture stop driver 2140. FIG. 55 only shows one lens for convenience of description, but the objective lens 2010 may actually include a plurality of lenses having different sizes and shapes from one another. The lens driver 2120 may communicate information about focus detection with the processor 2200, and may adjust the location of the objective lens 2010 according to a control signal provided from the processor 2200. The lens driver 2120 may move the objective lens 2010 to adjust a distance between the objective lens 2010 and the object OBJ, or may adjust locations of separate lenses in the objective lens 2010. The focusing of the object OBJ may be adjusted when the lens driver 2120 drives the objective lens 2010. The camera 2000 may have an auto-focusing function.

The aperture stop driver 2140 may communicate information about light intensity with the processor 2200, and may adjust the aperture stop 2130 according to a control signal provided from the processor 2200. For example, the aperture stop driver 2140 may increase or decrease an aperture of the aperture stop 2130 according to an amount of the light entering the camera 2000 through the objective lens 2010, and may adjust an opening time of the aperture stop 2130.

The image sensor 1000 may generate an electrical image signal based on an intensity of the incident light. The image sensor 1000 may include a pixel array 1100, a timing controller 1010, and an output circuit 1030. The image sensor 1000 may further include the row decoder shown in FIG. 1. The light that has passed through the objective lens 2010 and the aperture stop 2130 may form an image of the object OBJ on a light receiving surface of the pixel array 1100. The pixel array 1100 may be a CCD or a CMOS for converting an optical signal into an electrical signal. The pixel array 1100 may include additional pixels for performing an auto-focusing (AF) function or a distance measuring function. Also, the pixel array 1100 may include the above color separating lens array.

The processor 2200 may control overall operations of the camera 2000 and may have an image processing function. For example, the processor 2200 may provide the lens driver 2120, the aperture stop driver 2140, the timing controller 1010, etc. with control signals for operating the elements.

Figure 56:
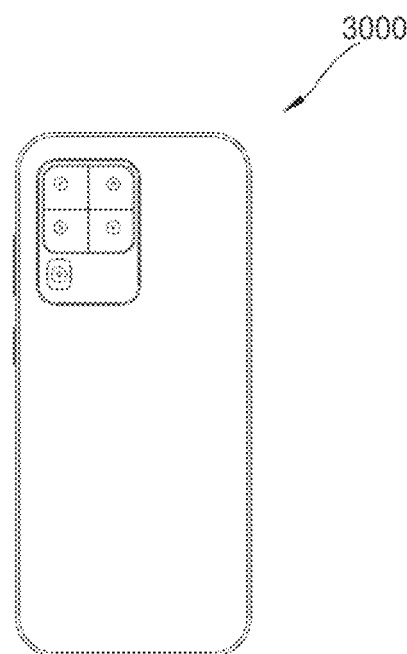
Figure 57:
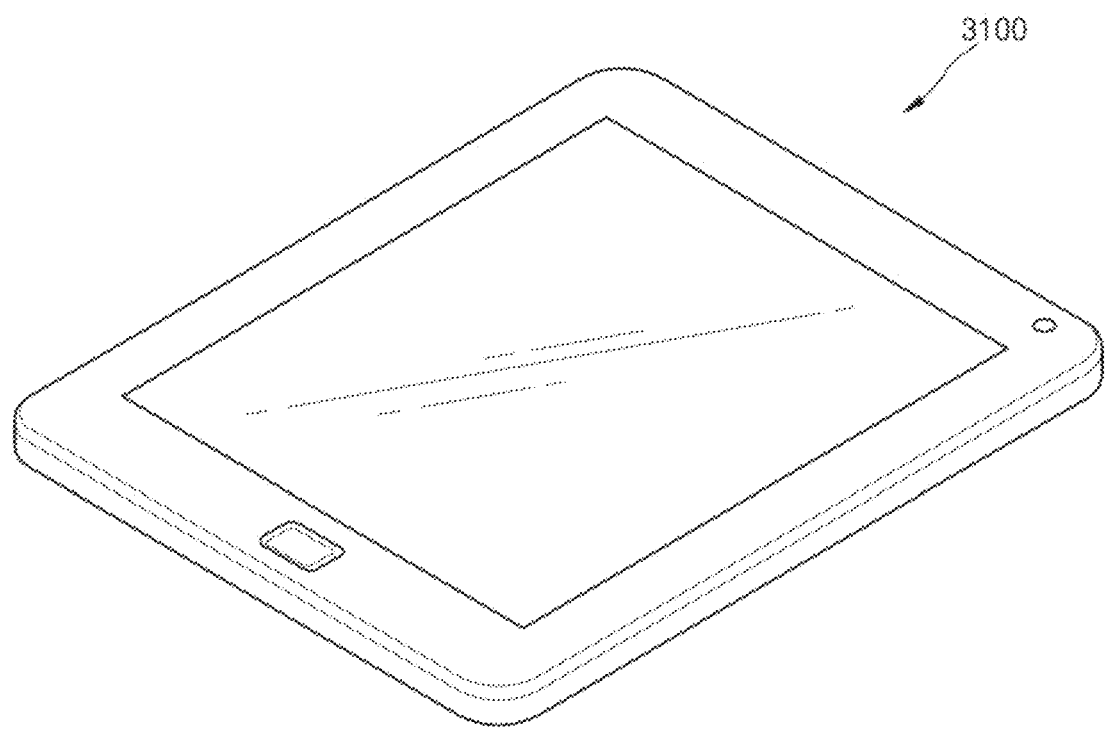
Figure 58:
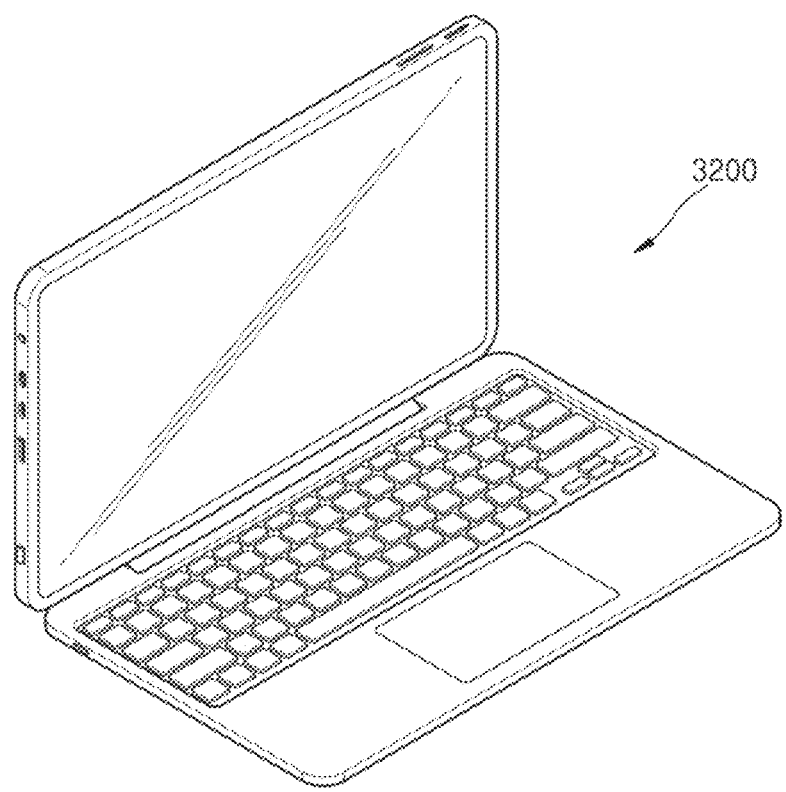
Figure 59:
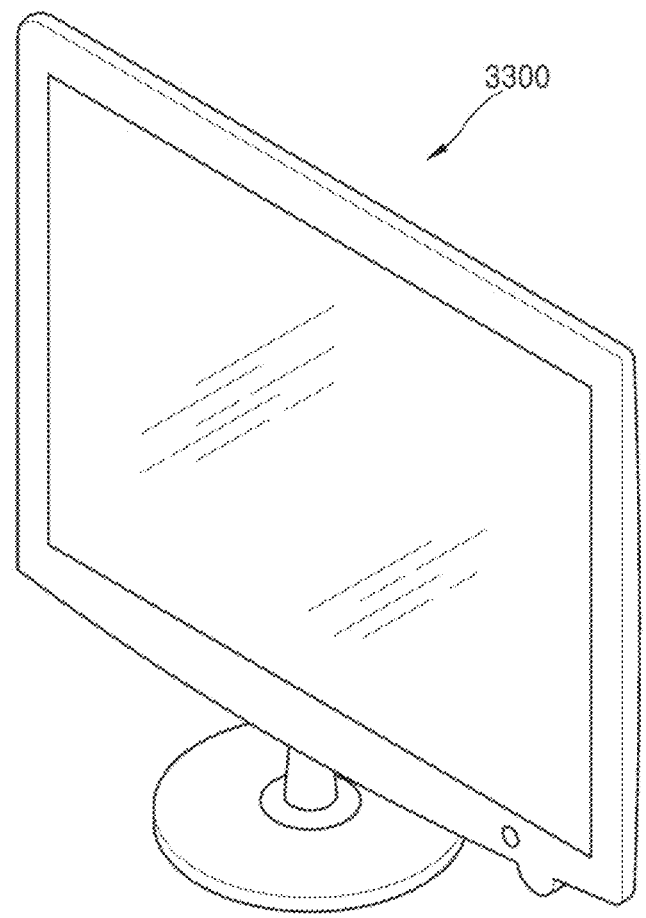

The image sensor according to the example embodiments may be applied to the mobile phone or a smartphone 3000 shown in FIG. 56, a tablet or a smart tablet 3100 shown in FIG. 57, a laptop computer 3200 shown in FIG. 58, a television or a smart television 3300 shown in FIG. 59, etc. For example, the smartphone 3000 or the smart tablet 3100 may include a plurality of high-resolution cameras each including a high-resolution image sensor. Depth information of objects in an image may be extracted, out focusing of the image may be adjusted, or objects in the image may be automatically identified by using the high-resolution cameras.

Figure 60:
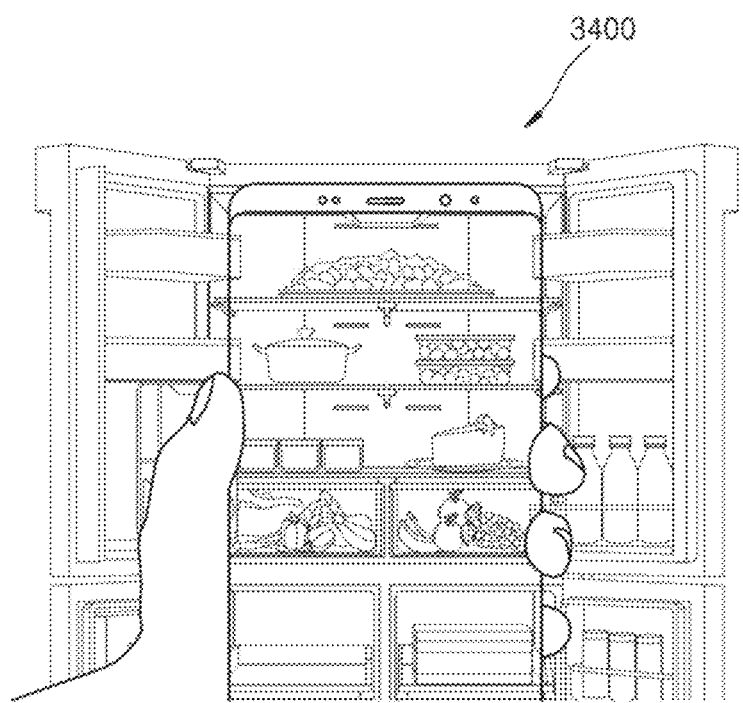
Figure 61:
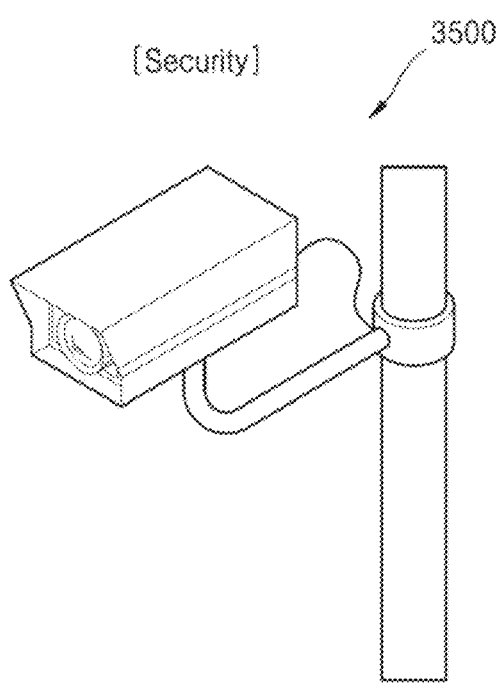
Figure 62:
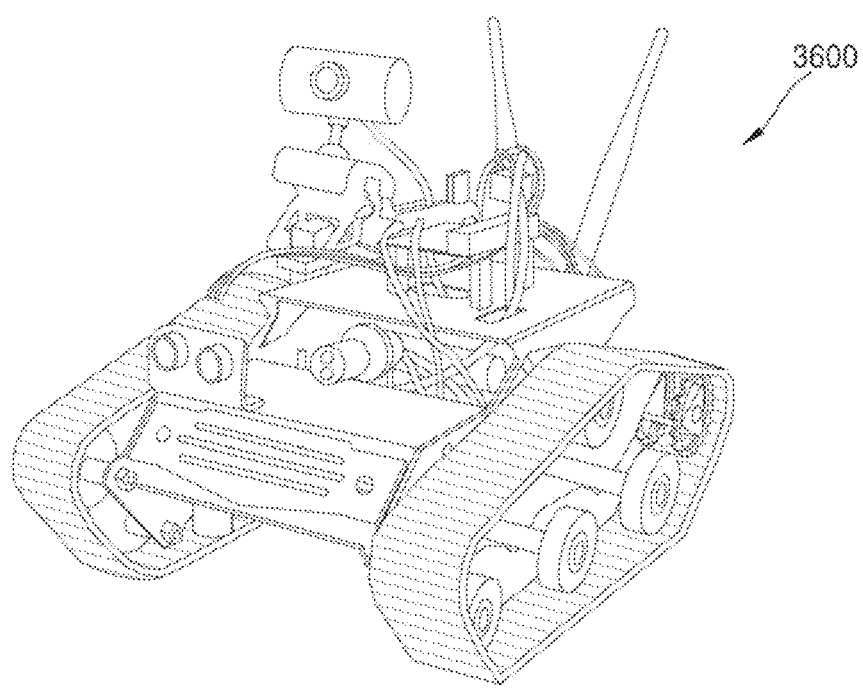
Figure 63:
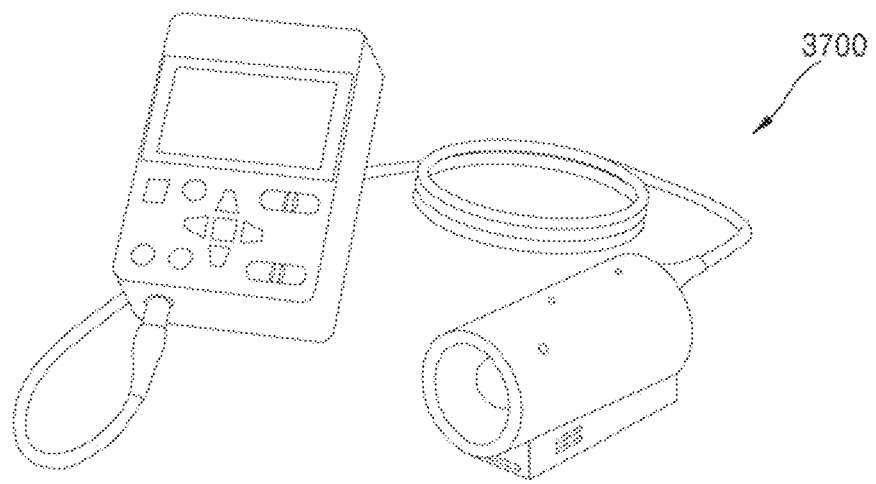

Also, the image sensor may be applied to a smart refrigerator 3400 shown in FIG. 60, a surveillance camera 3500 shown in FIG. 61, a robot 3600 shown in FIG. 62, a medical camera 3700 shown in FIG. 63, etc. For example, the smart refrigerator 3400 may automatically recognize food in the refrigerator by using the image sensor, and may notify the user of an existence of a certain kind of food, kinds of food put into or taken out, etc. through a smartphone. Also, the surveillance camera 3500 may provide an ultra-high-resolution image and may allow the user to recognize an object or a person in the image even in dark environment by using high sensitivity. The robot 3600 may be input to a disaster or industrial site that a person may not directly access, to provide the user with high-resolution images. The medical camera 3700 may provide high-resolution images for diagnosis or surgery, and may dynamically adjust a field of view.

Figure 64:
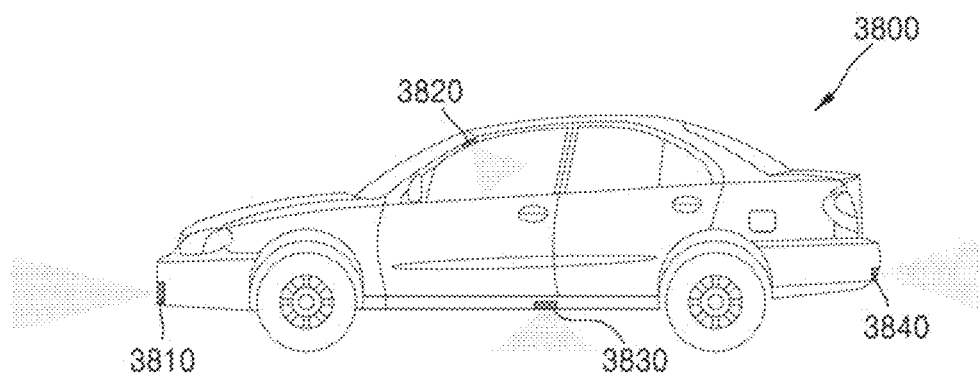

Also, the image sensor may be applied to a vehicle 3800 as shown in FIG. 64. The vehicle 3800 may include a plurality of vehicle cameras 3810, 3820, 3830, and 3840 arranged on various positions, and each of the vehicle cameras 3810, 3820, 3830, and 3840 may include the image sensor according to the example embodiment. The vehicle 3800 may provide a driver with various information about the interior of the vehicle 3800 or the periphery of the vehicle 3800 by using the plurality of vehicle cameras 3810, 3820, 3830, and 3840, and may provide the driver with the information necessary for the autonomous travel by automatically recognizing an object or a person in the image.

While the image sensor including the color separating lens array and the electronic device including the image sensor have been particularly shown and described with reference to example embodiments thereof, it will be understood by those of ordinary skill in the art that various changes in form and details may be made therein without departing from the spirit and scope as defined by the following claims. The example embodiments should be considered in descriptive sense only and not for purposes of limitation. Therefore, the scope of the disclosure is defined not by the detailed description of the disclosure but by the appended claims, and all differences within the scope will be construed as being included in the present disclosure.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. An image sensor comprising:
    a sensor substrate comprising first photosensitive cells and second photosensitive cells configured to sense light; and
    a color separating lens array comprising first regions and second regions respectively corresponding to the first photosensitive cells and the second photosensitive cells, the first regions and the second regions respectively comprising nanoposts configured to separate, from light incident on the color separating lens array, light of a first wavelength and light of a second wavelength different from the first wavelength, and focus the light of the first wavelength and the light of the second wavelength respectively on the first photosensitive cells and the second photosensitive cells, the nanoposts in the first regions and the second regions comprising a first nanopost and a second nanopost provided on the first nanopost, the second nanopost being aligned with the first nanopost at a center of the image sensor and shifted toward the center of the image sensor with respect to the first nanopost at a peripheral portion of the image sensor.

2. The image sensor of claim 1, wherein a degree of shifting of the second nanopost with respect to the first nanopost at the peripheral portion of the image sensor increases with an increase in a distance from the center of the image sensor.

3. The image sensor of claim 1, wherein the first regions and the second regions at a center of the color separating lens array are respectively aligned with the first photosensitive cells and the second photosensitive cells corresponding to the first regions and the second regions, and
    wherein the first regions and the second regions on a peripheral portion of the color separating lens array are shifted toward the center of the color separating lens array with respect to the first photosensitive cells and the second photosensitive cells corresponding to the first regions and the second regions.

4. The image sensor of claim 3, wherein degrees of shifting of the first regions and the second regions with respect to the first photosensitive cells and the second photosensitive cells corresponding to the first regions and the second regions on the peripheral portion of the color separating lens array, increase with an increase in a distance from the center of the color separating lens array.

5. The image sensor of claim 3, wherein a distance of shifting of the first regions and the second regions with respect to the first photosensitive cells and the second photosensitive cells corresponding respectively to the first regions and the second regions is proportional to a shortest distance between a lower surface of the color separating lens array and an upper surface of the sensor substrate and proportional to an incidence angle of the light incident on the sensor substrate.

6. The image sensor of claim 1, wherein the sensor substrate further comprises third photosensitive cells and fourth photosensitive cells configured to sense the light,
    wherein the color separating lens array further comprises third regions and fourth regions respectively corresponding to the third photosensitive cells and the fourth photosensitive cells, and
    wherein the first regions, the second regions, the third regions, and the fourth regions are respectively provided along four quadrant surfaces.

7. The image sensor of claim 6, wherein the third regions and the fourth regions respectively comprise nanoposts such that the nanoposts in the first regions, in the second regions, in the third regions, and in the fourth regions are configured to separate, from light incident on the color separating lens array, light of the first wavelength, light of the second wavelength, and light of a third wavelength different from the first wavelength and the second wavelength, focus the light of the first wavelength on the first photosensitive cells and the fourth photosensitive cells, focus the light of the second wavelength on the second photosensitive cells, and focus the light of the third wavelength on the fourth photosensitive cells.

8. The image sensor of claim 7, wherein the nanoposts in the third regions and in the fourth regions comprises a first nanopost and a second nanopost provided on the first nanopost,
    wherein the second nanopost in the third regions and in the fourth regions at a center of the image sensor is aligned with the corresponding first nanopost, and
    wherein the second nanopost in the third regions and in the fourth regions at a peripheral portion of the image sensor is shifted toward the center of the image sensor with respect to the corresponding first nanopost.

9. The image sensor of claim 7, wherein the third regions and the fourth regions at a center of the color separating lens array are respectively aligned with the third photosensitive cells and the fourth photosensitive cells corresponding to the third regions and the fourth regions, and
    wherein the third regions and the fourth regions on a peripheral portion of the color separating lens array are shifted toward the center of the color separating lens array with respect to the third photosensitive cells and the fourth photosensitive cells corresponding to the third regions and the fourth regions.

10. The image sensor of claim 1, further comprising a spacer layer provided between the sensor substrate and the color separating lens array, the spacer layer being configured to form a distance between the sensor substrate and the color separating lens array.

11. The image sensor of claim 10, further comprising a color filter provided between the sensor substrate and the spacer layer.

12. An image sensor comprising:
    a sensor substrate comprising first photosensitive cells and second photosensitive cells configured to sense light; and
    a color separating lens array comprising first regions and second regions respectively corresponding to the first photosensitive cells and the second photosensitive cells, the first regions and second regions respectively comprising nanoposts configured to separate, from light incident on the color separating lens array, light of a first wavelength and light of a second wavelength different from the first wavelength, and focus the light of the first wavelength and the light of the second wavelength respectively on the first photosensitive cells and the second photosensitive cells, a width of at least one of the nanoposts in the first region or the second region at a peripheral portion of the image sensor being different from a width of a corresponding nanopost in the first region or the second region at a center of the image sensor.

13. The image sensor of claim 12, wherein the width of at least one of the nanoposts in the first region or the second region at a peripheral portion of the image sensor is greater than the width of a corresponding nanopost in the first region or the second region at a center of the image sensor.

14. The image sensor of claim 13, wherein the width of at least one of the nanoposts in the first region or the second region at a peripheral portion of the image sensor increases with an increase in a distance from the center of the image sensor.

15. The image sensor of claim 14, wherein the width of a nanopost at an outermost edge of the image sensor is greater than the width of a nanopost at the center of the image sensor by 2.5% to 6.5%.

16. The image sensor of claim 12, wherein the sensor substrate further comprises third photosensitive cells and fourth photosensitive cells configured to sense the light, wherein the color separating lens array further comprises third regions fourth regions respectively corresponding to the third photosensitive cells and the fourth photosensitive cells, and
wherein the first regions, the second regions, the third regions, and the fourth regions are respectively provided along four quadrant surfaces.

17. The image sensor of claim 16, wherein the third regions and the fourth regions respectively comprise nanoposts such that the nanoposts in the first regions, in the second regions, in the third regions, and in the fourth regions are configured to separate, from light incident on the color separating lens array, light of the first wavelength, light of the second wavelength, and light of a third wavelength different from the first wavelength and the second wavelength, focus the light of the first wavelength on the first photosensitive cells and the fourth photosensitive cells, focus the light of the second wavelength on the second photosensitive cells, and focus the light of the third wavelength on the fourth photosensitive cells.

18. The image sensor of claim 17, wherein a width of at least one of the nanoposts in the third region or the fourth region at a peripheral portion of the image sensor is different from a width of a corresponding nanopost in the third region or the fourth region at a center of the image sensor.

19. The image sensor of claim 12, further comprising:
a spacer layer provided between the sensor substrate and the color separating lens array, the spacer layer being configured to form a distance between the sensor substrate and the color separating lens array; and
a color filter provided between the sensor substrate and the spacer layer.

20. An electronic device comprising:
an imaging device configured to focus light reflected from an object to form an optical image; and
an image sensor configured to convert the optical image formed by the imaging device into an electrical signal,
wherein the image sensor comprises:
a sensor substrate comprising first photosensitive cells and second photosensitive cells configured to sense light; and
a color separating lens array comprising first regions and second regions respectively corresponding to the first photosensitive cells and the second photosensitive cells, the first regions and second regions respectively comprising nanoposts configured to separate, from light incident on the color separating lens array, light of a first wavelength and light of a second wavelength different from the first wavelength, and focus the light of the first wavelength and the light of the second wavelength respectively on the first photosensitive cells and the second photosensitive cells, the nanoposts in the first regions and the second regions comprising a first nanopost and a second nanopost provided on the first nanopost, the second nanopost being aligned with the first nanopost at a center of the image sensor and shifted toward the center of the image sensor with respect to the first nanopost at a peripheral portion of the image sensor.

\* \* \* \* \*